(12) United States Patent
Iwamuro et al.

(10) Patent No.: US 6,242,967 B1
(45) Date of Patent: Jun. 5, 2001

(54) LOW ON RESISTANCE HIGH SPEED OFF SWITCHING DEVICE HAVING UNIPOLAR TRANSISTORS

(75) Inventors: Noriyuji Iwamuro; Hisao Shigekane; Yuichi Harada; Tadayoshi Iwaana, all of Nagano (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 09/333,224

(22) Filed: Jun. 15, 1999

Related U.S. Application Data

(63) Continuation-in-part of application No. 09/109,758, filed on Jul. 2, 1998.

(30) Foreign Application Priority Data

Jun. 15, 1998 (JP) .................................................. 10-166567
Oct. 9, 1998 (JP) .................................................. 10-287864

(51) Int. Cl.[7] .................................................. H03K 17/60
(52) U.S. Cl. .................................. 327/432; 327/374; 327/483; 327/575
(58) Field of Search .................................. 327/374, 376, 327/377, 419, 427, 432–4, 478, 480–5, 575

(56) References Cited

U.S. PATENT DOCUMENTS

| | | | |
|---|---|---|---|
| 4,356,416 | * 10/1982 | Weischedel | 327/432 |
| 4,590,395 | * 5/1986 | O'Connor et al. | 327/374 |
| 4,604,535 | * 8/1986 | Sasayama et al. | 327/432 |
| 4,891,532 | * 1/1990 | Shekhawat et al. | 327/483 |
| 4,935,799 | 6/1990 | Mori | 357/43 |
| 5,296,765 | * 3/1994 | Williams et al. | 327/379 |
| 5,570,057 | * 10/1996 | Palara | 327/427 |

FOREIGN PATENT DOCUMENTS

| | | | |
|---|---|---|---|
| 2176359 | * 12/1986 | (GB) | 327/437 |
| 57-183067 | 11/1982 | (JP) | . |
| 62-293678A | 12/1987 | (JP) | . |
| 06188376 | 7/1994 | (JP) | . |

OTHER PUBLICATIONS

Zahir Parpia et al., "A CMOS–Compatible High–Voltage IC Process", Oct. 1988, pp. 1687–1694, IEEE Transactions on Electron Devices, vol. 35, No. 10.

(List continued on next page.)

*Primary Examiner*—Kenneth B. Wells
*Assistant Examiner*—An T. Luu
(74) *Attorney, Agent, or Firm*—Rossi & Associates

(57) ABSTRACT

A semiconductor device is provided which includes a first unipolar transistor provided in a front stage of the device, second unipolar transistor provided in the front stage, and a bipolar transistor provided in a rear stage of the device. In this semiconductor device, drain and the source of the first unipolar transistor are connected to collector and the base of the bipolar transistor, respectively, and drain and the source of the second unipolar transistor are connected to emitter and base of the bipolar transistor, respectively.

27 Claims, 31 Drawing Sheets

OTHER PUBLICATIONS

Zahir Parpia et al., A Novel CMOS–Compatible High–Voltage Transistor Structure, Dec. 1986, pp. 1948–1952, IEEE Transactions on Electron Devices, vol. ED–33, No. 12.

Narayanan et al., "Analysis of CMOS–Compatible Lateral Insulated Base Transistors", Jul. 1991, pp. 1624–1632, IEEE Transactions on Electron Devices, vol. 38, No. 7.

Narayanan et al., "Performance of 200 V CMOS Compatible Auxiliary Cathode Lateral Insulated Gate Transistors" pp. 103–108, 1991, CH2987–6/91/0000–0103 IEEE.

P. Godignon et al., "Analysis of the Vertical Insulated Base Transistor", 1991, pp. 0–215– 0–219, Centro Nacional de Mecroclectronica (CNM), CSIC–UAB. 08193 Bellaterra, Barcelona, Spain.

J.S. Ajit et al., "Comparison of MOS–Gated Bipolar Transistor Structures", 1991, pp. 0–148– 0–151, Dept. of Elect. and Computer Eng., N.C. State Univ., Raleigh, N.C.

P. Godignon et al., "Design Considerations of a MOS–Bipolar Darlington Structure: The Vertical Insulated Base Transistor (IBT)", May 1996, pp. 1777–1782, Solid State Electronics vol. 39, No. 12.

* cited by examiner

LOW ON RESISTANCE HIGH SPEED OFF SWITCHING DEVICE HAVING UNIPOLAR TRANSISTORS

CROSS-REFERENCE TO RELATED APPLICATIONS

The present application is a continuation-in-part application of, and claims priority from, copending U.S. patent application Ser. No. 09/109,758 filed Jul. 2, 1998.

FIELD OF THE INVENTION

The present invention relates to a semiconductor device in which a bipolar transistor or transistors are connected to unipolar transistors, which device exhibits low ON resistance and a high-speed switching characteristic.

BACKGROUND OF THE INVENTION

Individual semiconductor switching devices or elements, which have low ON resistance and exhibit a high-speed switching characteristic, include bipolar transistors and unipolar transistors. For example, insulated gate field-effect transistors (hereinafter abbreviated to "MOS transistor") are well known as an example of the unipolar transistors. Also, insulated gate bipolar transistors (hereinafter referred to as "IGBT") that are voltage-controlled bipolar transistors have been increasingly used in recent years. These semiconductor devices have the following features.

The bipolar transistor may use a high-resistivity substrate to form a collector layer, in order to ensure a high breakdown-voltage characteristic. Even with the use of such a high-resistivity substrate, the transistor of this type undergoes conductivity modulation based on injection of minority carriers while the device is used in a saturation mode, thus assuring reduced ON resistance. However, the turn-off time is increased due to the effect of accumulation of the minority carriers, resulting in a delay in switching the transistor.

The MOS transistor that is a unipolar transistor is inherently free from accumulation of minority carriers, and therefore operates at a high switching speed. This type of transistor, however, suffers from relatively large ON resistance since the conductivity modulation based on injection of minority carriers does not occur in this device.

Similarly to the bipolar transistor as described above, the IGBT exhibits relatively low ON resistance, but suffers from relatively long turn-off time due to the effect of accumulation of minority carriers. In addition, minority carriers are re-injected from the collector layer, due to electrons that are discharged by a depletion layer that spreads out during turn-off, which results in an increase in the turn-off time.

In a conventional switching circuit, therefore, bipolar transistors and IGBT, which have a small steady-state loss but suffer from a large switching loss, are often used at a relatively low frequency (generally, lower than 50 kHz), while MOS transistors, which have a small switching loss but suffers from a large steady-state loss, are often used at a relatively high frequency (generally, 100 kHz).

In an intermediate frequency region, namely, in the range of 20–100 kHz, it is desirable to use a semiconductor device having the characteristics of both of the above types of transistors, depending upon its applications. FIG. 51 shows one example of this type of semiconductor device as disclosed in Japanese Laid-open Patent Publication No. 62-293678. This example is a so-called BiMOS-Cascade transistor in which a unipolar transistor UT is provided in the front stage, and a bipolar transistor BT is provided in the rear stage. This semiconductor device exhibits low ON resistance, and can be controlled by voltage, but suffers from a problem that the turn-off time, in particular, storage time, is considerably increased because an excessive amount of carriers stored in the bipolar transistor BT during turn-off cannot be removed or drawn away from the transistor BT.

To overcome this problem, there has been proposed a semiconductor device as shown in FIG. 52, wherein a resistor R is provided between the base and emitter of the bipolar transistor BT. Examples of this type of semiconductor device are disclosed in Parpia, Z. et al., IEEE Trans. on ED, vol.33, 1984 (1986), ibid. vol.35, 1687, (1988), Narayanan, S. et al., IEEE ISPSD '91, 103, (1991), Narayanan, S. et al., IEEE Trans on ED, 1624, (1991), Godignon, P. et al., MADEP, 0-215, (1991), Ajit, J. S. MADEP, 0-148, (1991), Godignon, P. et al., Solid-state Electronics, 1777, (1996). In this type of semiconductor device, carriers may be drawn away from the base region of the bipolar transistor BT through the resistor R during turn-off, and therefore the turn-off time can be shortened. However, the ON resistance is somewhat increased since current flows through the resistor R during turn-on as well as turnoff. As another method for solving the problem of increased turn-off time, a semiconductor device as shown in FIG. 53 has been proposed in Japanese Patent No. 3-66816, wherein a diode D is connected between the base of a bipolar transistor BT and the gate of a unipolar transistor UT. During turn-off of this semiconductor device, carriers can be drawn from the base region of the bipolar transistor BT into the gate through the diode D, and therefore the turn-off time can be shortened. However, a small amount of carriers still remain due to a barrier-layer voltage at the junction of the diode D.

SUMMARY OF THE INVENTION

It is therefore an object of the present invention to provide a semiconductor device suitable for use as a switching device, which exhibits sufficiently low ON resistance, and a high-speed turn-off characteristic.

To achieve the above object, the present invention provides a semiconductor device comprising: a first unipolar transistor provided in a front stage of the device and including a drain, a source and a gate; a second unipolar transistor provided in the front stage and including a drain, a source, and a gate; and a bipolar transistor provided in a rear stage of the device and including a collector, a base, and an emitter. In this semiconductor device, the drain and the source of the first unipolar transistor are connected to the collector and the base of the bipolar transistor, respectively, and the drain and the source of the second unipolar transistor are connected to the emitter and the base of the bipolar transistor, respectively.

Upon turn-on of the semiconductor device as described above, the first unipolar transistor is turned on, and the second unipolar transistor is turned off, so that the bipolar transistor is turned on. To turn off this device, on the other hand, the first unipolar transistor is turned off, to stop supply of the base current to the bipolar transistor, so that the bipolar transistor is turned off. At the same time, the second unipolar transistor is turned on, so as to draw an excessive amount of carriers away from the bipolar transistor, so as to increase the rate or speed of turning off the device.

In one preferred form of the invention as described above, the bipolar transistor provided in the rear stage comprises a plurality of Darlington-connected bipolar transistors, and the second unipolar transistor comprises a plurality of second unipolar transistors that respectively correspond to the Darlington-connected transistors. The source of each of the second unipolar transistors is connected to the base of a corresponding one of the Darlington-connected bipolar transistors, and the drain of each second unipolar transistor is connected to the emitter of one of the bipolar transistors that is located in the last stage. In this arrangement, it is possible to draw an excessive amount of carriers from each of the bipolar transistors that are connected in the Darlington configuration.

In the above form of the invention, the area of the bipolar transistor located in the latter stage of the Darlington-connected bipolar transistors may be made larger than the area of the bipolar transistor located in the former stage. With this arrangement, large main current of the latter-stage bipolar transistor can be favorably controlled, using the main current of the former-stage bipolar transistor as its base current.

In the above form of the invention, the area of the second unipolar transistor connected to the bipolar transistor located in the latter stage of the Darlington configuration may be made larger than that of the second unipolar transistor connected to the bipolar transistor located in the former stage. In this arrangement, even where the base current of the bipolar transistor in the latter stage of the Darlington configuration is increased, the current may be drawn away or removed into the emitter in a short time.

In another preferred form of the invention, the bipolar transistor provided in the rear stage of the device has a larger area than a corresponding one of the second unipolar transistors provided in the front stage of the device. Since the second unipolar transistor supplies base current to the bipolar transistor located in the following stage, the area of the bipolar transistor through which main current flows should be larger than that of the corresponding second unipolar transistor.

If both of the first unipolar transistor and the second unipolar transistor are of the same conductivity type, namely, n channel type or p channel type, these first and second unipolar transistors can be driven with signals having the same polarity.

If one of the first unipolar transistor and second unipolar transistor is an n channel transistor, and the other is a p channel transistor, one of these transistors can be turned on while the other can be turned off, depending upon the polarity of a signal applied thereto. Thus, the first unipolar transistor and the second unipolar transistor can be driven with a single signal.

If the gate of the first unipolar transistor and the gate(s) of the second unipolar transistor(s) are connected together, only one signal control device will be needed to control these unipolar transistors.

The semiconductor device may be a combination of an n channel MOS transistor as the first unipolar transistor, a p channel MOS transistor as the second unipolar transistor, and an npn transistor as the bipolar transistor. Alternatively, the semiconductor device may be a combination of a p channel MOS transistor as the first unipolar transistor, an n channel MOS transistor as the second unipolar transistor, and a pnp transistor as the bipolar transistor. In these cases, only one signal control device is used for driving the first unipolar transistor and the second unipolar transistor, by changing the polarity of signals.

The junction depth of the base region of the bipolar transistor is preferably larger than the well region of the first unipolar transistor. In this case, the current amplification factor of the bipolar transistor can be increased so as to reduce the ON-state voltage, while avoiding an increase in the ON-state voltage due to an increase in the ON resistance in the unipolar transistor.

The junction depth of the base region of the bipolar transistor is preferably larger than that of the drain region of the second unipolar transistor. In this case, the current amplification factor of the bipolar transistor can be increased, while avoiding an increase in the turn-off loss due to an increase in the ON resistance in the unipolar transistor.

The junction depth of the well region of the first unipolar transistor is preferably equal to that of the drain region of the second unipolar transistor. In this case, these regions can be formed at the same time, eliminating the need to increase the number of process steps.

The junction depth of an emitter region of the bipolar transistor is preferably larger than that of a source region of the first unipolar transistor having the same conductivity type. In this case, the current amplification factor of the bipolar transistor can be increased, while assuring an increased avalanche current of the unipolar transistor.

If a voltage is applied between the collector and the emitter of the bipolar transistor in the last stage or output stage while the gate of each second unipolar transistor is shorted-circuited to the emitter of the last-stage bipolar transistor, the potential of the base of each bipolar transistor is increased to be higher than the potential of the emitter, whereby the breakdown voltage between the collector and the emitter becomes lower than that in the case where the base of each bipolar transistor and the emitter are shorted-circuited.

In view of the above situation, it is preferable that the first unipolar transistor is of enhancement type, and the second unipolar transistor is of depletion type. Where the second unipolar transistor is of p channel type, its channel portion is provided by a $p^{31}$ low-concentration region having a low impurity concentration. Where the second unipolar transistor is of n channel type, its channel portion is provided by an $n^-$ low-concentration region having a low impurity concentration.

With the above arrangement, where the gate of each second bipolar transistor is short-circuited to the emitter of the bipolar transistor in transistors have the same potential as the emitter of the bipolar transistor in the last stage, thus avoiding the reduction in the breakdown voltage between the collector and emitter during turn-off of the device.

Preferably, the low concentration region of the second unipolar transistor has a surface impurity concentration in a range of $1 \times 10^{14}$ to $1 \times 10^{19}$ $cm^{31\ 3}$. In this case, the semiconductor device can achieve both high breakdown voltage and low ON-state voltage at the same time.

In another preferred form of the invention, the semiconductor device further includes a first-conductivity-type high-resistivity semiconductor substrate which provides a drain layer of the first unipolar transistor, a collector layer of the bipolar transistor, and a base layer of the second unipolar transistor. In this case, the transistors can be easily constructed on the substrate.

If the first and second unipolar transistors and the bipolar transistors are formed on a single semiconductor substrate, along with wires that connect the unipolar transistors and the bipolar transistor, wiring between these transistors can be accomplished at one time, thus assuring high reliability.

The metallic electrodes and metallic wires are preferably formed from a single metal layer. In this case, the metal layer can be formed in a single step, and the semiconductor device can be manufactured with a reduced number of process steps, while avoiding short-circuiting that would otherwise occur when multi-layer metallic wiring is employed.

According to another aspect of the present invention, a semiconductor device is provided which comprises: a first unipolar transistor provided in a front stage of the device and including a drain, a source and a gate; a second unipolar transistor including a drain, a source and a gate; a bipolar transistor provided in a rear stage of the device and including a collector, a base, and an emitter; and at least one of a first auxiliary unipolar transistor including a drain, a source and a gate, and a second auxiliary unipolar transistor including a drain, a source and a gate; wherein the drain and the source of the first unipolar transistor are connected to the collector and the base of the bipolar transistor, and the drain and source of the second unipolar transistor are connected to the emitter and base of the bipolar transistor, respectively; and wherein the drain and the source of the first auxiliary unipolar transistor are connected to the collector of the bipolar transistor and the source of the second unipolar transistor, respectively, and the drain and the source of the second auxiliary unipolar transistor are connected to the collector of the bipolar transistor and the drain of the second unipolar transistor, respectively.

The bipolar transistor in the rear stage may comprise a plurality of bipolar transistors that are connected in the Darlington configuration, and the second unipolar transistor may comprise a plurality of unipolar transistors that respectively correspond to the Darlington-connected bipolar transistors.

In the above case, the first and/or second auxiliary unipolar transistors may be provided with respect to the second unipolar transistor(s) corresponding to part of the Darlington-connected bipolar transistor, or may be provided with respect to the second unipolar transistors corresponding to all of the bipolar transistors.

The first auxiliary unipolar transistor is arranged in parallel with the first unipolar transistor or the bipolar transistor in the former stage, and functions to increase the base current supplied to the bipolar transistor in the latter stage.

The second auxiliary unipolar ansistor is arranged in parallel with the corresponding bipolar transistor, and functions to reduce the ON-state voltage of the semiconductor device, particularly in a low current density region.

The semiconductor device having both the first and second auxiliary unipolar transistors provide both of the above functions.

Where the first unipolar transistor in the form of an n channel MOS transistor, the second unipolar transistor in the form of a p channel MOS transistor, and the bipolar transistor in the form of an npn transistor are combined with the auxiliary unipolar transistor(s) in the form of n channel MOS transistor(s), or the first unipolar transistor in the form of a p channel MOS transistor, the second unipolar transistor in the form of an n channel MOS transistor, and the bipolar transistor in the form of a pnp transistor are combined with the auxiliary unipolar transistor(s) in the form of p channel MOS transistor(s), only a single signal control device is required for controlling the first and second unipolar transistors and the auxiliary unipolar transistor(s) by changing the polarity of signals.

Where the second unipolar transistor consists of a p channel MOS transistor, the auxiliary unipolar transistor is provided by forming an n type auxiliary source region in at least one of the p type source region and p type drain region of the p channel MOS transistor. Where the second unipolar transistor consists of an n channel MOS transistor, the auxiliary unipolar transistor is provided by forming a p type auxiliary source region in at least one of the n type source region and n type drain region of the n channel MOS transistor. In this case, the second unipolar transistor and the auxiliary unipolar transistor may be formed integrally with each other, thus enabling these transistors to use a common gate electrode layer.

If the gates of the first unipolar transistor, second unipolar transistor and the auxiliary transistor(s) are connected to each other, only one signal control device is needed.

If the first and second unipolar transistors, bipolar transistors, auxiliary unipolar transistors and wires that connect these transistors with each other are formed on a single semiconductor substrate, the wiring can be accomplished at one time or in a single step, assuring improved reliability, as compared with the case where individual devices are assembled together.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Figure 1:
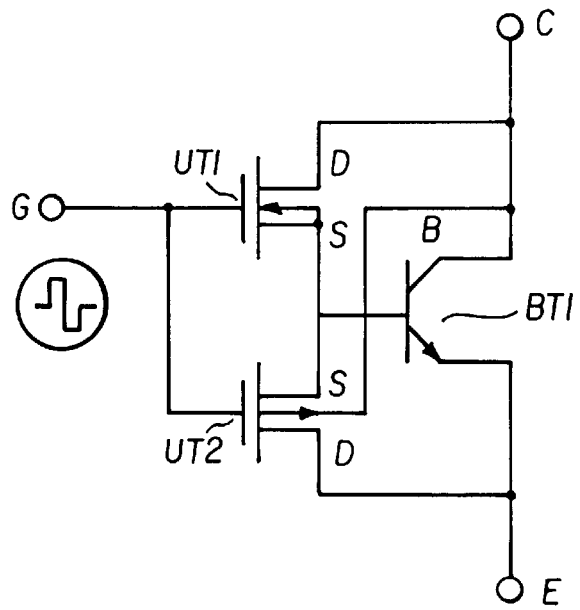
FIG. 1 is a circuit diagram showing an equivalent circuit of a semiconductor device according to the first embodiment of the present invention.

Referring to the drawings, there will be described some embodiments of the present invention. In the embodiments as described below, the first unipolar transistor consists of an n channel MOS transistor, and the second unipolar transistor consists of a p channel MOS transistor, while the bipolar transistor consists of an npn transistor. In the following description, n type is regarded as the first conductivity type, and p type is regarded as the second conductivity type. However, these conductivity types may be reversed.

Embodiment 1

FIG. 1 is a circuit diagram showing an equivalent circuit of a semiconductor switching device according to the first embodiment of the present invention. In the circuit of FIG. 1, the drain and source of an n channel MOS transistor UT1 are connected between the collector C and base B of an npn transistor BT1, and the drain and source of a p channel MOS transistor UT2 are connected between the emitter E and base B of the npn transistor BT1. The n channel MOS transistor UT1 and p channel MOS transistor UT2 have a common gate, which is connected to a G terminal.

In the operation of this semiconductor device, when a positive input signal is applied to the gate G while a voltage is being applied between the collector C and emitter E, the n channel MOS transistor UT1 is turned on, and the npn transistor BT1 is turned on. Upon application of the positive input signal to the gate G, however, the p channel MOS transistor UT2 is not turned on. When a negative input signal is then applied to the gate G, the n channel MOS transistor UT1 is turned off, and the npn transistor BT1 is turned off. At this time, the p channel MOS transistor UT2 is turned on.

Accordingly, this semiconductor device provides low ON resistance since the npn transistor BT1 as a bipolar transistor is turned on upon tun-on of the device. Upon turn-off of the semiconductor device, the p channel MOS transistor UT2 is turned on, so that an excessive amount of carriers stored in the ON state can be drawn away from the npn transistor BT1. As a result, the storage time and switching time can be shortened, and the semiconductor device is able to perform high-speed operations.

Figure 2:
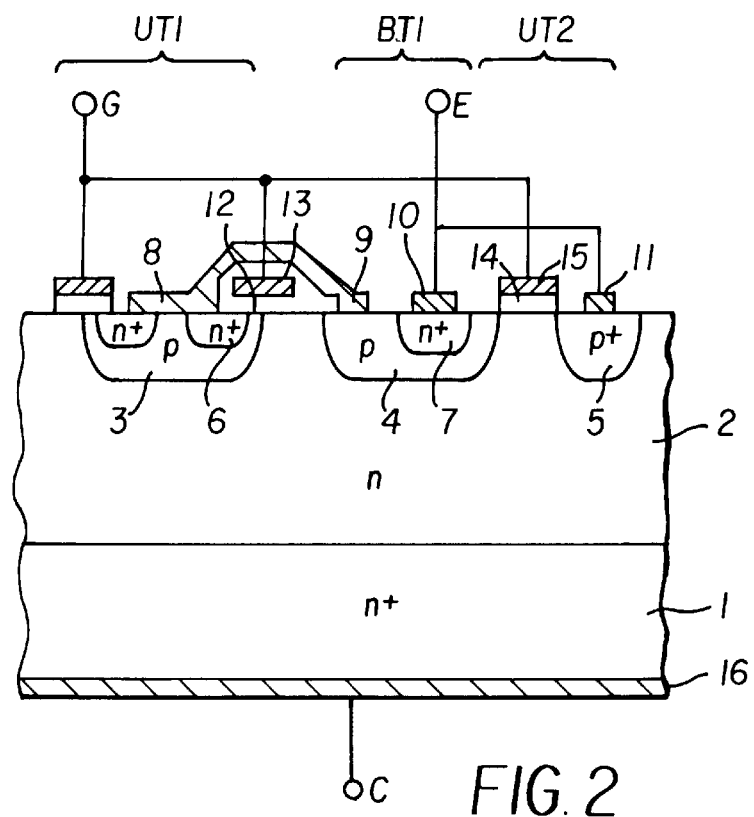
FIG. 2 is a cross-sectional view of a part of the semiconductor device of the first embodiment of FIG. 1.

FIG. 2 is a cross-sectional view of a monolithic semiconductor device which realizes the equivalent circuit of FIG. 1. The n channel MOS transistor UT1 is illustrated in the left-hand side portion of FIG. 2, and the npn transistor BT1 is illustrated in the middle portion of this figure, while the p channel MOS transistor UT2 is illustrated in the right-hand side portion of the same figure. Only basic portions of these transistors are shown in FIG. 2, and other portions, including a peripheral portion of the device which serves to withstand high voltage, are not illustrated since such portions are not substantially related to the present invention.

In the semiconductor device of FIG. 2, an n drift layer 2 having a high resistivity is laminated on an $n^+$ collector layer 1 having a low resistivity, to provide a semiconductor substrate. An example of the semiconductor device of the first embodiment having a breakdown voltage of about 200V uses an epitaxial wafer as the substrate, which is formed by laminating a drift layer 2 having a resistivity of 10 $\Omega\cdot$cm and a thickness of 30 $\mu$m on an $n^+$ collector layer 1 having a resistivity of 0.004 $\Omega\cdot$m and a thickness of 250 $\mu$m. A p well region 3 of the n channel MOS transistor UT1, p base region 4 of the npn transistor BT1, and a $p^+$ drain region 5 of the p channel MOS transistor UT2 are formed in a surface layer of the n drift layer 2, and an $n^+$ source region 6 and an $n^+$ emitter region 7 are formed in the p well region 3 and the p base region 4, respectively. For example, the diffusion depth of the p well region 3 and p base region 4 is 5 $\mu$m, and the diffusion depths of the $n^+$ source region 6 and $n^+$ emitter region 7 are 0.3 $\mu$m and 2.5 $\mu$m, respectively. These values of the diffusion depth of the $n^+$ source region 6 and $n^+$ emitter region 7 were determined by an experiment which will be described later. These regions 3–7 may be formed in a stripe-like shape or other shape. In particular, the p base region 4 and $p^+$ drain region 5 are located adjacent to each other. A source electrode 8 formed on both surfaces of the $n^+$ source region 6 and p base region 3 is connected to a base electrode 9 formed on the surface of the p base region 4, and an emitter electrode 10 formed on the surface of the $n^+$ emitter region 7 is connected to a drain electrode 11 formed on the surface of the $p^+$ drain region 5, and also connected to E terminal. These electrodes may be formed by sputtering an aluminum alloy by vapor deposition, and patterning the alloy film by photolithography, for example. A gate electrode layer 13 of the n channel MOS transistor UT1 is formed on a gate oxide film 12 over a portion of the surface of the p base region 3 that is interposed between the $n^+$ source region 6 and the n drift layer 2. Also, a gate electrode layer 15 of the p channel MOS transistor UT2 is formed on a gate oxide film 14 over a portion of the surface of the n drift layer 2 that is interposed between the p base region 4 and the $p^+$ drain region 5. These gate electrode layers 13, 15 are formed from, for example, polycrystalline silicon (polysilicon) films, and are connected to the G terminal through metal gate electrodes (not shown). As shown in the figure, the source electrode 8 may be extended over the gate electrode layer 13 with an insulating film 20 interposed therebetweem, to be connected to the base electrode 9. Each of the electrodes 8–11, 13 and 15 has a strip-like shape. A collector electrode 16 is formed on the rear surface of the $n^+$ collector layer 1, and connected to a C terminal.

Figure 3:
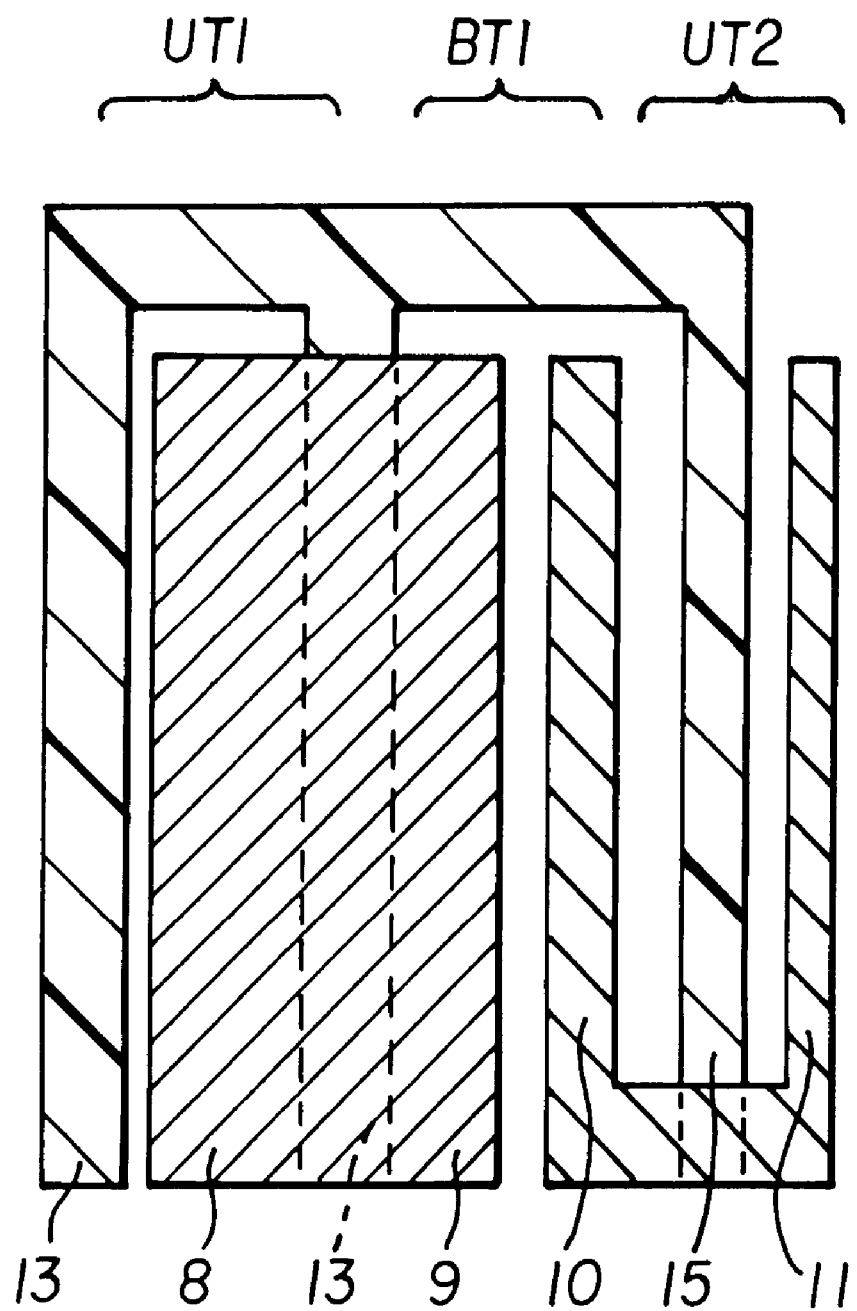
FIG. 3 is a view showing the arrangement of electrodes of the semiconductor device of the first embodiment.

FIG. 3 is a view showing the arrangement of the electrodes of the semiconductor device of FIG. 2. The source electrode 8 of the n channel MOS transistor UT1 is extended over the gate electrode layer 13 via an insulating film (not shown), to be connected to the base electrode 9. The emitter electrode 10 and drain electrode 11 having strip-like shapes are connected to each other via an insulating film over the gate electrode 15 of the p channel MOS transistor UT2.

While the gate electrode layers 13, 15 may be formed of a metal, depending upon the case, these electrode layer 13, 15 of the semiconductor device of the present embodiment are formed of polysilicon, as described above. In this case, the above electrodes may be formed from a single metal layer such that each electrode has a striplike shape, which is advantageous in terms of a relatively simple process for forming the electrodes. While the gate electrode layers 13, 15 are connected to each other at a portion where no metal layer, such as the source electrode 8, is located, as shown in FIG. 3, these electrode layers 13, 15 may be connected to each other below a metal layer or electrode provided an insulating film is interposed between the electrode layers 13, 15 and the metal layer.

The semiconductor device of the first embodiment may be produced by a process similar to a conventional process for producing a double diffusion MOS transistor.

The operation of the semiconductor device of the first embodiment will be now described in more detail. When a positive voltage is applied to the gate electrode layers 13, 15 while the emitter electrode 10 is grounded and a positive voltage is being applied to the collector electrode 16, an inversion layer is formed in the vicinity of the surface of the p base region 3 right below the gate electrode layer 13, whereby the n channel MOS transistor UT1 is turned on, and current flows between the collector electrode 16 and the source electrode 8 through the inversion layer. This current is also supplied to the base electrode 9, and flows through the p base region 4 into the $n^+$ emitter region 7, to provide base current of the npn transistor BT1, which causes the npn transistor BT1 to be turned on, so that large current flows from the collector electrode 16 to the emitter electrode 10. In this manner, the semiconductor device of the first embodiment is turned on. While the device is placed in the ON state, a far larger amount of electrons than holes flowing from the p base region 4 into the $n^+$ emitter region 7 are injected into the p base region 4 and n drift layer 2, thus giving rise to substantially the same amount of holes, which cause conductivity modulation and provide low ON resistance. In particular, the diffusion depth of the $n^+$ emitter region 7 of the npn transistor is made larger than that of the $n^+$ source region 6 of the n channel MOS transistor UT1, so that the current amplification factor is increased, and the ON resistance is reduced.

To turn off the semiconductor device, the potential of the gate terminal G is lowered to be equal to or lower than the threshold value of the n channel MOS transistor UT1. As a result, the inversion layer that has been formed right below the gate electrode 13 disappears, and the n channel MOS transistor UT1 is turned off. Then, supply of the base current to the npn transistor BT1 is stopped, and the npn transistor BT1 is turned off. However, an excessive amount of holes that are present in the n drift layer 2 and p base region 4 of the npn transistor BT1 keep flowing into the $n^+$ emitter region 7, and a far larger amount of electrons than that of the holes are injected into the p base region 4 and the n drift layer 2 during this period, so that the npn transistor BT1 is kept in the ON state. This period of time is called "storage time".

In the semiconductor device of the first embodiment, an inversion layer is formed in the vicinity of the surface of the n drift layer 2 interposed between the p base region 4 and the $p^+$ drain region 5, by not only controlling the potential of the gate terminal G to be equal to or lower than the threshold value of the n channel MOS transistor UT1, but also applying a negative voltage to the gate terminal G, so that the p channel MOS transistor UT2 is turned on. As a result, an excessive amount of holes present in the npn transistor BT1 are drawn away from the p base region 4 into the emitter electrode 10 through the inversion layer, and therefore do not flow into the $n^+$ emitter region 7. Then, injection of electrons from the $n^+$ emitter region 7 is quickly stopped. Thus, the storage time is shortened, and the device can be rapidly turned off, thus enabling high-speed operations.

Figure 4:
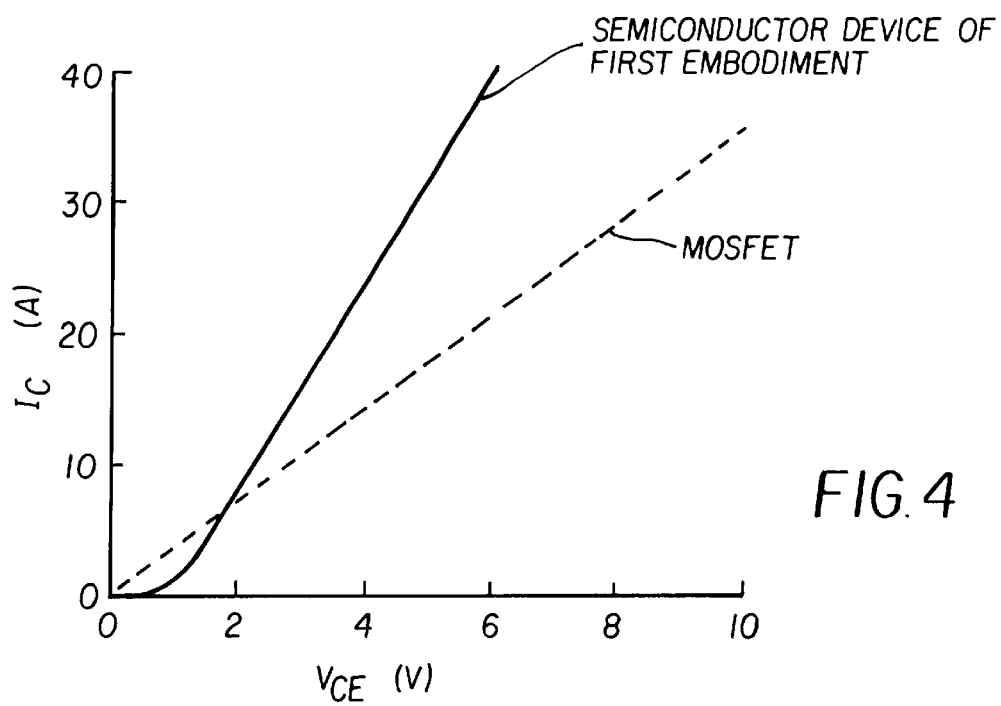
FIG. 4 is a graph showing current-voltage characteristics of the semiconductor device of the first embodiment and a comparative example.

FIG. 4 is a graph showing an ON-state current-voltage characteristic of the 200V-class (breakdown voltage) semiconductor device of the first embodiment. In the graph, the horizontal axis represents the voltage $V_{CE}$ between the collector and the emitter, and the vertical axis represents the current Ic. This graph also shows a current-voltage characteristic upon turn-on a MOS transistor as a comparative example. Both of the semiconductor devices have a chip size of 5.5 mm². As is understood from this graph, the ON-state voltage of the semiconductor device of the first embodiment, when measured at the current Ic of 20 A, is 3.5V, whereas the ON-state voltage of the MOS transistor at the same current is 5.4V, which is 1.9V lower than that of the present embodiment. The reduction in the ON-state voltage results from conductivity modulation that occurs in the npn transistor BT1 of the present device due to injection of minority carriers.

Figure 5:
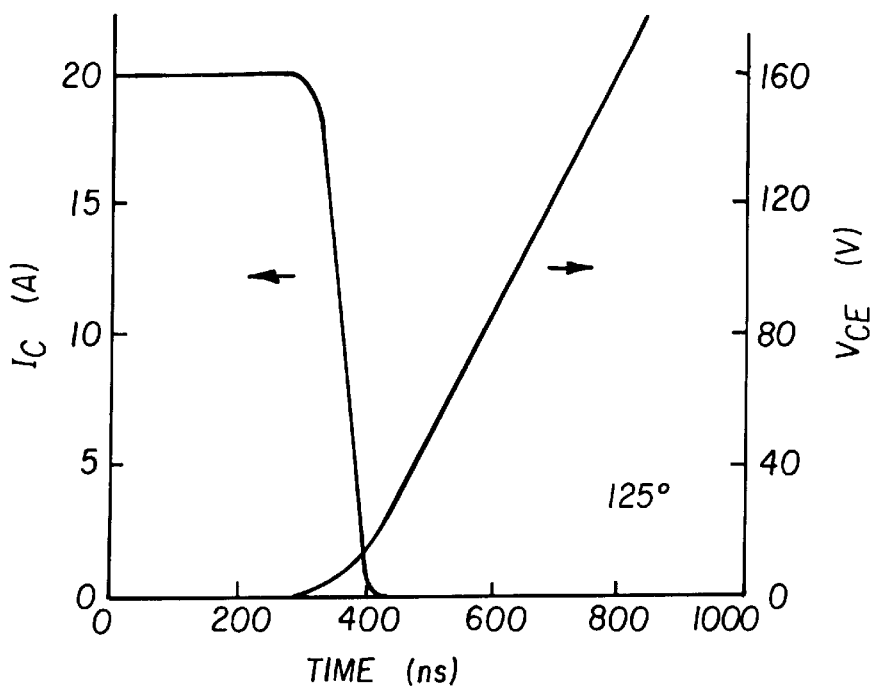
FIG. 5 is a graph showing current and voltage waveforms during turn-off of the semiconductor device of the first embodiment.

FIG. 5 is a graph showing current and voltage waveforms when the 200V-class semiconductor device of the first embodiment is turned off. The horizontal axis represents time, and the vertical axis represents the current Ic or the voltage $V_{CE}$ between the collector and the emitter.

The measurements were made at 125° C. Due to the provision of the p channel MOS transistor UT2, the storage time that takes up most of the turn-off time becomes about 2 μs to 300 ns shorter than that in the case where the p channel MOS transistor is not provided, and the fall time is about 100 ns, which is equivalent to that of the MOS transistor.

Figure 29:
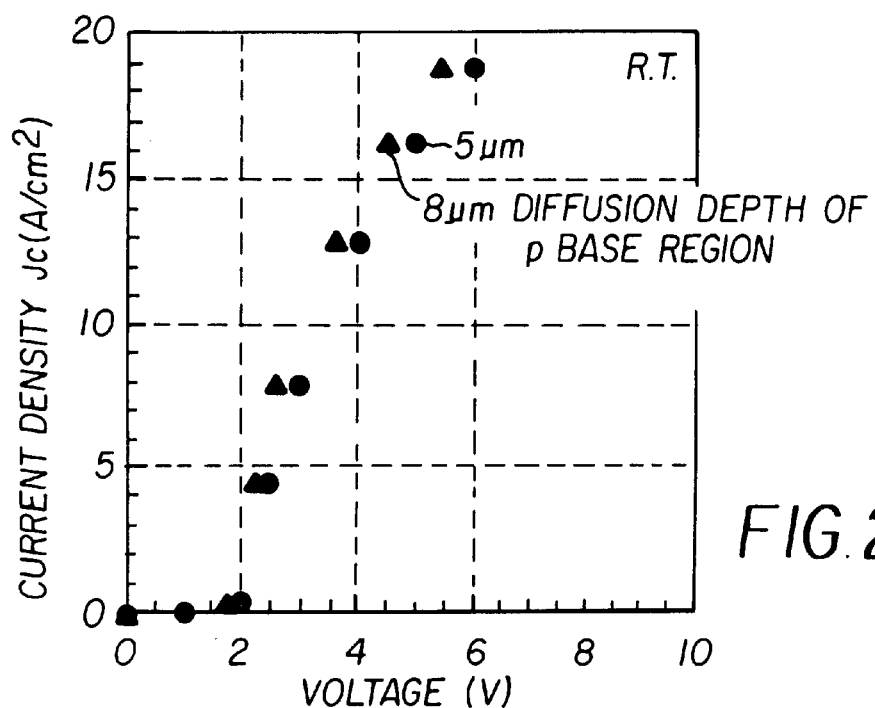
FIG. 29 is a graph showing current-voltage characteristics of the semiconductor device of FIG. 22.
Figure 30:
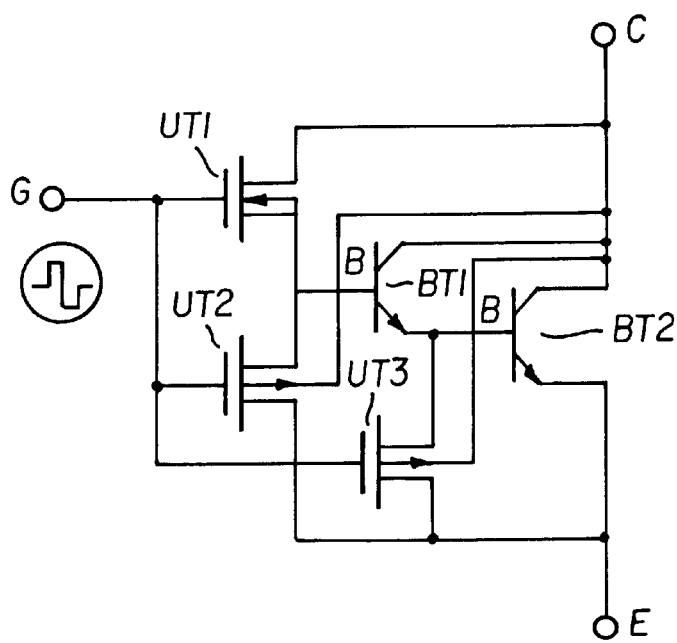
FIG. 30 is a circuit diagram of an equivalent circuit of a semiconductor device according to the eighth embodiment of the present invention.

The p channel MOS transistor UT2 does not start operating unless a negative signal is applied to the gate. Thus, the present semiconductor device is free from the conventional problem of increased loss or increased ON resistance due to constant flow of excessive current as in the case where the resistance R is connected as shown in FIG. 29. As compared with the case where the diode D is connected as shown in FIG. 30, the semiconductor device of the first embodiment, which includes MOS transistors, is free from barrier-layer voltage, and permits excessive carriers to be rapidly discharged when a negative signal is applied to the gate.

Embodiment 2

Figure 6:
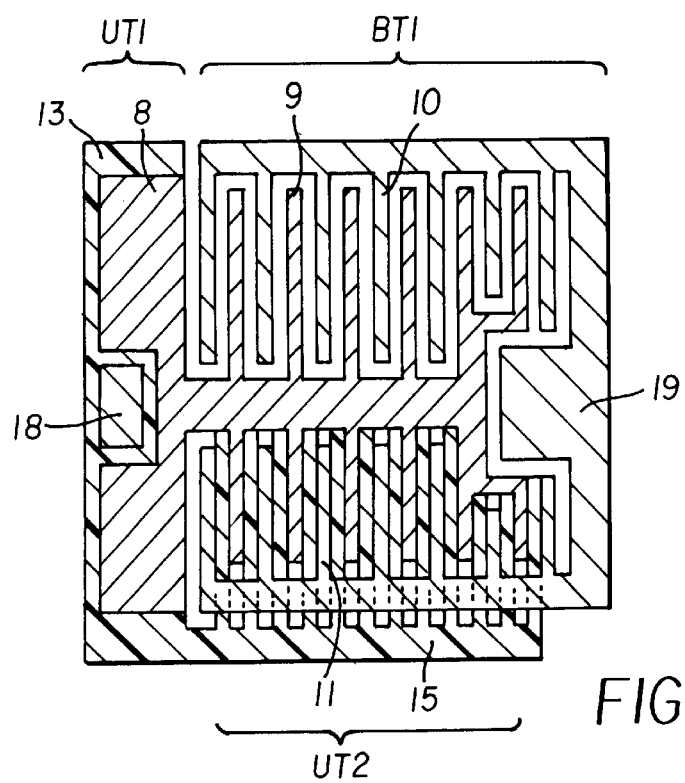
FIG. 6 is a view showing the arrangement of electrodes of a semiconductor device according to the second embodiment of the present invention.

FIG. 6 is a view showing the arrangement of electrodes of another monolithic semiconductor device that realizes the equivalent circuit of FIG. 1. In this semiconductor device, each of the base electrode 9 (connected to the source electrode 8 of the n channel MOSFET UT1) and emitter electrode 10 of the bipolar transistor BT1 is formed in a comb-like shape. The drain electrode 11 of the p channel MOS transistor TU2 is also formed in a comb-like shape. In this embodiment, the source electrode 8 is held in contact with the $n^+$ source region 6 formed in the surface of the semiconductor substrate, through a hole formed in the gate electrode layer 13 of the n channel MOS transistor UT1. Reference numeral 18 denotes a gate electrode pad made of a metal and formed in contact with the gate electrode layer, and reference numeral 19 denotes an emitter electrode pad that is connected to the emitter electrode 10 of the bipolar transistor BT1 by a thick wire. The gate electrode layer 15 of the p channel MOS transistor UT2 does not necessarily extend beyond the edge of the wiring portion of the drain electrode 11 as shown in FIG. 6. While the gate electrode layers may be formed of metal, non-metallic gate electrode layers are employed in the present embodiment. In this case, each of the electrodes arranged in the fashion as described above may be formed from a single metal layer, thus only requiring a relatively simple process for forming the electrodes.

Embodiment 3

Figure 7:
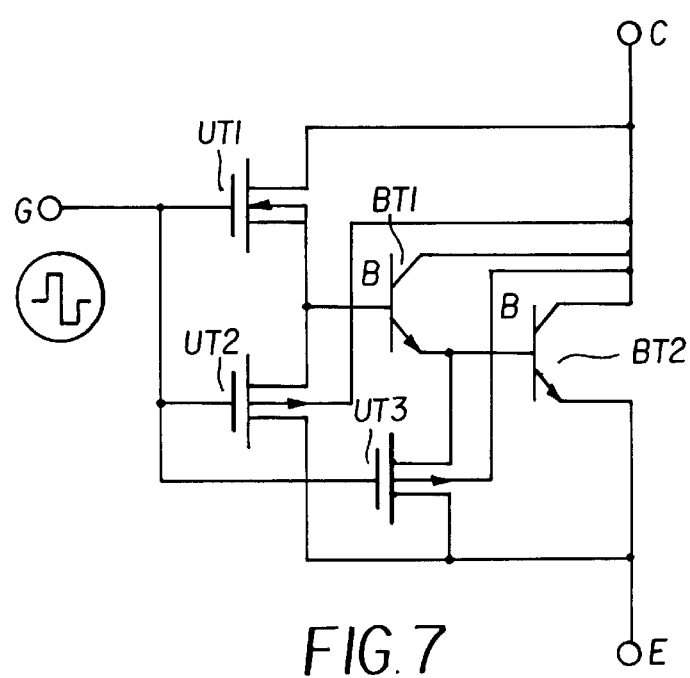
FIG. 7 is a circuit diagram showing an equivalent circuit of a semiconductor device according to the third embodiment of the present invention.

FIG. 7 is a circuit diagram showing an equivalent circuit of a semiconductor device according to the third embodiment of the present invention. The bipolar transistor in the output stage of this circuit is composed of two npn transistors BT1 and BT2 that are connected in the Darlington configuration. In this circuit, the drain and source of the n channel MOS transistor UT1 are connected between the collector C and base B of the first-stage npn transistor BT1. Also, the source and drain of the p channel MOS transistor UT2 are connected between the base B of the first-stage npn transistor BT1 and the emitter E of the second-stage npn transistor BT2, and the source and drain of the p channel MOS transistor UT3 are connected between the base B and emitter E of the second-stage npn transistor BT2. The n channel MOS transistor UT1 and the p channel MOS transistors UT2 and UT3 have a common gate, which is connected to the G terminal. Namely, each of the p channel MOS transistors UT2, UT3 is connected between a corresponding one of the bases of the two-stage Darlington-connected npn transistors BT1, BT2, and the emitter of the second-stage npn transistor BT2.

In the operation of the semiconductor device as described above, when a positive input signal is applied to the gate G while a voltage is being applied between the collector C and the emitter E, the n channel MOS transistor UT1 is turned on, and the first-stage npn transistor BT1 is turned on.

The current produced at this time provides base current that causes the second-stage npn transistor BT2 to be turned on. Upon application of the positive input signal, however, the p channel MOS transistors UT2, UT3 are not turned on. When a negative input signal is then applied to the gate G, the n channel MOS transistor UT1 is turned off, and the npn transistors BT1, BT2 are turned off. At this time, the p channel MOS transistors UT2, UT3 are turned on.

Figure 8:
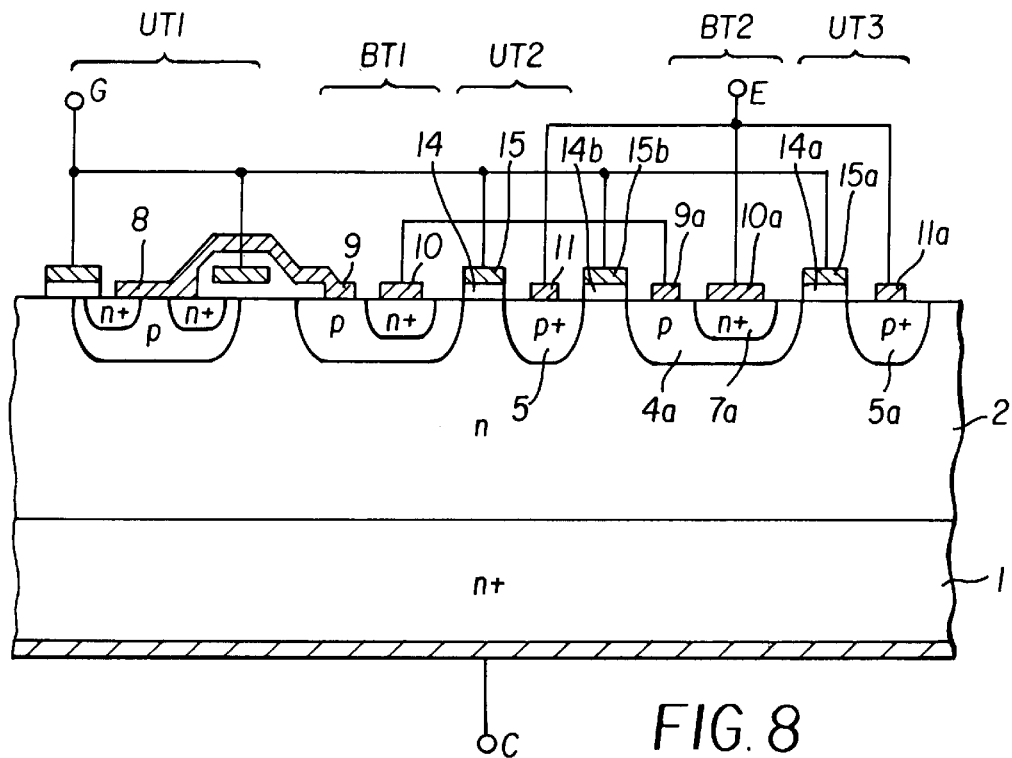
FIG. 8 is a cross-sectional view showing a part of the semiconductor device according to the third embodiment of the invention.

FIG. 8 is a cross-sectional view showing a part of a monolithic semiconductor device which realizes the equivalent circuit of FIG. 7. In FIG. 8, the n channel MOS transistor UT1, npn transistor BT1, p channel MOS transistor UT2, npn transistor B12, and p channel MOS transistor UT3 are arranged in this order as viewed from the left-hand side of the figure.

In comparison with the semiconductor device of the first embodiment, the second-stage npn transistor BT2 and the second-stage p channel MOS transistor UT3 are newly added. The structures of these transistors BT2, UT3 may be substantially identical with those of the first-stage npn transistor BT1 and the first-stage p channel MOS transistor UT1, respectively.

More specifically, in addition to the configuration of FIG. 2, the semiconductor device of the third embodiment is provided with p base region 4a and n$^+$ emitter region 7a of the second-stage npn transistor BT2 formed in the surface layer of the n drift layer 2, and base electrode 9a and emitter electrode 10a formed on the p base region 4a and n$^+$ emitter region 7a, respectively. Also, p$^+$ drain region 5a and drain electrode 11a of the second-stage p channel MOS transistor UT3 are additionally provided. In particular, the p base region 4a and the p$^+$ drain region 5a are located adjacent to each other. Further, a gate electrode layer 15a of the second-stage p channel MOS transistor UT3 is formed on a gate oxide film 14a over a portion of the surface of n drift layer 2 that is interposed between the p base region 4a and the p$^+$ drain region 5a, such that the gate electrode layer 15a is connected to the G terminal. The base electrode 9a is connected to the emitter electrode 10 of the first-stage npn transistor BT1, and the drain electrode 11a is connected to the E terminal, along with the drain electrode 11 of the first-stage p channel MOS transistor UT2, and the emitter electrode 10a of the second-stage npn transistor BT2. The first-stage npn transistor BT1 serves to supply the base current to the second-stage npn transistor BT2, and therefore its area may be smaller than that of the second-sage npn transistor BT2. Also, since the first-stage p channel MOS transistor UT2 and the second-stage p channel MOS transistor UT3 serve to discharge carriers from the first-stage npn transistor BT1 and the second-stage npn transistor BT2, respectively, upon turn-off of the semiconductor device, the area of the second-stage p channel MOS transistor UT3 may be made larger than that of the first-stage p channel MOS transistor UT2.

Figure 9:
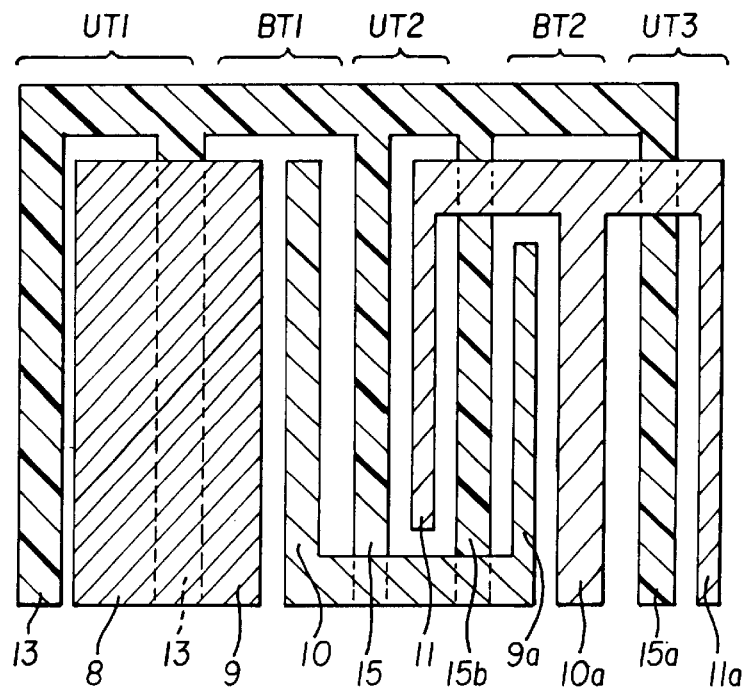
FIG. 9 is a view showing the arrangement of electrodes of the semiconductor device of the third embodiment.

FIG. 9 is a view showing the arrangement of the electrodes of the semiconductor device of FIG. 8. The source electrode 8 of the n channel MOS transistor UT1 is extended over the gate electrode layer 13 via an insulating film (not shown), to be connected to the base electrode 9. The emitter electrode 10a having a strip-like shape passes over the gate electrode layers 15a, 15b via insulating films, and is connected to the drain electro4des 11, 11a a of the p channel MOS transistors UT2, UT3. While the gate electrode layers 13, 15, 15a, 15a may be formed of metal, non-metallic gate electrode layers are employed in the semiconductor device of the present embodiment. In this case, the electrodes each having a strip-like shape may be formed from a single metal layer, thus only requiring a relatively simple process for forming the electrodes.

The operation of the semiconductor device of the third embodiment will be now explained. When a positive voltage is applied to the gate terminal G while the emitter terminal E is grounded and a positive voltage is being applied to the collector terminal C, an inversion layer is formed in the vicinity of the surface of the p base region 3 right below the gate electrode 13, so that the n channel MOS transistor UT1 is turned on, and the resultant current provides the base current of the first-stage npn transistor BT1, thus causing the npn transistor BT1 to be turned on. Furthermore, the main current of the npn transistor BT1 provides the base current of the second-stage npn transistor BT2, so that the second-stage npn transistor BT2 is turned on, whereby the semiconductor device of the third embodiment is placed in the ON state. Upon application of the positive input signal to the gate terminal G, however, the first-and second-stage p channel MOS transistors UT2, UT3 are not turned on.

Upon turn-off of the semiconductor device, the potential of the gate terminal G is lowered to be equal to or lower than a threshold value of the first-stage n channel MOS transistor UT1, so that the n channel MOS transistor BT1 is turned off. As a result, the base current of the bipolar transistor is cut off, and the semiconductor device begins to be turned off. If a negative voltage is additionally applied to the gate terminal G, inversion layers are formed in the vicinity of surface portions of the n drift layer 2 that are interposed between the p base regions 4, 4a of the first-stage npn transistor BT1 and second-stage npn transistor B12, and the p$^+$ drain regions 5, 5a, respectively, so that the first-stage and second-stage p channel MOS transistors UT2. UT3 are turned on. As a result, an excessive amount of holes present in the npn transistors BT1, BT2 are drawn away from the p base regions 4, 4a into the p$^+$ drain regions 5, 5a through the respective inversion layers, and then into the emitter terminal E, thus increasing the rate or speed at which the device is turned off.

In the semiconductor device of the third embodiment, a gate electrode layer 15b is formed on an oxide film 14b over the surface of the n drift layer 2 that is interposed between the p$^+$ drain region 5 and the p base region 4a Namely, two p channel MOS transistors UT3 are provided on the opposite sides of the second-stage npn transistor BT2. Thus, the first-stage p channel MOS transistor UT2 connected to the first-stage npn transistor BT1 is provided at one location, whereas the second-stage p channel MOS transistors UT3 connected to the second-stage npn transistor BT2 are provided at two locations, i.e., on the opposite sides of the bipolar transistor, so as to increase the rate at which the base current of the second-stage npn transistor BT2 is removed or discharged. Consequently, the storage time during turnoff of the device is reduced to about 350 ns.

When the semiconductor device of the present embodiment is turned on, the npn transistors BT1, BT2 as bipolar transistors are turned on, thus assuring low ON resistance. Upon turn-off of the device, the p channel MOS transistors UIT2, UT3 are turned on, so as to draw carriers that have been stored in the ON state from the npn transistors BT1, BT2, thereby reducing the storage time and permitting high-speed switching operations.

Embodiment 4

Figure 10:
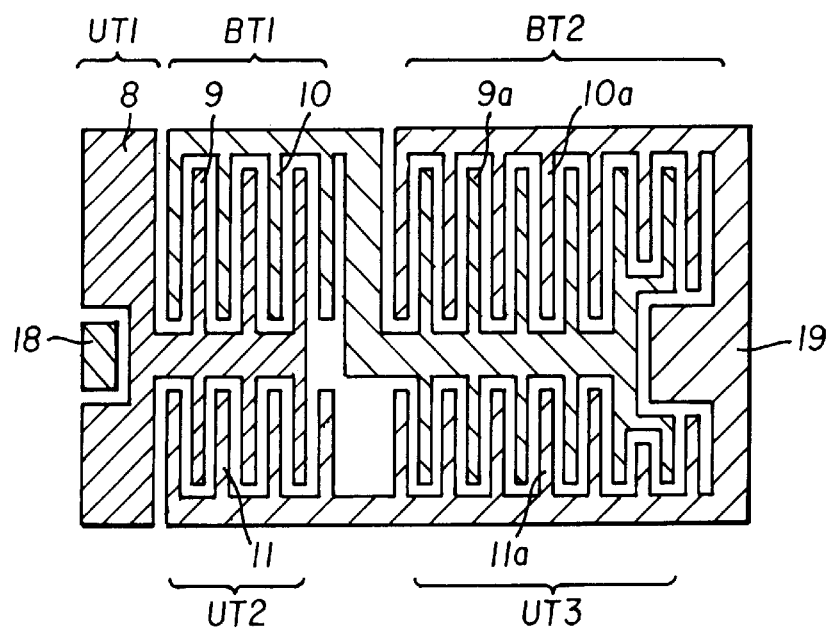
FIG. 10 is a view showing the arrangement of electrodes of a semiconductor device according to the fourth embodiment of the present invention.

FIG. 10 is a view showing the arrangement of electrodes of another monolithic semiconductor device that realizes the equivalent circuit of FIG. 7. For the sake of brevity of the figure, the gate electrode layers formed from polysilicon layers are omitted, and only the electrodes formed from metallic films and their wiring are illustrated. The base electrode 9 (connected to the source electrode 8 of the n channel MOSFET UT1) and emitter electrode 10 of the bipolar transistor BT1 and the base electrode 9a and emitter electrode 1a of the bipolar transistor BT2 are all formed in a comb-like shape. The drain electrodes 11, 11a of the p channel MOS transistors UT2, UT3 are also formed in a comb-like shape. Reference numeral 19 denotes an emitter electrode pad, which is connected to the emitter electrode 10a by a thick wire, and reference numeral 18 denotes a gate electrode pad. While the gate electrode layers may be formed of metal, non-metallic gate electrode layers are employed in the present embodiment. In this case, the electrodes arranged in the above fashion may be formed from a single metal layer, thus only requiring a relatively simple process for forming the electrodes.

Embodiment 5

Figure 11:
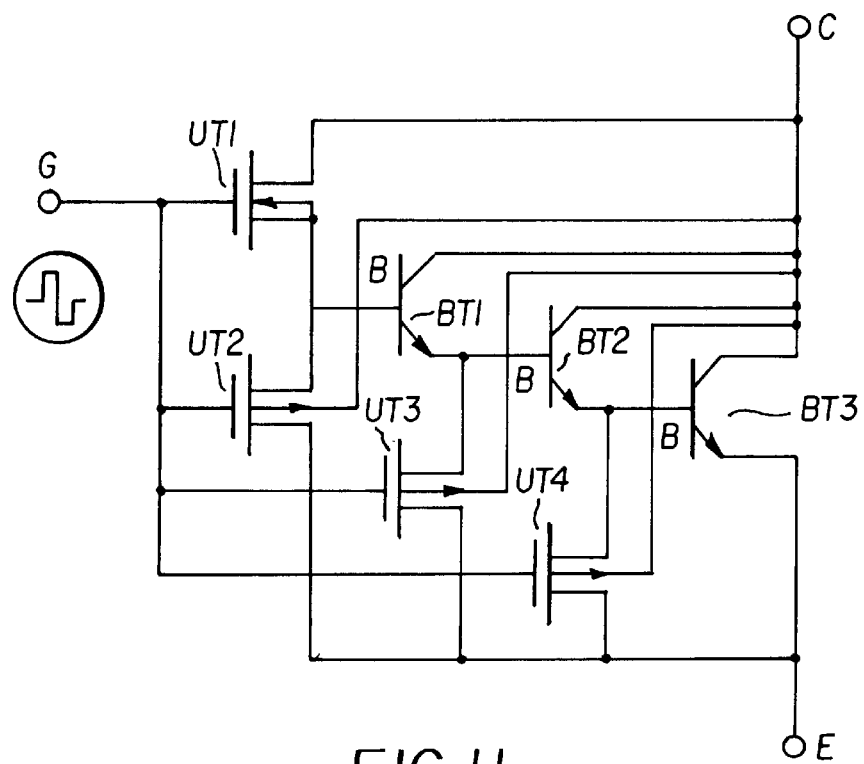
FIG. 11 is a circuit diagram showing an equivalent circuit of a semiconductor device according to the fifth embodiment of the present invention.

FIG. 11 is a circuit diagram showing an equivalent circuit of a semiconductor device according to the fifth embodiment of the present invention. The bipolar transistor in the output stage of this circuit is composed of three npn transistors BT1, BT2 and BT3 that are connected in the Darlington configuration. In this circuit, the source and drain of each of the first-stage, second-stage and third-stage p channel MOS transistors UT2, UT3, UT4 are connected between the base B of a corresponding one of the first-stage, second-stage and third-stage npn transistors BT1, BT2, and BT3, and the emitter E of the third-stage npn transistor BT3. The n channel MOS transistor UT1 and the p channel MOS transistors U12, UT3, UT4 have a common gate, which is connected to the G terminal.

The operation of this semiconductor device is basically similar to those of the semiconductor devices of the first and third semiconductor devices. When the semiconductor device is turned on, the npn transistors BT1, BT2 and BT3 as bipolar transistors are turned on, thus assuring low ON resistance. Upon turn-off of the device, the p channel MOS transistors UT2, UT3 and UT4 are turned on, so as to draw carriers that have been stored in the ON state away from the npn transistors BT1, BT2 and BT3, thus reducing the storage time and permitting high-speed switching operations.

Figure 12:
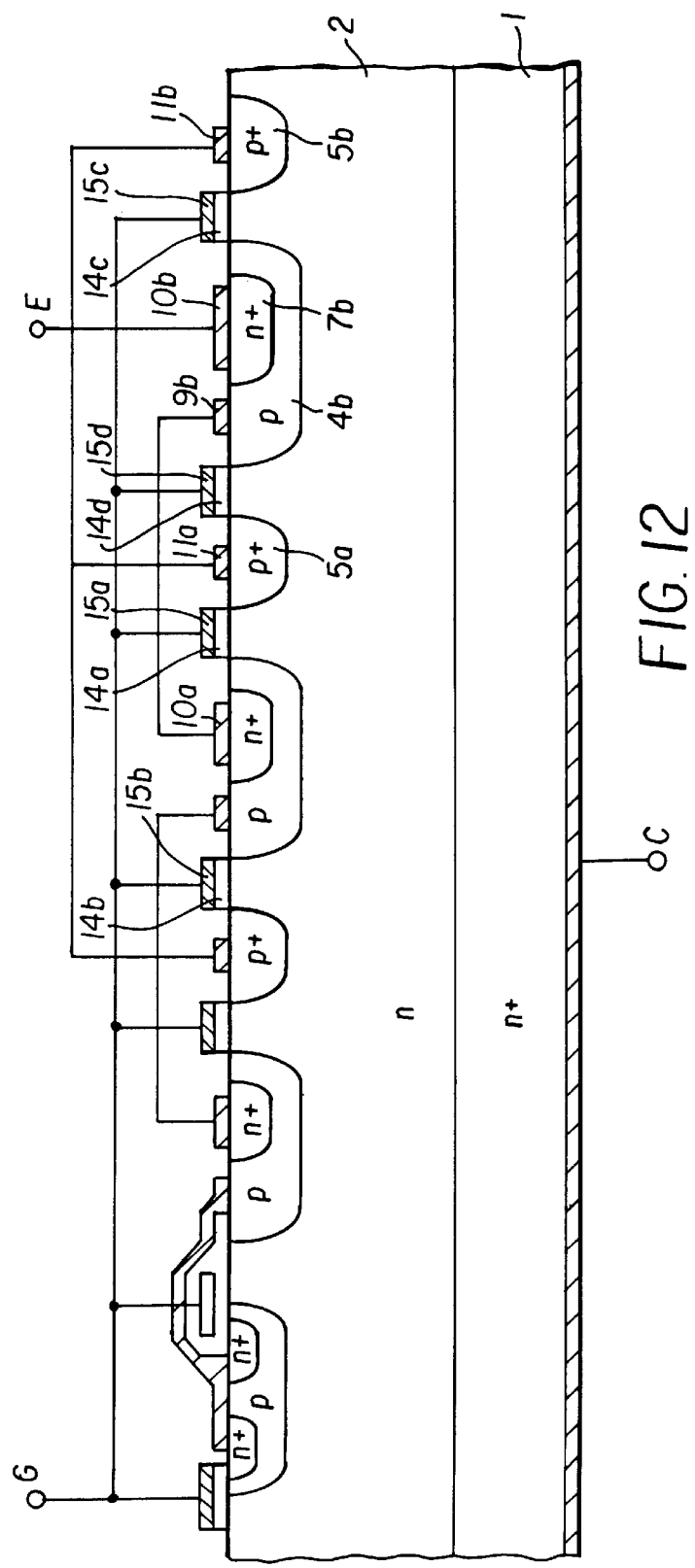
FIG. 12 is a cross-sectional view showing a part of a semiconductor device according to the fifth embodiment of the present invention.

FIG. 12 is a cross-sectional view showing a part of a monolithic semiconductor device which realizes the equivalent circuit of FIG. 11. In FIG. 12, the third-stage npn transistor BT3 and the third-stage p channel MOS transistor UT4 are added to the semiconductor device of the third embodiment as shown in FIG. 8. The structures of these transistors BT3, UT4 are substantially the same as those of the first-stage npn transistor BT1 and the first-stage p channel MOS transistor UT2, respectively. For the reasons as explained above in the third embodiment, the areas of the second-stage npn transistor and second-stage p channel MOS transistor are made smaller than those of the first-stage npn transistor and first-stage p channel MOS transistor, and the areas of the third-stage npn transistor and third-stage p channel MOS transistor are made smaller than those of the second-stage npn transistor and second-stage p channel MOS transistor.

More specifically, p base region 4b and n$^+$ emitter region 7b of the third-stage npn transistor BT3 are formed in the surface layer of the n drift layer 2, and base electrode 9b and emitter electrode 10b are formed on the surfaces of the p base region 4b and the n$^+$ emitter region 7b, respectively. In addition, a p$^+$ drain region 5b of the third-stage p channel MOS transistor U4 is formed, and a drain region 11b is formed on the p$^+$ drain region 5b. In particular, the p base region 4b and the p$^+$ drain region 5b are located adjacent to each other. Furthermore, a gate electrode layer 15c of the p channel MOS transistor UT4 is formed on a gate oxide film 14c over a portion of the surface of the n drift layer 2 that is interposed between the p base region 4b and the p$^+$ drain region 5b, such that the gate electrode layer 15c is connected to the G terminal. The base electrode 9b is connected to the emitter electrode 10a of the second-stage npn transistor, and the drain electrode 11b, as well as the drain electrodes 11, 11a of the first- and second-stage p channel MOS transistors UT2, UT3, and the emitter electrode 10b, is connected to the E terminal. While the p channel MOS transistors for turn-off operation are arranged one-dimensionally in the lateral direction in the cross-sectional view of FIG. 12, these transistors may be arranged in a two-dimensional plane.

Figure 13:
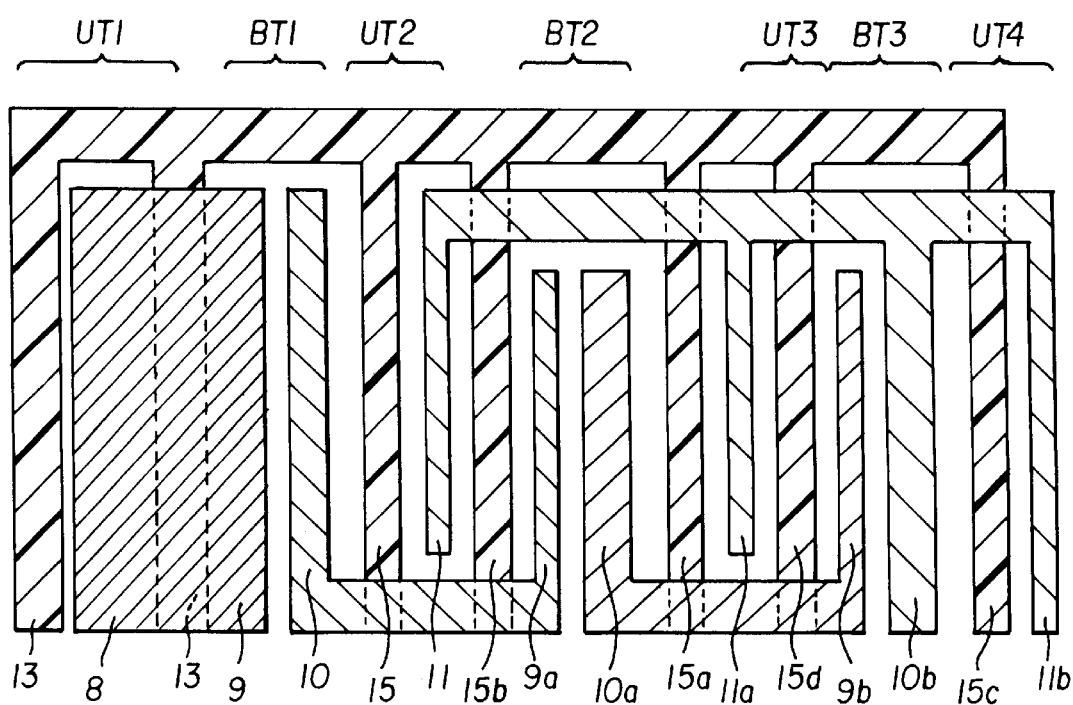
FIG. 13 is a view showing the arrangement of electrodes of the semiconductor device of the fifth embodiment.

FIG. 13 is a view showing the arrangement of the electrodes of the semiconductor device of FIG. 12. The source electrode 8 of the n channel MOS transistor UT1 is extended over the gate electrode layer 13 via an insulating film (not shown), to be connected to the base electrode 9. The strip-like emitter electrode 10 of the bipolar transistor BT1 passes over the gate electrode layer 15 and the gate electrode layer 15b of the p channel MOS transistor UT2 via insulating films, to be connected to the base electrode 9a of the bipolar transistor BT2. Similarly, the emitter electrode 10a of the bipolar transistor BT of the p channel MOS transistor UT3 via insulating films, to be connected to the base electrode 9a of the bipolar transistor BT3. The emitter electrode 10b of the bipolar transistor BT3 passes over the gate electrode layers 15a, 15a, 15c, 15d via insulating films, to be connected to the drain electrodes 11, 11a, 11b of the p channel MOS transistor UT2, UT3, UT4. While the gate electrode layers 13, 15a–15d may be formed of metal, non-metallic gate electrode layers are employed in the semiconductor device of the present embodiment. In this case, the electrodes each having a strip-like shape may be formed from a single metal layer, thus only requiring a relatively simple process for forming the electrodes.

Embodiment 6

Figure 14:
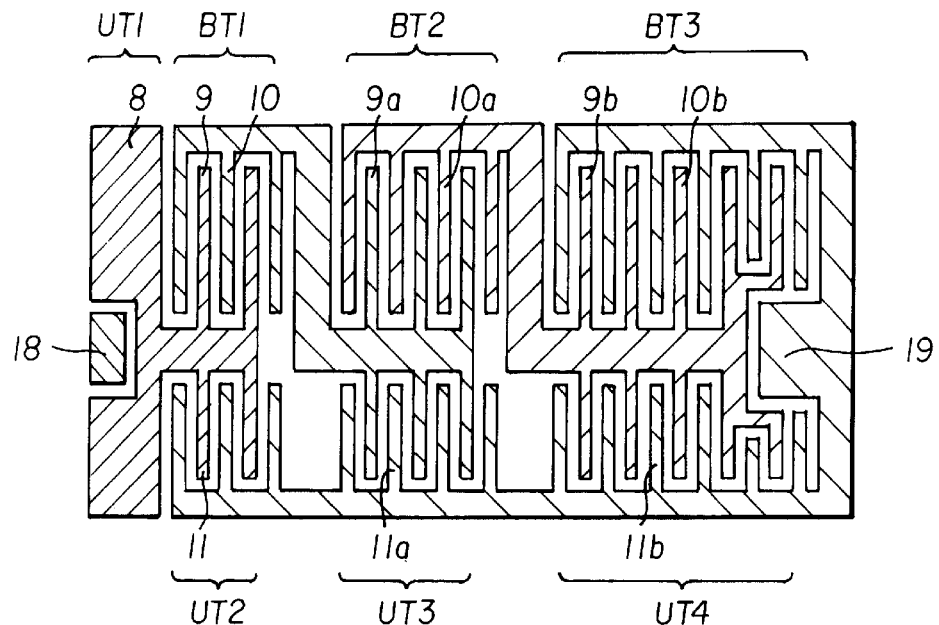
FIG. 14 is a view showing the arrangement of electrodes of a semiconductor device according to the sixth embodiment of the present invention.

FIG. 14 is a view showing the arrangement of electrodes of the semiconductor device of the sixth embodiment that realizes the equivalent circuit of FIG. 11. For the sake of brevity of the figure, the gate electrode layers formed from polysilicon layers are omitted, and only the electrodes formed from metallic films and their wiring are illustrated. The base electrodes 9, 9a, 9b of the bipolar transistors BT1, BT2, BT3 connected to the source electrode 8 of the n channel MOSFET UT1 and the emitter electrodes 10, 10a, 10b are all formed in a comb-like shape. The drain electrodes 11, 11a, 11b of the p channel MOS transistors UT2, UT3, UT4 are also formed in a comb-like shape. Reference numeral 19 denotes an emitter electrode pad, which is connected to the emitter electrode 10a by a thick wire, and reference numeral 18 denotes a gate electrode pad. While the gate electrode layers may be formed of metal, non-metallic gate electrode layers are employed in the present embodiment. In this case, the respective electrodes arranged in the above fashion may be formed from a single metal layer, thus only requiring a relatively simple process for forming the electrodes.

As the number of the bipolar transistors is increased, the base current of the bipolar npn transistor in the rear stage is increased, and thus the ON-state voltage is reduced. The area of the p channel MOS transistor connected to the rear-stage bipolar transistor is made larger than that of the p channel MOS transistor connected to the front-stage bipolar transistor, so as to avoid an increase in the storage time during turn-off of the semiconductor device even with an increased number of bipolar transistors, thus assuring high-speed switching of the device.

An example of semiconductor device having a breakdown voltage of 2000V was fabricated. To provide the high voltage device whose breakdown voltage is as high as 2000V, the n drift layer having a resistivity of 120 Ω·cm and a thickness of 130 μm was prepared. In the semiconductor device having such a high breakdown voltage, the n drift layer has an increased thickness, and it is therefore important to reduce the ON resistance. Important variables to be controlled to achieve reduced ON resistance include the diffusion depth of the n+ emitter regions 7, 7a, 7b, and the number of Darlington-connected bipolar transistors in the output stage.

Figure 15:
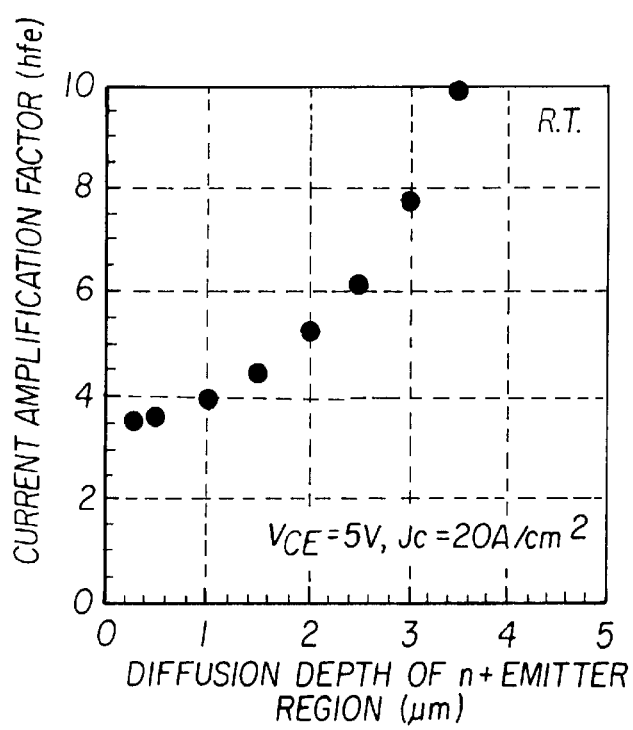
FIG. 15 a graph showing the relationship between the current amplification factor of a bipolar transistor and the diffusion depth of an $n^+$ emitter region of the transistor.

In a test, some specimens of bipolar transistors having different diffusion depths of n+ emitter regions were produced. FIG. 15 is a graph showing the relationship between the current amplification factor ($h_{FE}$) of each specimen of bipolar transistor and the diffusion depth of its n+ emitter region. The horizontal axis represents the diffusion depth of the n+ emitter region, and the vertical axis represents the current amplification factor. The thickness of the n drift layer of each transistor was 130 μm, and the diffusion depth of the p base region was 5 μm, and the current amplification factor was measured at room temperature while the voltage $V_{CE}$ between the collector and emitter was controlled to 5V, and the current density Jc was controlled to 20 A/cm². It will be understood from the graph of FIG. 15 that the current amplification factor is increased with an increase in the diffusion depth of the n+ emitter region. This is mainly because the width of the p base region is reduced with an increase in the diffusion depth of the n+ emitter region, which results in an increase in the carrier transport efficiency. Namely, the ON-state voltage of the bipolar transistor is considered to be lowered as the diffusion depth of the n+ emitter region is increased.

Figure 16:
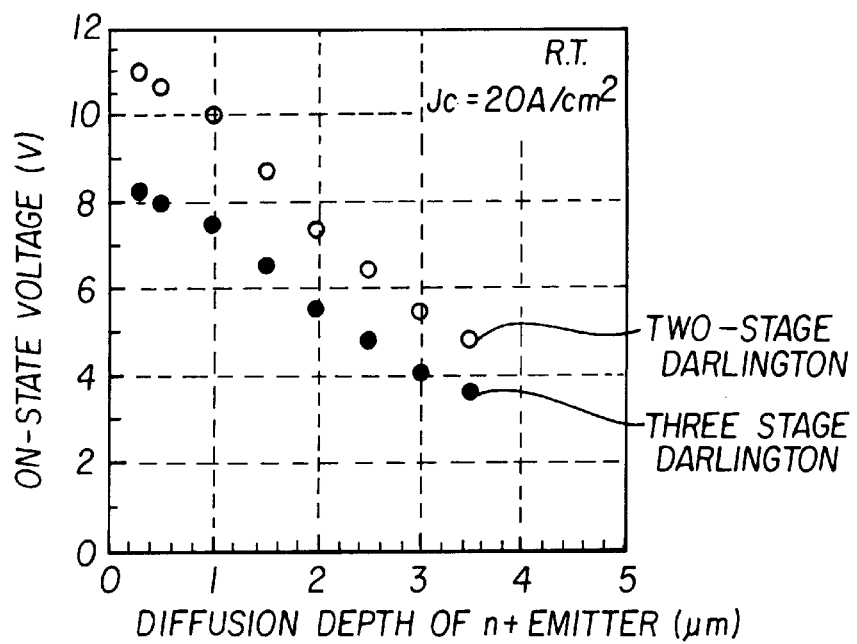
FIG. 16 is a graph showing the relationship between the ON-state voltage of the semiconductor device of the sixth embodiment and the diffusion depth of the n$^+$ emitter region of the device.

FIG. 16 is a graph showing the ON-state voltage (denoted by "●") of 2000V-class semiconductor devices which were constructed according to the sixth embodiment and in which the diffusion depth of the n+ emitter regions 7, 7a, 7b was actually varied. The other dimensions and parameters of the semiconductor devices were controlled to those as described above and those of the first embodiment. In FIG. 16, the horizontal axis represents the diffusion depth of the n+ emitter regions, and the vertical axis represents the ON-state voltage measured at room temperature at the current density Jc of 20 A/cm². It will be understood from this graph that the ON-state voltage is linearly reduced with an increase in the diffusion depth of the n+ emitter regions 7, 7a, 7b. The graph of FIG. 10 also shows the ON-state voltage (denoted by "○") of semiconductor devices which were constructed as shown in FIG. 10 and in which the diffusion depth of the n+ emitter regions 7, 7a was varied. In this case, too, the ON-state voltage is linearly reduced with an increase in the diffusion depth. The difference between "●" and "○" is that between the three-stage Darlington connection and the two-stage Darlington connection of the bipolar transistors.

Figure 17:
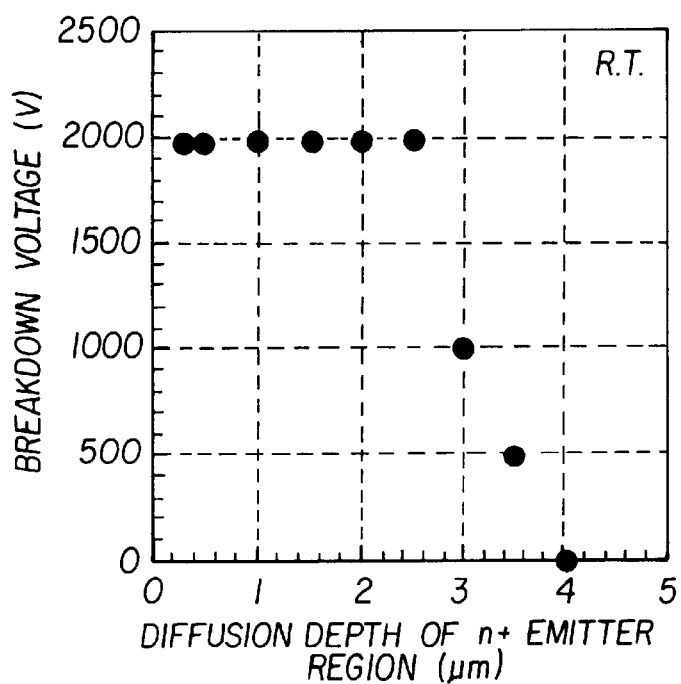
FIG. 17 is a graph showing the breakdown voltage of the semiconductor device of the sixth embodiment, and the diffusion depth of the n$^+$ emitter region.

The larger the diffusion depth of the n+ emitter regions, the better characteristic in terms of the ON-state voltage can be achieved. However, other characteristics of the semiconductor device are also influenced by the diffusion depth of the n+ emitter regions. FIG. 17 is a graph showing the breakdown voltage (denoted by "●") at room temperature of semiconductor devices of the present embodiment with various diffusion depths of the n+ emitter regions 7, 7a, 7b. The horizontal axis represents the diffusion depth of the n+ emitter regions 7, 7a, 7b, and the vertical axis represents the breakdown voltage of the semiconductor device. The breakdown voltage is kept at 2000V as long (as the diffusion depth is not larger than 2.5 μm, since the breakdown voltage is solely governed by avalanche breakdown. If the diffusion depth exceeds 2.5 μm, however, the breakdown voltage suddenly drops. This is because depletion layers that spread from pn junctions of the p base regions 4, 4a, 4b reach the n+ emitter regions 7, 7a, 7b, thus causing punch-through.

Figure 18:
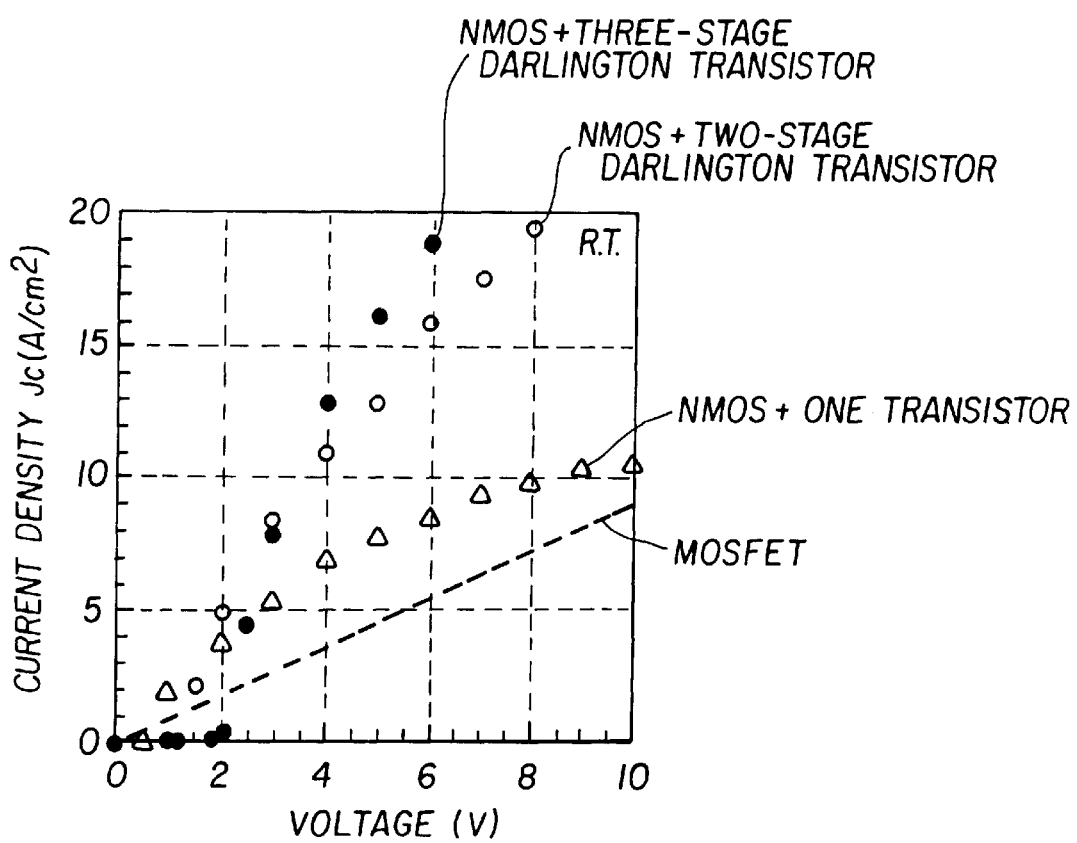
FIG. 18 is a graph showing current-voltage characteristics of the semiconductor device of the sixth embodiment and a comparative example.

Accordingly, in view of the results of FIGS. 16 and 17, the diffusion depth of the n+ emitter regions 7, 7a, 7b has an optimum value, more specifically, 2.5 μm in the present embodiment. FIG. 18 is a graph showing a current-voltage characteristic (denoted by "●") at room temperature of the semiconductor device of the fifth embodiment wherein the diffusion depth of the n+ emitter regions 7, 7a, 7b was controlled to the optimum value, namely, 2.5 μm. In this graph, the horizontal axis represents voltage, and the vertical axis represents the current density Jc. This graph also shows a current-voltage characteristic (denoted by "○") of a 2000V-class (breakdown voltage) semiconductor device of FIG. 6 having no Darlington configuration, and that (denoted by "Δ") of a 2000V-class semiconductor device of FIG. 10 having a two-stage Darlington configuration. In addition, the graph of FIG. 18 shows a current-voltage characteristic (denoted by "- - -") of a MOS transistor as a comparative example. It will be understood from FIG. 18 that the semiconductor device of the sixth embodiment exhibits considerably low ON-state voltage, as compared with the semiconductor devices of other structures and the comparative example.

Figure 19:
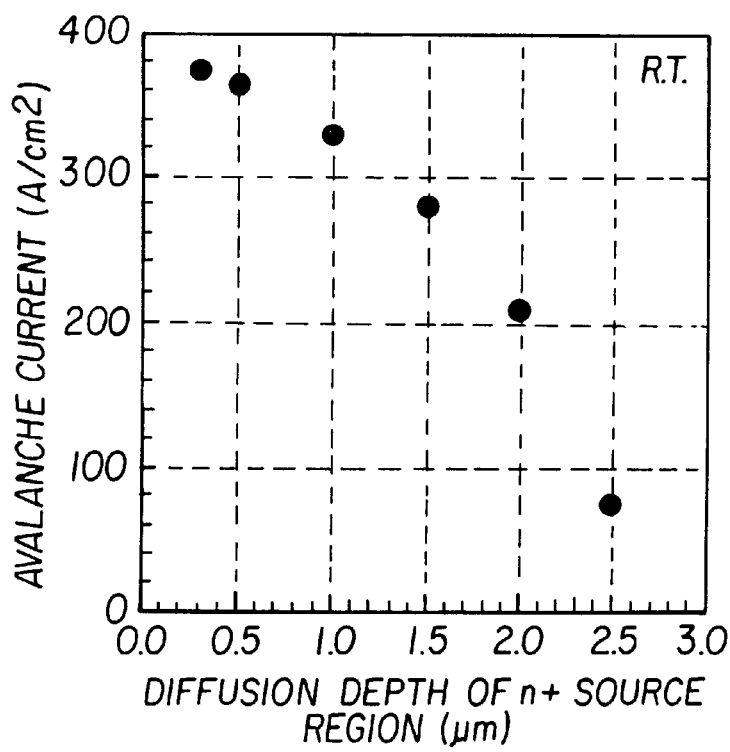
FIG. 19 is a graph showing the relationship between the avalanche current of an n channel MOSFET, and the diffusion depth of an n$^+$ source region of the MOSFET.

To find out what characteristics are influenced by the diffusion depth of the n+ source region of the n channel MOSFET, some specimens of n channel MOSFET were produced in which the resistivity of the n drift layer was controlled to 120 Ω·cm, and its thickness was controlled to 130 μm. FIG. 19 is a graph showing the relationship between the diffusion depth of the n+ source region and the avalanche current of each specimen of n channel MOSFET. The measurements were made at room temperature. In this graph, the horizontal axis represents the diffusion depth of the n+ source region, and the vertical axis represents the avalanche current. The thickness of the n drift layer was made equal to 130 μm, and the diffusion depth of the p well region was made equal to 5 μm. It will be understood from FIG. 19 that the avalanche current is lowered as the diffusion depth of the n+ source region is increased. Although the n channel MOSFET operates as a unipolar device during its normal operation, electron-hole pairs appear due to avalanche breakdown when an electric field having a large field strength is applied to the device. If the product of the hole current and the resistance measured from the location of occurrence of avalanche breakdown to the source electrode exceeds a certain electrostatic potential, a parasitic transistor begins to operate, causing a phenomenon called latch-up. It is thus understood from FIG. 19 that if the diffusion depth of the n+ source region is increased, the resistance between the location of occurrence of the avalanche breakdown and the source electrode is increased, whereby the avalanche current is reduced, namely, avalanche breakdown occurs at a lower current.

Figure 20:
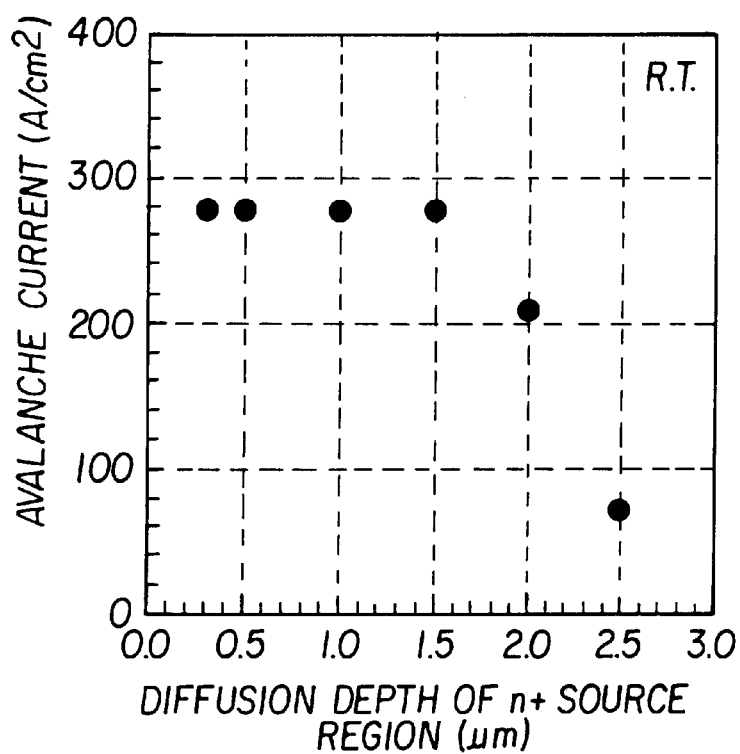
FIG. 20 is a graph showing the relationship between the avalanche current of the semiconductor device of the sixth embodiment, and the diffusion depth of an n$^+$ source region of the device.

FIG. 20 is a graph showing the avalanche current (denoted by "●") of some specimens of the semiconductor device of the sixth embodiment which were produced while varying the diffusion depth of the n+ source region 3. In this graph, the horizontal axis represents the diffusion depth of the n+ source region 6, and the vertical axis represents the avalanche current. The measurements were made at room temperature. The diffusion depth of the n+ emitter regions 7, 7a, 7b was controlled to 2.5 μm. It will be understood from FIG. 20 that when the diffusion depth of the n+ source region 6 is equal to or smaller than 1.5 μm, the device exhibits a constant value of avalanche current, namely, constant capability to withstand avalanche breakdown irrespective of the diffusion depth of the n+ source region 6. This is due to the operation of the bipolar transistor portion in the semiconductor device. If the diffusion depth of the n+ source region 6 exceeds 1.5 μm, however, the avalanche current depends upon the operation of a parasitic transistor in the n channel MOSFET portion of the device, and is therefore lowered with an increase in the diffusion depth.

Figure 21:
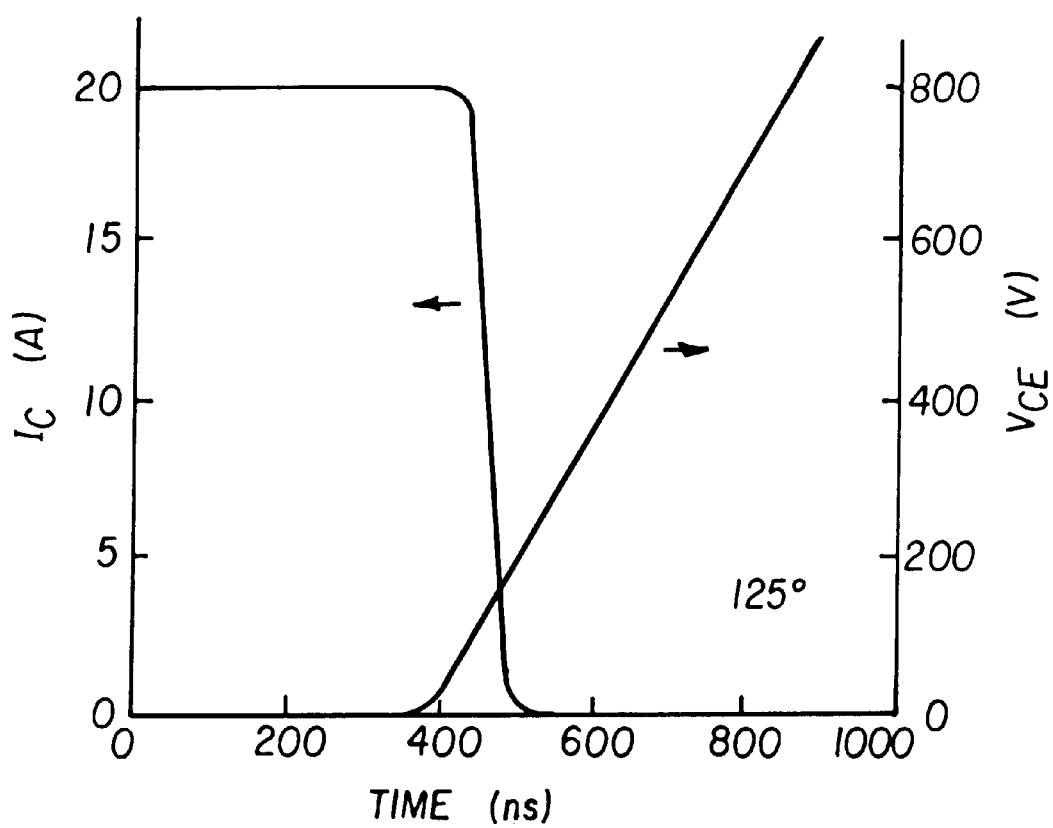
FIG. 21 is a graph showing current and voltage waveforms during turn-off of the semiconductor device of the sixth embodiment.

FIG. 21 is a graph showing the current and voltage waveforms during turn-off of the semiconductor device of the sixth embodiment having a breakdown voltage of 2000V. In FIG. 21, the horizontal axis represents time, and the vertical axis represents the voltage $V_{CE}$ between the collector and the emitter. The measurements were made at 125° C. As is understood from this graph, the storage time that takes up most of the turn-off time is as short as 400 ns, and the fall time is equal to about 100 ns, which is equivalent to that of a known MOS transistor. Thus, this device can be turned off at a considerably high speed.

Embodiment 7

Other examples of variable dimensions include the diffusion depths of the p well region, p base region and the p+ drain region. Some experiments were conducted in which these dimensions were varied. In the present embodiment, the diffusion depths of the p well region, p base region and the p+ drain region were varied for the semiconductor device including bipolar transistors connected in three-stage Darlington configuration and having the arrangement of electrodes shown in FIG. 14.

Figure 22:
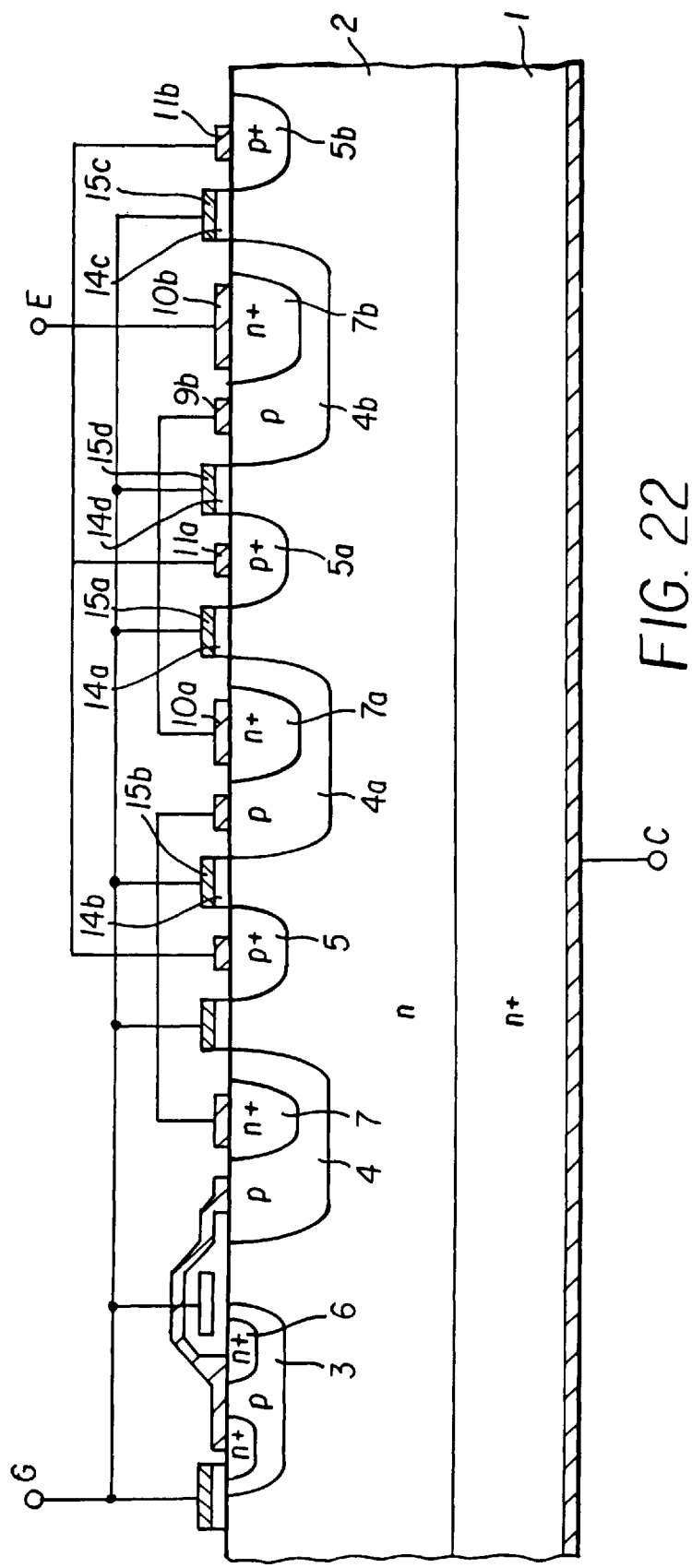
FIG. 22 is a cross-sectional view showing a part of one example of semiconductor device according to the seventh embodiment of the present invention.

FIG. 22 is a cross-sectional view showing a part of 2000V-class semiconductor device as one example of the present embodiment. The diffusion depths of the p well region 3, p base regions 4, 4a, 4b, and the p+ drain region 5 were controlled to 5 μm, 8 μm, and 5 m, respectively, and the diffusion depth of the n+ emitter regions 7, 7a, 7b was controlled to 5.5 μm. The diffusion depths of the p well region, p+ drain region and the p base region were determined from the experiments as described below.

Figure 23:
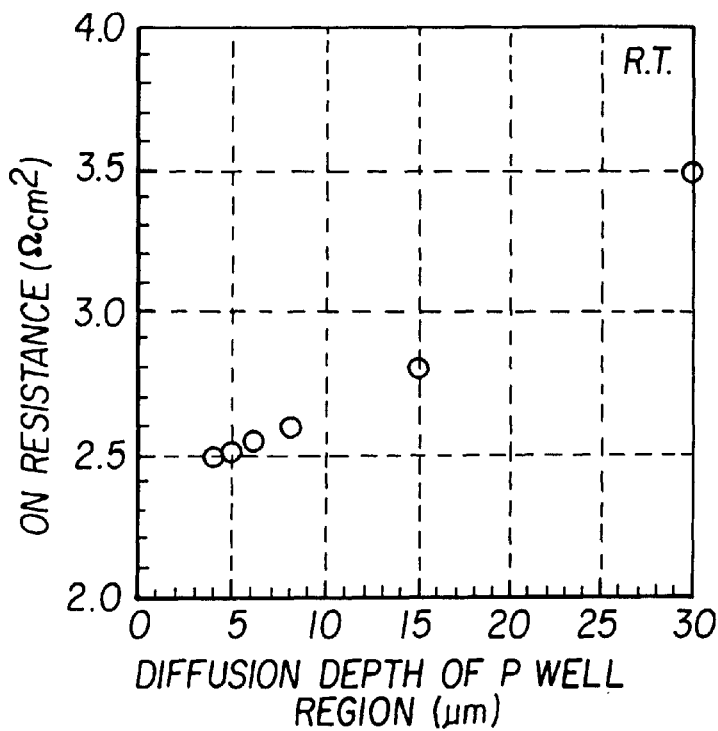
FIG. 23 is a graph showing the relationship between the diffusion depth of the p well region and the ON resistance in an n channel MOSFET.

To provide a high voltage device whose breakdown voltage is as high as 2000V, an n channel MOSFET was fabricated which includes an n drift layer having a resistivity of 120 Ω·cm and a thickness of 130 μm. FIG. 23 is a graph showing the relationship between the diffusion depth of the p well region and the ON resistance RonA of the n channel MOSFET measured at room temperature. The diffusion depth of the n+ source region was 0.3 μm. It will be understood from FIG. 23 that the ON resistance increases with an increase in the diffusion depth of the p well region. This increase in the ON resistance may be caused for two reasons: 1) as the diffusion depth of the p well region increases, the interval (called "cell pitch") at which unit cells of MOSFET are repeatedly formed is increased, resulting in a reduction in the packing density of the unit cells, and 2) the channel length is increased (in the case where the p well region and the n+ source region are formed with the same diffusion mask for self-alignment).

Figure 24:
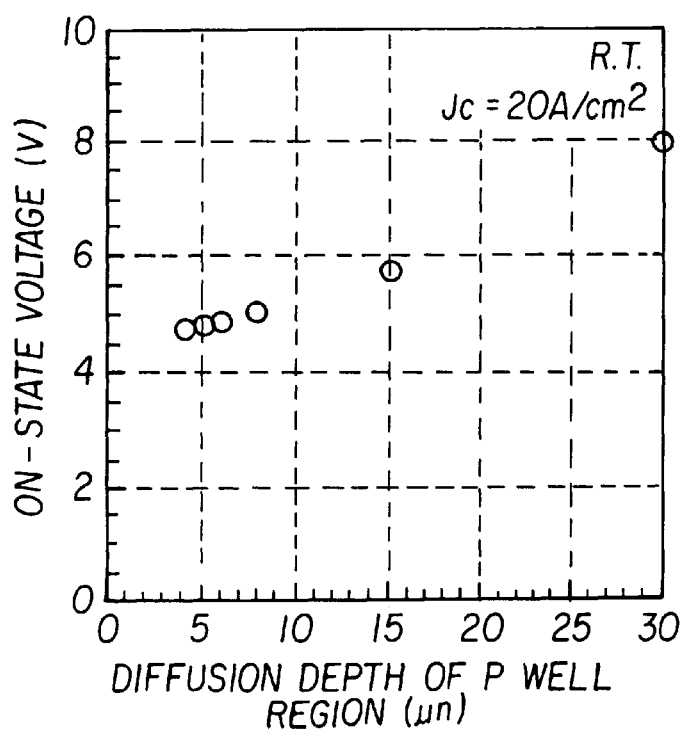
FIG. 24 is a graph showing the relationship between the diffusion depth of the p well region and the ON-state voltage in the semiconductor device of the seventh embodiment.

FIG. 24 is a graph showing the ON-state voltage measured at room temperature and the diffusion depth of the p well region 3 which was varied in the semiconductor device of the seventh embodiment. The diffusion depth of the p+ drain regions 5, 5a, 5b and p base regions 4, 4a, 4b was controlled to 5 μm. In FIG. 24, the horizontal axis represents the diffusion depth of the p well region 3, and the vertical axis represents the ON-state voltage measured at a current density Jc of 20 A/cm². It will be understood from this graph that the ON-state voltage is gradually increased as the diffusion depth of the p well region 3 is increased. This is because the ON resistance of the n channel MOSFET increases with an increase in the diffusion depth of the p well region 3, as explained above, and therefore current supplied to the bipolar transistor in the later stage is reduced. Thus, it is preferable that the p well region 3 have a reduced diffusion depth. It is, however, to be noted that saturation tends to gradually take place if the diffusion depth is reduced to be smaller than 10 μm.

Figure 25:
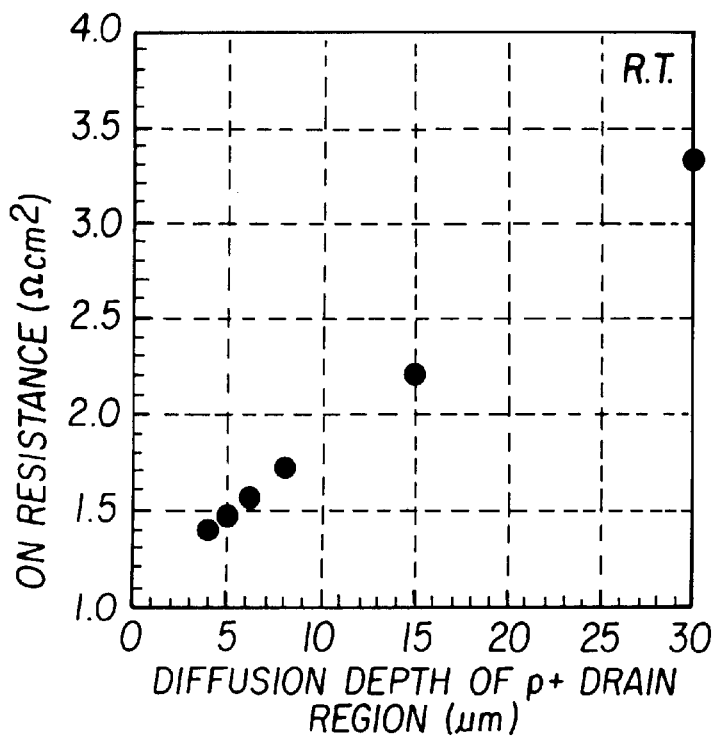
FIG. 25 is a graph showing the relationship between the diffusion depth of the p$^+$ drain region and the ON resistance in a p channel MOSFET.

In the next experiment, a p channel MOSFET was fabricated which includes an n drift layer having a resistivity of 120 Ω·m and a thickness of 130 μm. FIG. 25 is a graph showing the relationship between the diffusion depth of the p+ drain region and the ON resistance measured at room temperature in the p channel MOSFET thus fabricated. It will be understood from this graph that the ON resistance increases as the diffusion depth of the p+ drain region is increased. This increase is caused by the fact that as the diffusion depth of the p well region is increased, the interval (called "cell pitch") at which the unit cells of MOSFET are repeatedly formed is increased, and the packing density of the unit cells of MOSFET is reduced.

Figure 26:
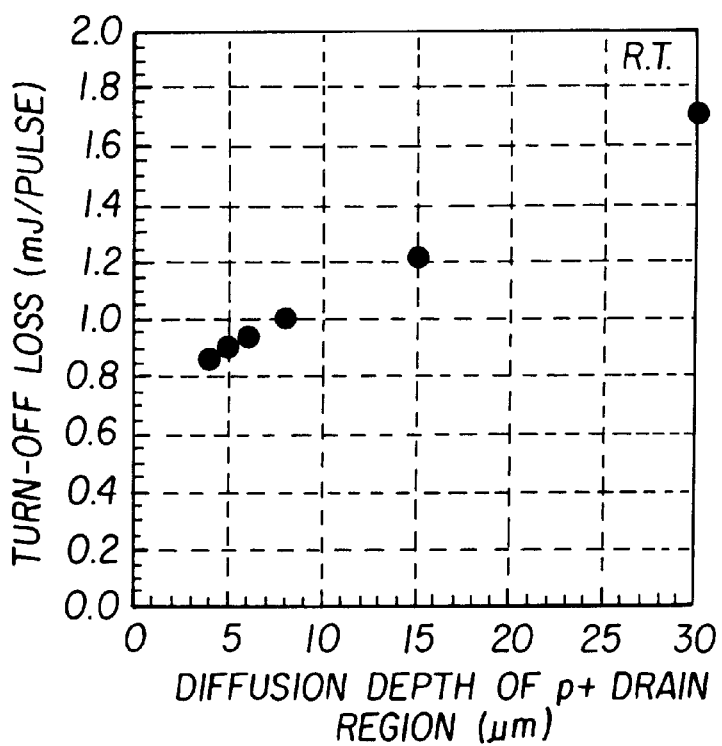
FIG. 26 is a graph showing the diffusion depth of the p$^+$ drain region and the turn-off loss in the semiconductor device of the seventh embodiment.

FIG. 26 is a graph showing the relationship between the turn-off loss and the diffusion depth of the p+ drain regions 5, 5a, 5b that was varied in the semiconductor device of the seventh embodiment. The diffusion depth of the p+ drain regions 5, 5a, 5b was made equal to each other, and the diffusion depth of the p well region 3 and p base regions 4, 4a, 4b was controlled to 5 μm. The horizontal axis represents the diffusion depth of the p+ drain region, and the vertical axis represents the turn-off loss measured at room temperature. The measurements were made in a voltage resonance circuit that operates at the frequency of 120 kHz with the cut-off current of 12 A. It will be understood from FIG. 26 that the turnoff loss is gradually increased as the diffusion depth of the p+drain regions 5, 5a, 5b is increased. The increase in the turnoff loss is caused for the reason that as the diffusion depth of the p+ drain regions 5, 5a, 5b is increased, the ON resistance of the p channel MOSFET is increased, resulting in a reduced capability of drawing carriers away from the bipolar transistors upon turn-off. Accordingly, it is preferable that the p+ drain regions 5, 5a, 5b have a relatively small diffusion depth. If the diffusion depth of the p well region 3 is equal to that of the p+drain regions 5, 5a, 5b, these regions can be advantageously formed at the same time.

Figure 27:
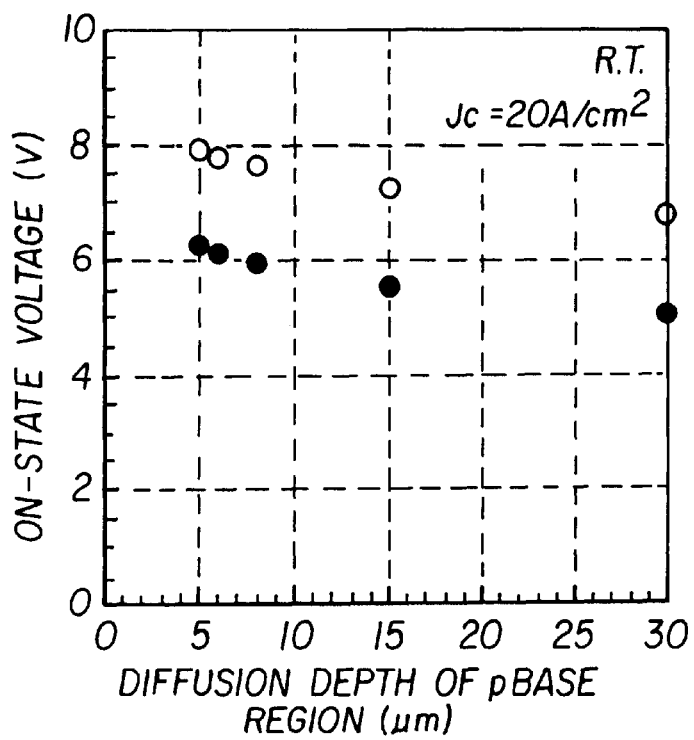
FIG. 27 is a graph showing the diffusion depth of the p base region and the ON-state voltage in the semiconductor device of the seventh embodiment.

FIG. 27 is a graph indicating the ON-state voltage (denoted by "●") of the semiconductor device of the seventh embodiment when the diffusion depth of the p base regions 4, 4a, 4b was varied. The p base regions 4, 4a, 4b were formed with the same diffusion depth, and the p well region 3 and p+ drain regions 5, 5a, 5b had a diffusion depth of 5 μm. In FIG. 27, the horizontal axis represents the diffusion depth of the p base regions 4, 4a, 4b, and the vertical axis represents the ON-state voltage measured at room temperature when the current density Jc was equal to 20 A/cm². It will be understood from FIG. 27 that the ON-state voltage is lowered as the diffusion depth of the p base regions 4, 4a, 4b is increased. For comparison, FIG. 27 also shows the ON-state voltage (denoted by "○") of the semiconductor device constructed as shown in FIG. 10 and including two-stage Darlington-connected bipolar transistors, when the diffusion depth of the p base regions 4, 4a was varied. In this example, too, the ON-state voltage is lowered as the diffusion depth is increased.

Figure 28:
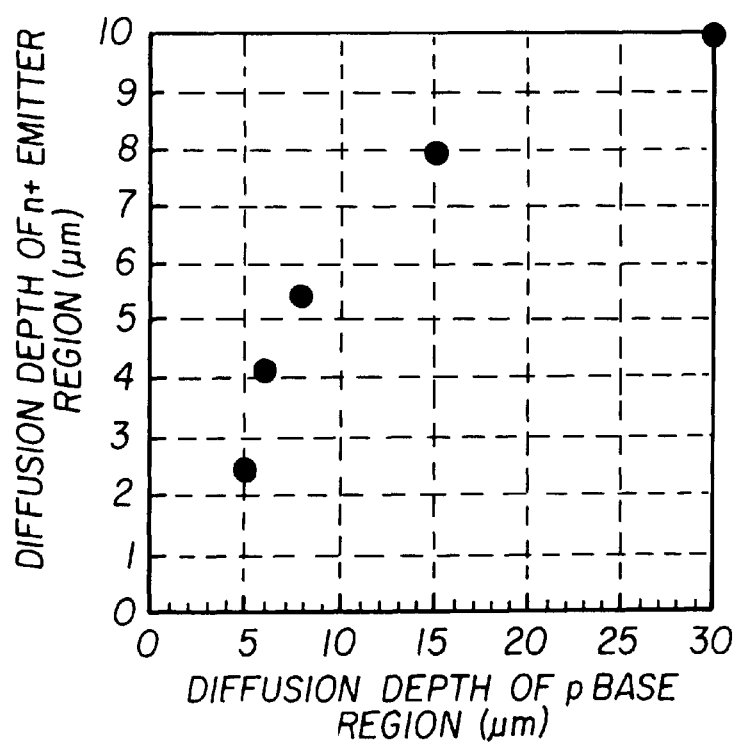
FIG. 28 is a graph showing the relationship between the diffusion depth of the p base region and that of the n$^+$ emitter region in the semiconductor device of the seventh embodiment.

FIG. 28 is a graph showing the relationship between the diffusion depth of the p base regions 4, 4a, 4b and that of the n+ emitter regions 7, 7a, 7b. In this graph, the diffusion depth of the n+ emitter regions 7, 7a, 7b varies with that of the p base regions 4, 4a, 4b. This is because the ON-state voltage can be reduced by increasing the diffusion depth of the n+ emitter regions 7, 7a, 7b, but an excessively increased diffusion depth may result in a reduction in the breakdown voltage due to punch-through, as described above with respect to the sixth embodiment. For this reason, the maximum diffusion depth of the n+ emitter regions 7, 7a, 7b that would not cause this problem was selected.

As the diffusion depth of the p base regions 4, 4a, 4b increases, the p base width (namely, a difference between the diffusion depth of the p base regions 4, 4a, 4b and that of the n+ emitter regions 7, 7a, 7b ) is increased, resulting in a reduced transport efficiency of carriers injected into the p base regions. As shown in FIG. 26, however, the ON-state voltage decreases as the diffusion depth of the p base region 4, 4a, 4b increases. This is because reduction in the resistance component of the n drift layer 2 becomes dominant.

As explained above referring to FIG. 27, the lower ON-state voltage can be achieved by increasing the diffusion depth of the p base regions. However, the diffusion time required for forming the p base regions having a diffusion depth of, for example, 30 μm, is about ten times as much as that required for achieving a diffusion depth of 8 μm, and about four times as much as that required for achieving a diffusion depth of 15 μm. Thus, the diffusion depth of the p base regions should be appropriately selected in view of the time required in the process of forming these regions, as well as the ON-state voltage.

FIG. 29 is a graph showing a current-voltage characteristic (denoted by "▲") of the semiconductor device of FIG. 22. The horizontal axis denotes the voltage, and the vertical axis denotes the current density Jc. The measurements were made at room temperature. For comparison, the current-voltage characteristic (denoted by "●") of the semiconductor device of the sixth embodiment of FIG. 18 is shown in the graph of FIG. 29. In the semiconductor device of the seventh embodiment, the ON-state voltage was reduced from 6.5V to 5.5V, particularly at a high current density of 20 A/cm, as compared with the device of the sixth embodiment.

Embodiment 8

FIG. 30 is a circuit diagram showing an equivalent circuit of a semiconductor device according to the eighth embodiment of the present invention. This circuit is almost identical with that of FIG. 7, except that the first and second p channel MOS transistors UT2, UT3 are depletion-type MOS transistors.

The operation of the semiconductor device of the present embodiment is similar to that of the semiconductor device of the third embodiment. When a zero input signal is applied to the gate G, however, the p channel MOS transistors UT2, UT3 of the semiconductor device of the third embodiment are not turned on, whereas the p channel MOS transistors UT2, UT3 of the semiconductor device of the eighth embodiment are turned on. Accordingly, the bases of the npn transistors BT1, BT2 are short-circuited to the emitter of the npn transistor BT2, thus assuring increased breakdown voltage between the collector C and the emitter E upon turn-off. Although a negative signal is not necessarily applied to the gate to turn off the semiconductor device of the present embodiment, it is still better to apply a negative gate signal so as to increase the switching speed.

Figure 31:
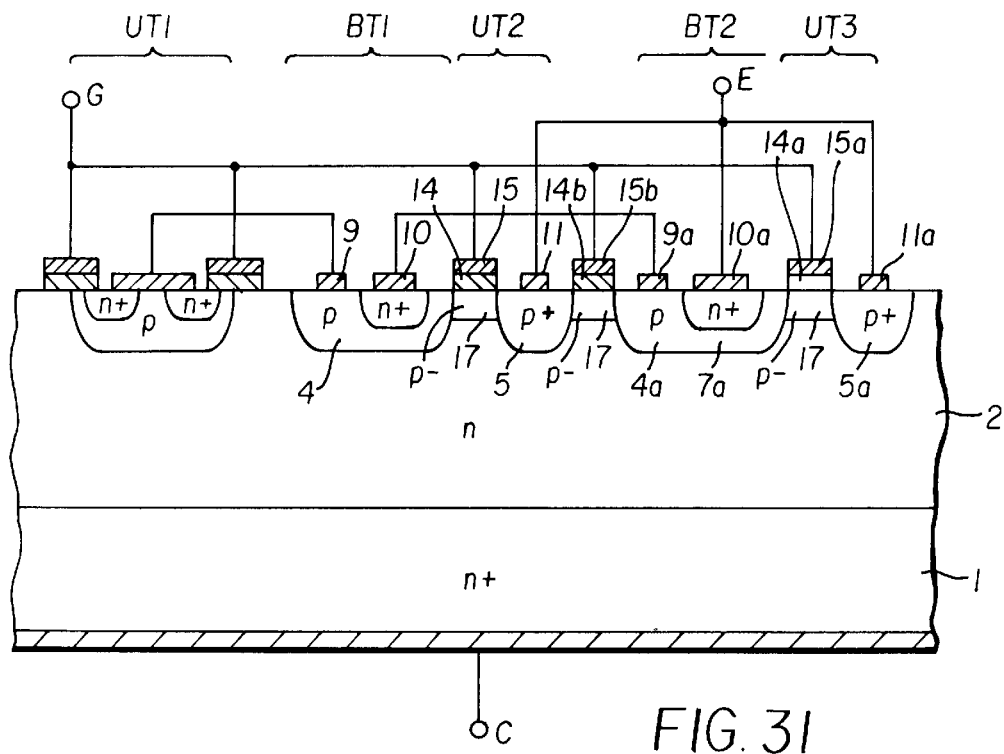
FIG. 31 is a cross-sectional view showing a part of the semiconductor device of the eighth embodiment.

FIG. 31 is a cross-sectional view showing a part of one example of a monolithic semiconductor device which realizes the equivalent circuit of FIG. 30. In this semiconductor device, p⁻ low-concentration regions 17 are formed in portions of a surface layer of the n drift layer 2 which are located right under the insulating films 14, 14a, and 14b, so that the p channel MOS transistors UT2, UT3 provide depletion-type MOS transistors. For instance, the surface concentration of the p⁻ low-concentration region 17 is $1\times10^{16}$ cm$^{-3}$, and its diffusion depth is 3 μm. With the semiconductor device thus constructed, the p channel MOS transistors UT2, UT3 are placed in the ON-state even when the gate electrodes 15, 15a of the p channel MOS transistors UT2, UT3 are short-circuited to the emitter electrode 8 of the npn transistor BT2 in the last stage, so that the potential of the bases of the npn transistors BT1, BT2 become equal to the emitter potential of the last-stage npn transistor BT2. This leads to an increased breakdown voltage between the collector C and the emitter E upon turn-off of the device.

Figure 32:
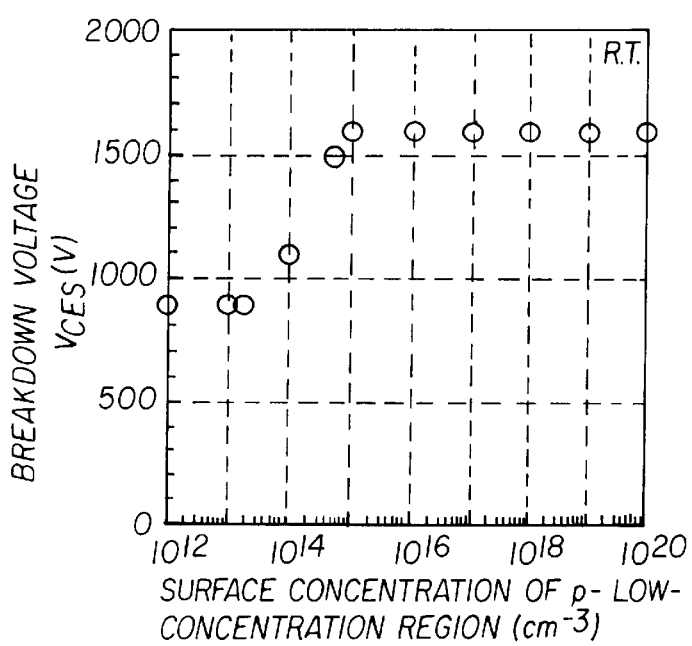
FIG. 32 is a graph showing the relationship between the breakdown voltage and the impurity concentration of a p$^-$ low-concentration region in the semiconductor device of the eighth embodiment.

FIG. 32 is a graph showing the relationship between the surface concentration of the p⁻ low-concentration regions 17 and the breakdown voltage $V_{CES}$ between the collector C and the emitter E measured at room temperature. When the surface concentration of the p⁻ low-concentration region 17 is in a range lower than $1\times10^{14}$ cm$^{-3}$, the semiconductor device exhibits a relatively low breakdown voltage between the collector C and the emitter E. When the surface concentration of the p⁻ low-concentration region 17 is in a range higher than $1\times10^{15}$ cm$^{-3}$, the semiconductor device exhibits a relatively high breakdown voltage between the collector C and the emitter E.

If the surface concentration of the p⁻ low-concentration regions 17 is lower than the impurity concentration of the n drift layer 2, the p⁻ low-concentration regions 17 do not provide effective channel regions under the condition that the gate G and the emitter E are short-circuited. As a result, the base potential becomes higher than the emitter potential in the npn transistors BT1, BT2, and the leakage current is amplified due to the operation of the transistors, whereby the breakdown voltage is reduced, namely, the device has reduced capability to withstand high voltage. If the surface concentration of the p⁻ low-concentration region 17 is controlled to be higher than the impurity concentration of the n drift layer 2, on the other hand, the p⁻ low-concentration regions 17 provide effective channel regions under the condition that the gate G and the emitter E are short-circuited. As a result, the base potential becomes equal to the emitter potential in the npn transistors BT1, BT2, and the breakdown voltage can be increased.

Figure 33:
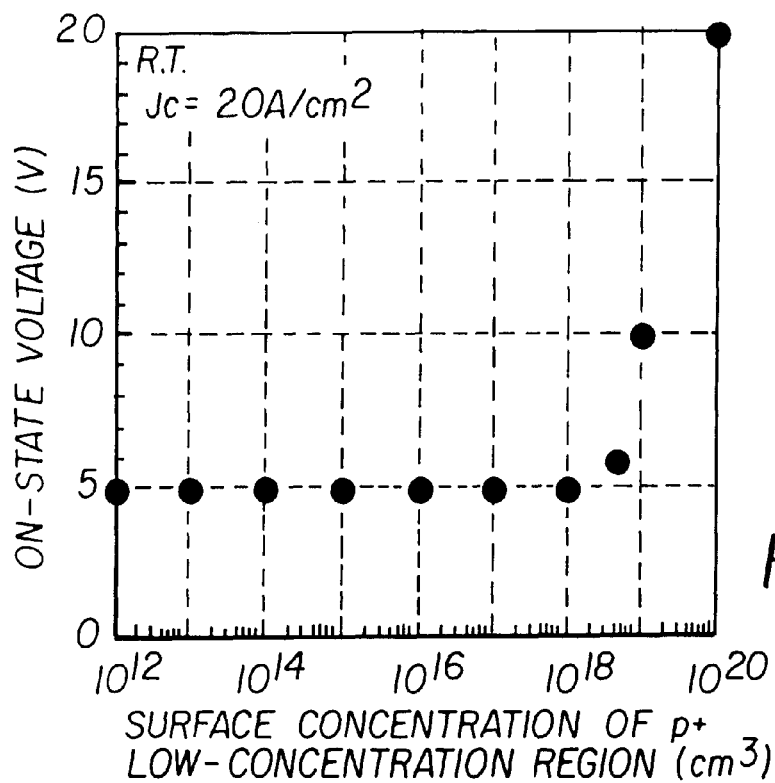
FIG. 33 is a graph showing the relationship between the ON-state voltage and the impurity concentration of the p$^-$ low-concentration region in the semiconductor device of the eighth embodiment.

FIG. 33 is a graph showing the relationship between the surface concentration of the p⁻ low-concentration regions 17 of the present embodiment and the ON-state voltage. The horizontal axis represents the surface concentration of the p⁻ low-concentration region 17, and the vertical axis represents the ON-state voltage at the current density Jc of 20 A/cm². The measurements were made at room temperature. As is understood from FIG. 33, the ON-state voltage is increased when the surface concentration of the p⁻ low-concentration regions 17 is in a relatively high region. This is because the p⁻ low-concentration regions 17 of the p channel MOS transistors UT2 and UT3 are not completely depleted even when the gate potential is 15V higher than the emitter potential, and, consequently, the base currents supplied to the p base regions 4, 4a of the npn transistors BT1 and BT2 do not flow into the $n^+$ emitter regions 7, 7a, but flow into the $p^+$ drain regions 5, 5a through the $p^-$ low-concentration regions 17, to be drained through the drain electrodes 11, 11a, thereby restricting the operation of the bipolar transistors.

It will be understood from FIG. 32 and FIG. 33 that the surface concentration of the $p^-$ low-concentration regions 17 is desirably controlled to within the range of $1\times10^{14}$ to $1\times10^{19}$ cm$^{-3}$.

Needless to say, the concept of forming the p channel MOS transistors as depletion-type MOS transistors is not limited to the two-stage Darlington configuration of the present embodiment, but may be equally applied to other configurations.

Embodiment 9

Figure 34:
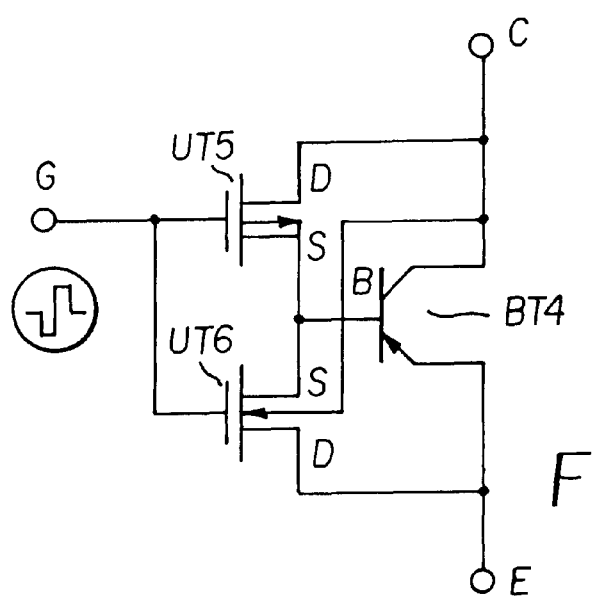
FIG. 34 is a circuit diagram showing an equivalent circuit of a semiconductor device according to the ninth embodiment of the present invention.

FIG. 34 is a circuit diagram showing an equivalent circuit of a semiconductor device according to the ninth embodiment of the present invention. In this embodiment, the bipolar transistor in the output stage of the device is provided by a pnp transistor BT4, and the drain and source of a p channel MOS transistor UT5 are connected between the collector C and base B of the pnp transistor BT4, while the drain and source of a p channel MOS transistor UT6 are connected between the emitter E and base B of the transistor BT4. The p channel MOS transistor UT5 and n channel MOS transistor UT6 have a common gate, which is connected to the G terminal.

In the operation of the semiconductor device, when a negative input signal is applied to the gate G while a voltage is being applied between the collector C and the emitter E, the p channel MOS transistor UT5 is turned on, and the pnp transistor BT4 is turned on. Upon application of the negative input signal to the gate G, however, the n channel MOS transistor UT6 is not turned on. If a positive input signal is then applied to the gate G, the p channel MOS transistor UT5 is turned off, and the pnp transistor BT4 is turned off. At this time, the n channel MOS transistor UT6 is turned on.

The operation of this semiconductor device is basically similar to that of the semiconductor device of the first embodiment except for the polarity of signals. Thus, the semiconductor device exhibits low ON resistance since the pnp transistor BT4 as a bipolar transistor is turned on upon turn-on of the device. Upon turn-off of the device, the n channel MOS transistor UT6 is turned on, so that an excessive amount of carriers present in the pnp transistor BT4 can be drawn away from the transistor BT4, whereby the storage time can be reduced, and the device is able to perform high-speed operations.

It is to be understood that the bipolar transistor as described above may be formed in the Darlington configuration.

Embodiment 10

Figure 35:
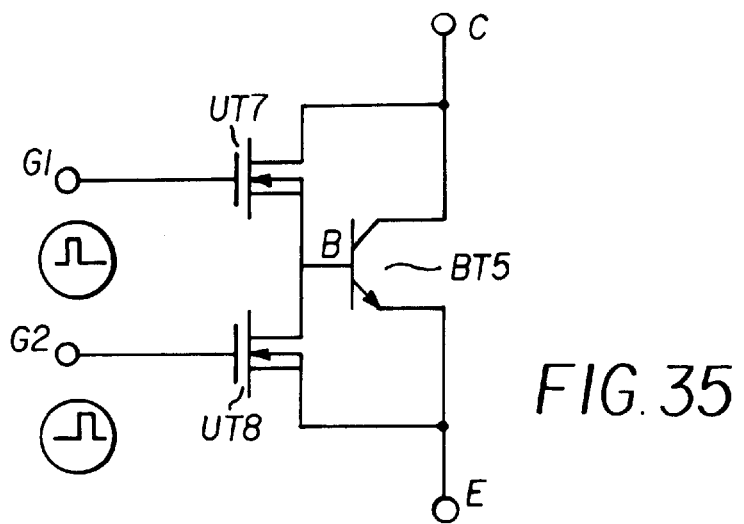
FIG. 35 is a circuit diagram showing an equivalent circuit of a semiconductor device according to the tenth embodiment of the present invention.

FIG. 35 is a circuit diagram showing an equivalent circuit of a semiconductor device according to the tenth embodiment of the present invention. In this embodiment, the bipolar transistor in the output stage of the circuit is provided by an npn transistor B5, and the drain and source of an n channel MOS transistor UT7 are connected between the collector C and base B of the npn transistor BT5, while the drain and source of an n channel MOS transistor UT8 are connected between the base B and emitter E of the npn transistor BT5. The n channel MOS transistors UT7 and UT8 include individual gates which provide G1 terminal and G2 terminal, respectively. Namely, each of the MOS transistors is of the same type as a known n channel type MOS transistor, and the gates of these transistors are provided independently of each other, unlike the previous embodiments.

In the operation of this semiconductor device, when a positive input signal is applied to the gate G1 while a voltage is being applied between the collector C and the emitter E, the n channel MOS transistor UT7 is turned on, and the npn transistor BT5 is turned on. If the positive input signal to the gate G1 is then turned off or removed, the n channel MOS transistor UT7 is turned off, and the npn transistor BT5 is turned off. At this time, the n channel MOS transistor UT8 is turned on upon application of a positive input signal to the gate G2.

The operation of this semiconductor device is basically similar to that of the semiconductor device of the first embodiment, except that the gates of the n channel MOS transistors UT7, UT8 operate independently of each other. Thus, the semiconductor device exhibits low ON resistance since the npn transistor BT5 as a bipolar transistor is turned on upon turn-on of the device. Upon turn-off of the device, the n channel MOS transistor UT8 is turned on, so that an excessive amount of carriers present in the npn transistor BT5 can be removed or withdrawn, whereby the storage time can be reduced, and the device is able to perform high-speed operations.

In the above arrangement, two gates are needed for the respective MOS transistors UT7, UT8, but the provision of the two gates is advantageous in that signals having only one polarity are required to be applied to the semiconductor device.

Although the basic structure is integrated on the same semiconductor substrate in the illustrated embodiments, it is needless to say that the same effects as described above may be provided even where the basic structure is developed in various manners, or individual or discrete elements are combined or connected by wires in various manners. While MOS transistors are used as unipolar transistors in the illustrated embodiments, the unipolar transistors may be provided by junction-type field-effect transistors, or other types of unipolar transistors.

Embodiment 11

Figure 36:
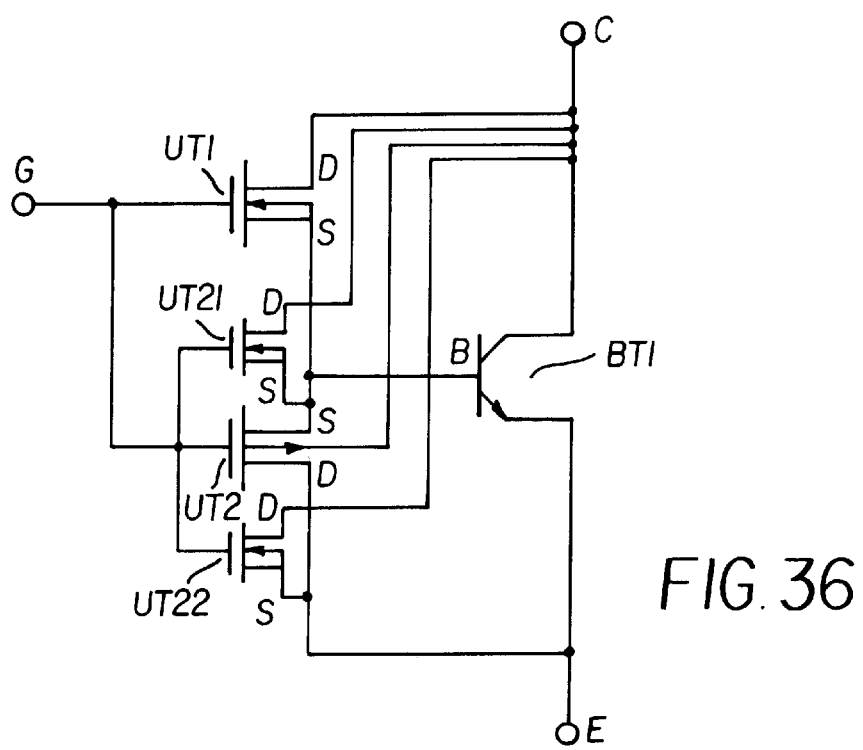
FIG. 36 is a circuit diagram showing an equivalent circuit of a semiconductor device according to the eleventh embodiment of the present invention.

FIG. 36 shows an equivalent circuit of a semiconductor device according to the eleventh embodiment of the present invention. In this circuit, the drain and source of an n channel MOS transistor UT1 is connected between the collector C and base B of an npn transistor BT1, and the drain and source of a p channel MOS transistor UT2 are connected between the emitter E and base B of the npn transistor BT1. The n channel MOS transistor UT1, and p channel MOS transistor UT2 have a common gate that is connected to the G terminal of the device.

The equivalent circuit of FIG. 36 is different from that of FIG. 1 in that an n channel MOS transistor UT21 is connected between the collector C of the npn transistor BT1 and the source of the p channel MOS transistor UT2, and an n channel MOS transistor UT22 is connected between the collector C and the drain of the p channel MOS transistor UT2.

Figure 37:
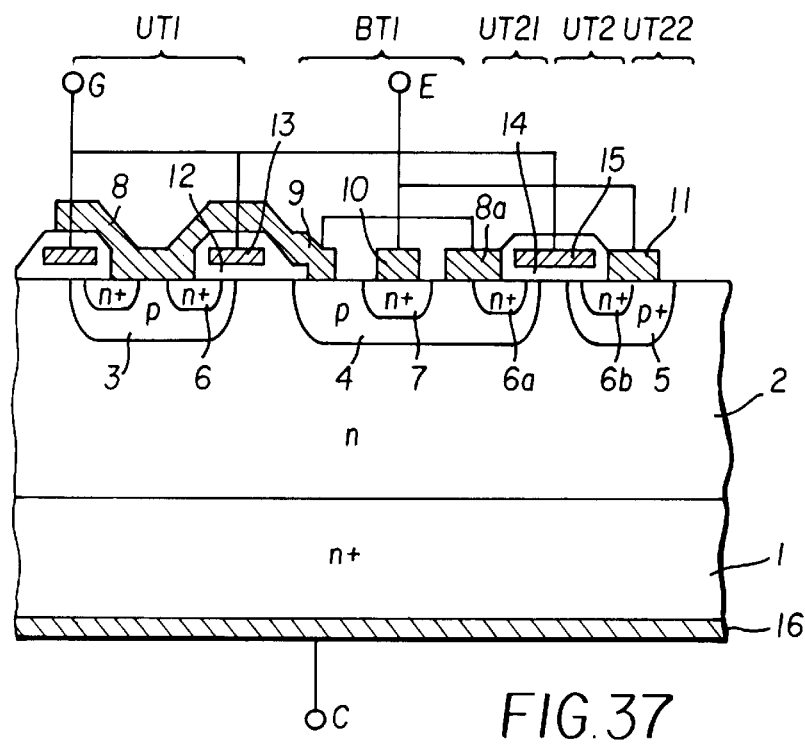
FIG. 37 is a cross-sectional view showing a part of the semiconductor device of the eleventh embodiment.

FIG. 37 is a cross-sectional view of a part of a monolithic semiconductor device that realizes the equivalent circuit of FIG. 36. The n-channel MOS transistor UT1 as the first unipolar transistor, npn transistor BT1, n channel MOS transistor UT21, p channel MOS transistor UT2, and the n channel MOS transistor UT22 are located in this order from the left-hand side to the right-hand side in FIG. 37. Only basic portions of these transistors are shown in FIG. 37, and other portions, including a peripheral portion of the device that serves to withstand high voltage, are not illustrated since such portions are not substantially related to the principle of the present invention.

In the semiconductor device of FIG. 37, an n drift layer 2 having a high resistivity is laminated on an $n^{30}$ collector layer 1 having a low resistivity, to provide a semiconductor substrate. An example of the semiconductor device of the eleventh embodiment having a breakdown voltage of about 1600V uses an epitaxial wafer as the substrate, which is formed by laminating an n drift layer 2 having a resistivity of 50 Ω·cm and a thickness of 80 μm on an $n^+$ collector layer 1 having a resistivity of 0.004 Ω·m and a thickness of 250 μm. A p well region 3 of the n channel MOS transistor UT1, p base region 4 of the npn transistor BT1, and a $p^+$ drain region 5 of the p channel MOS transistor UT2 are formed in a surface layer of the n drift layer 2. An $n^+$ source region 6 is formed in the p well region 3, and an $n^+$ emitter region 7 and an $n^+$ auxiliary source region 6a are formed in the p base region 4, while an $n^+$ auxiliary source region 6b is formed on the $p^+$ drain region 5. For example, the diffusion depth of the p well region 3, p base region 4 and the $p^+$ drain region 6 is 5 μm, and the diffusion depths of the $n^+$ source region 6, $n^+$ auxiliary source region 6a and the $n^+$ auxiliary source region 6b is 0.3 μm, while the diffusion depth of the $n^+$ emitter region 7 is 2.5 μm. These values of the diffusion depth of the $n^+$ source region 6, $n^+$ auxiliary source region 6a, $n^+$ auxiliary source region 6b and $n^+$ emitter region 7 were determined by experiments which will be described later.

The semiconductor device of the present embodiment further includes a source electrode 8 formed in contact with both surfaces of the $n^+$ source region 6 and p base region 3, an emitter electrode 10 formed in contact with the surface of the $n^+$ emitter region 7, an auxiliary source electrode 8a formed in contact with both surfaces of the $n^+$ auxiliary source region 6a and p base region 4, and a drain electrode 11 formed in contact with both surfaces of the $p^+$ drain region 5 and $n^+$ auxiliary source region 6b.

Also, a gate electrode layer 13 of the p channel MOS transistor UT1 is formed on a gate oxide film 12, over the surface of the p well region 3 interposed between the $n^+$ source region 6 and the exposed surface portion of the n drift layer 2. A gate electrode layer 15 of the p channel MOS transistor UT2 is formed on a gate oxide film 14, over the surface of the n drift layer 2 interposed between the p base region 4 and the $p^+$ drain region 5.

By forming the $n^+$ auxiliary source regions 6a, 6b in the p base region 4 and $p^+$ drain region 5, respectively, which serve as a source region of the p channel MOS transistor UT2, an n channel MOS transistor UT21 composed of the $n^+$ auxiliary source region 6a, p base region 4 and the n drift layer 2, and an n channel MOS transistor UT22 composed of the $n^+$ auxiliary source region 6b, $p^+$ drain region 5 and the n drift layer 2 are provided The gate electrode layer 15 also serves as a gate electrode layer for the n channel MOS transistors UT21, UT22. The gate electrode layers 13, 15 are formed from, for example, polycrystalline silicon (polysilicon) films, and connected to the G terminal, through a gate electrode in the form of a metallic layer that is provided in contact with the electrode layers 13, 15. As shown in the figure, the source electrode 8 may be extended over the gate electrode layer 13 with an insulating film 20 interposed therebetween, and formed integrally with the base electrode 9 provided on the surface of the p base region 4. The auxiliary source electrode 8a formed in contact with both surfaces of the $n^+$ auxiliary source region 6a and p base region 4 is connected to the base electrode 9. The emitter electrode 10 formed on the surface of the $n^+$ emitter region 7 and the drain electrode 11 formed on the surface of the $p^+$ drain region 5 are connected together, to the E terminal. These electrodes may be formed by sputtering an aluminum alloy by vapor deposition, and pattering the alloy film by photolithography, for example. A collector electrode 16 is formed on the rear surface of the $n^+$ collector layer 1, and connected to a C terminal.

The semiconductor device of the eleventh embodiment may be produced by a process similar to a conventional process for producing a double diffusion MOS transistor.

The operations of the semiconductor device of the eleventh embodiment will be now described in more detail. When a positive voltage that is equal to or greater than a threshold value is applied to the gate terminal G while the emitter terminal E is grounded and a positive voltage is being applied to the collector terminal C, the n channel MOS transistor UT1 is turned on, and base current is supplied to the base electrode 9 of the npn transistor BT1, so that the npn transistor BT1 is turned on. In particular, the diffusion depth of the $n^+$ source region 7 of the npn transistor BT1 is made larger than that of the $n^+$ source region 6 of the n channel MOS transistor UT1, so as to increase the current amplification factor, and reduce the ON resistance. Upon application of a positive input signal to the gate terminal G, however, the p channel MOS transistor UT2 is not turned on.

To turn off the semiconductor device, the potential of the gate terminal G is lowered to be equal to or lower than the threshold value of the n channel MOS transistor UT1. As a result, the n channel MOS transistor UT1 is turned off. Then, supply of the base current to the npn transistor BT1 is stopped, and the npn transistor BT1 is turned off. By further applying negative voltage to the gate terminal G, an inversion layer is formed in the surface layer of the n drift layer 2 between the p base region 4 (that serves as the p source region of the p channel MOS transistor UT2) and the $p^+$ drain region 5, and the p channel MOS transistor UT2 is turned on. As a result, an excessive amount of holes that remain in the p base region 4 are withdrawn or removed through the inversion layer, and therefore the device can be rapidly turned off, thus enabling high-speed operations.

While the basic operations as described above are similar to those of the semiconductor device of FIG. 1, the use of the n channel MOS transistors UT21, UT22 incorporated in the p channel MOS transistor UT2 provides the following effects.

The n channel MOS transistor UT21, which is connected between the collector and base of the npn transistor BT1, is in parallel with the n channel MOS transistor UT1 as a vertical MOS transistor. Accordingly, the n channel MOS transistor UT21 serves to supply base current to the npn transistor BT1, in addition to that supplied by the n channel MOS transistor UT1, whereby larger base current than that of the circuit of FIG. 1 can be supplied to the npn transistor BT1.

The n channel MOS transistor UT22 is connected between the collector and emitter of the npn transistor BT1. Thus, the npn transistor BT1 and the n channel MOS transistor UT22 are in parallel with each other.

While a negative voltage is applied to the gate terminal in the OFF state of the device, the p channel MOS transistor UT2 operates without any problem, even with the n⁺ auxiliary source regions 6a, 6b incorporated in the transistor UT2, and the base current of the npn transistor BT1 is drawn away or discharged into the emitter.

Figure 38:
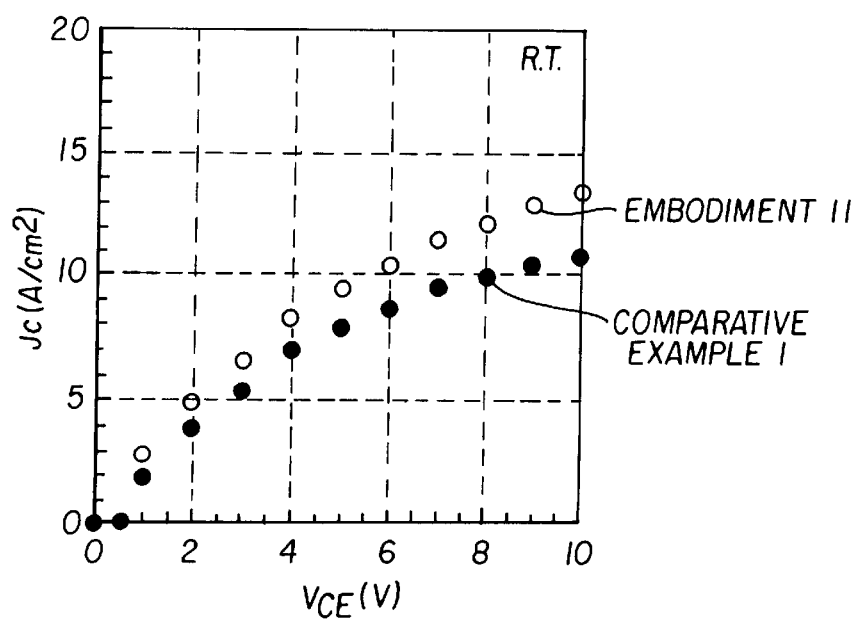
FIG. 38 is a graph showing current-voltage characteristics of the semiconductor device of the eleventh embodiment and Comparative Example 1.

FIG. 38 is a graph showing a current-voltage characteristic of the semiconductor device of the eleventh embodiment, wherein the horizontal axis represents the voltage, and the vertical axis represents the current density. For comparison, the current-voltage characteristic of the semiconductor device (Comparative Example 1) that realizes the equivalent circuit of FIG. 1 is also shown in FIG. 38. TABLE 1 below lists the ON-state voltage at a current density of 5 A/cm² for comparison between the present embodiment and Comparative Example 1.

TABLE 1

|  | ON-state voltage (V) (at 5A/cm²) |
| --- | --- |
| Embodiment 11 | 2.0 |
| Comparative Example 1 | 2.5 |

It will be understood from TABLE 1 that the semiconductor device of the eleventh embodiment shows lower ON-state voltage. This is mainly because the n channel MOS transistor UT1 cooperates with the n channel MOS transistor UT21 provided in parallel with the transistor UT1, to supply large base current to the npn transistor BT1. Although not apparent from the graph of FIG. 38, the n channel MOS transistor UT22 provided in parallel with the bipolar transistor BT1 contributes to a reduction in the ON-state voltage in a relatively low current density region.

Embodiment 12

Figure 39:
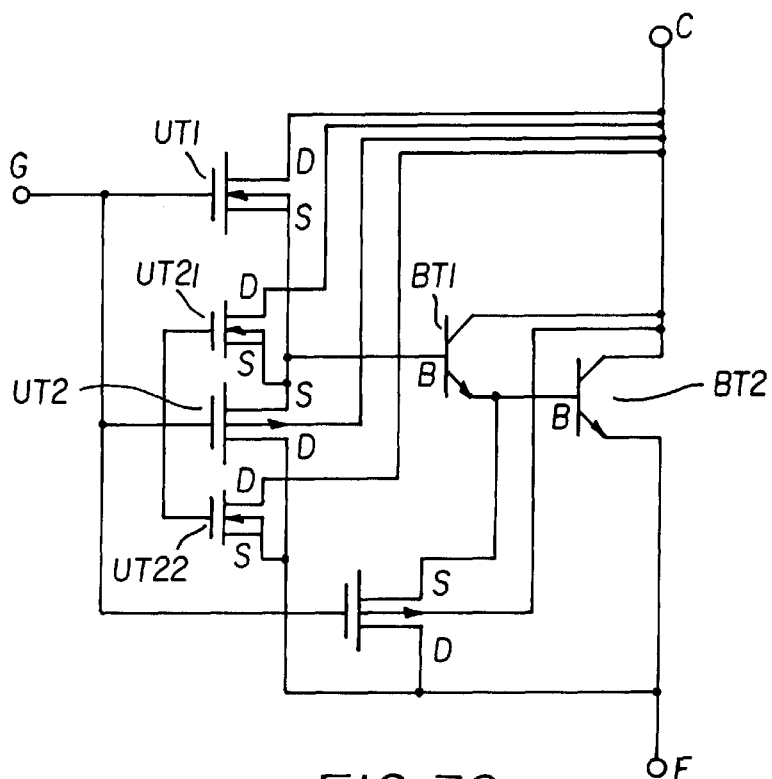
FIG. 39 is a graph showing a circuit diagram showing an equivalent circuit of a semiconductor device according to the twelfth embodiment of the present invention.

FIG. 39 is a circuit diagram showing an equivalent circuit of a semiconductor device according to the twelfth embodiment of the present invention. The bipolar transistor in the output stage consists of two npn transistors BT1 and BT2 that are connected in the Darlington configuration. In this circuit, the drain and source of the n channel MOS transistor UT1 are connected between the collector C and base B of the first-stage npn transistor BT1. Also, the drain and source of the p channel MOS transistor UT2 are connected between the base B of the first-stage npn transistor BT1 and the emitter E of the second-stage npn transistor BT2, and the source and drain of a p channel MOS transistor UT3 are connected between the base B and emitter E of the second-stage npn transistor BT2. The n channel MOS transistor UT1 and the p channel MOS transistors UT2 and UT3 have a common gate, which is connected to the G terminal. Namely, each of the p channel MOS transistors UT2, UT3 is connected between the base B of a corresponding one of the two-stage Darlington-connected npn transistors BT1, BT2, and the emitter E of the latter-stage npn transistor BT2.

The equivalent circuit of FIG. 39 is different from that of FIG. 7 in that an n channel MOS transistor UT21 is connected between the collector terminal C of the device and the source of the p channel MOS transistor UT2, and an n channel MOS transistor UT22 is connected between the collector terminal C and the drain of the p channel MOS transistor UT2.

Figure 40:
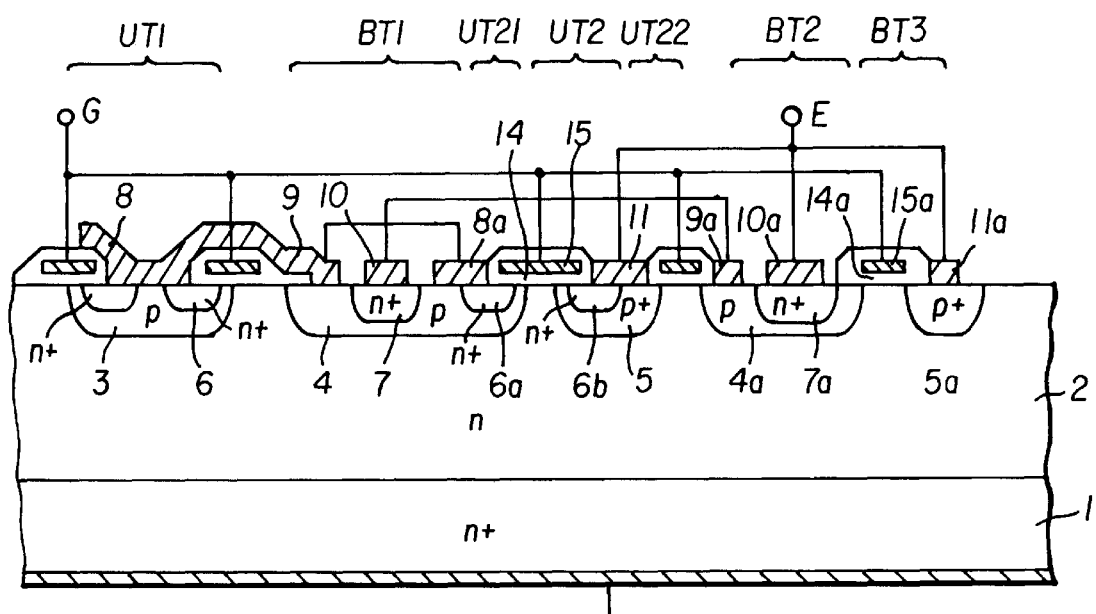
FIG. 40 is a cross-sectional view showing a part of the semiconductor device of the twelfth embodiment.

FIG. 40 is a cross-sectional view showing a part of a monolithic semiconductor device which realizes the equivalent circuit of FIG. 39. In FIG. 40, the n channel MOS transistor UT1 as the first unipolar transistor, npn transistor BT1, n channel MOS transistor UT21, p channel MOS transistor UT2, n channel MOS transistor UT22, npn transistor BT2, and p channel MOS transistor UT3 are located in this order as viewed from the left-hand side to the right-hand side of the figure.

As compared with the semiconductor device of the eleventh embodiment, the second-stage npn transistor BT2 and the p channel MOS transistor UT3 are newly added. Namely, in addition to the structure of FIG. 37, a p base region 4a and an n⁺ emitter region 7a of the second-stage npn transistor BT2 are additionally formed in the surface layer of the n drift layer 2, and a base electrode 9a and an emitter electrode 10a are provided. Also, a p⁺ drain region 5a and a drain electrode 11a of the p channel MOS transistor UT3 are added. A gate electrode layer 15a is formed on a gate insulating film 14a, over the surface of the n drift layer 2 interposed between the p base region 4a and the p⁺ drain region 5a, and is connected to the G terminal.

The first-stage npn transistor BT1 serves to supply base current to the second-stage npn transistor BT2, and therefore its area may be smaller than that of the second-stage npn transistor BT2. Also, since the first-stage p channel MOS transistor UT2 and the second-stage p channel MOS transistor UT3 serve to discharge carriers from the first-stage npn transistor BT1 and the second-stage npn transistor BT2, respectively, upon turn-off of the semiconductor device, the area of the second-stage p channel MOS transistor UT3 is made larger than that of the first-stage p channel MOS transistor UT2.

In the operations of the semiconductor device of the twelfth embodiment as described above, when a positive signal that is equal to or greater than a threshold value is applied to the gate terminal G while an emitter terminal E is grounded and a positive voltage is being to the collector terminal C, the n channel MOS transistor UT1 is turned on, and the base current is supplied to the base electrode 9 of the npn transistor BT1 so that the npn transistor BT1 is turned on. The collector current of the npn transistor BT1 is then supplied to the base electrode 9a of the npn transistor BT2, so that the npn transistor BT2 is turned on. Thus, the semiconductor device of the present embodiment undergoes conductivity modulation upon turn-on, and thus provides low ON resistance. Since large base current is supplied to the second-stage npn transistor BT2, the ON-state voltage is further lowered as compared with that of the eleventh embodiment. In particular, the diffusion depth of the n⁺ emitter region 7 of the npn transistor BT1 is made larger than the n⁺ source region 6 of the n channel MOS transistor UT1, so as to increase the current amplification factor, and thus reduce the ON resistance. Upon application of a positive input signal to the gate terminal G, however, the p channel MOS transistor UT2 is not turned on.

To turn off the semiconductor device, the potential of the gate terminal G is lowered to be equal to or lower than the threshold value of the n channel MOS transistor UT1. As a result, the n channel MOS transistor UT1 is turned off. Then, supply of the base current to the npn transistor BT1 is stopped, and the npn transistor BT1 is turned off. By further applying negative voltage to the gate terminal G, inversion layers appear in portions of the surface layer of the n drift layer 2 between the p base region 4 (that serves as the p source region of the p channel MOS transistor UT2) and the p⁺ drain region 5, and between the p base region 4a and the p⁺ drain region 5a, and the p channel MOS transistors UT2, UT3 are turned on. As a result, an excessive amount of holes that remain in the p base regions 4, 4a are withdrawn or discharged into the drain electrodes 11, 11a through the inversion layers, and therefore the device is rapidly turned off, thus permitting high-speed operations.

In the present embodiment in which the second bipolar transistor is added and connected to the first bipolar transistor to provide the Darlington configuration, the base current of the latter-stage bipolar transistor is increased, with the result of reduction in the ON-state voltage. Also, with the p channel MOS transistors connected to the respective bipolar transistors, the turn-off storage time is not increased even with the increase in the number of bipolar transistors, thus allowing high-speed switching operations.

While the basic operations as described above are similar to those of the semiconductor device of FIG. 7, the use of the n channel MOS transistors UT21, UT22 incorporated in the p channel MOS transistor UT2 provides the following effects.

The n channel MOS transistor UT21, which is connected between the collector and base of the npn transistor, is in parallel with the n channel MOS transistor UT1. Accordingly, the n channel MOS transistor UT21 serves to supply base current to the npn transistor BT1, in addition to that supplied by the n channel MOS transistor UT1, whereby larger base current than that of the circuit of FIG. 7 can be supplied to the npn transistor BT1.

The n channel MOS transistor UT22 is connected between the collector and emitter of the npn transistor BT1. Thus, the npn transistor BT1 and the n channel MOS transistor UT22 are in parallel with each other.

Figure 41:
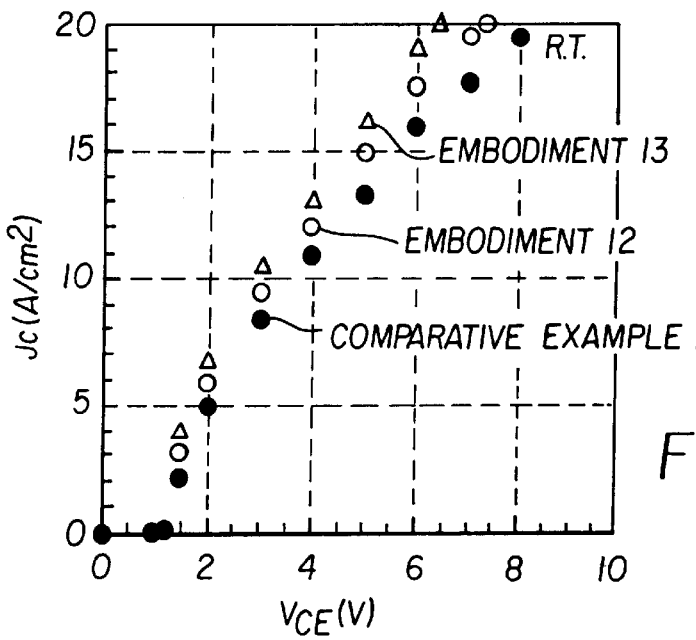
FIG. 41 is a view showing current-voltage characteristics of the semiconductor devices of the twelfth and thirteenth embodiments and Comparative Example 2.

FIG. 41 is a graph showing a current-voltage characteristic of the semiconductor device of the twelfth embodiment and that of the semiconductor device of FIG. 7 (Comparative Example 2). It will be understood from FIG. 41 that the semiconductor device of the twelfth embodiment shows lower ON-state voltage. This is mainly because the n channel MOS transistor UT1 cooperates with the n channel MOS transistor UT21 provided in parallel with the transistor UT1, to supply large base current to the npn transistor BT1.

Embodiment 13

Figure 42:
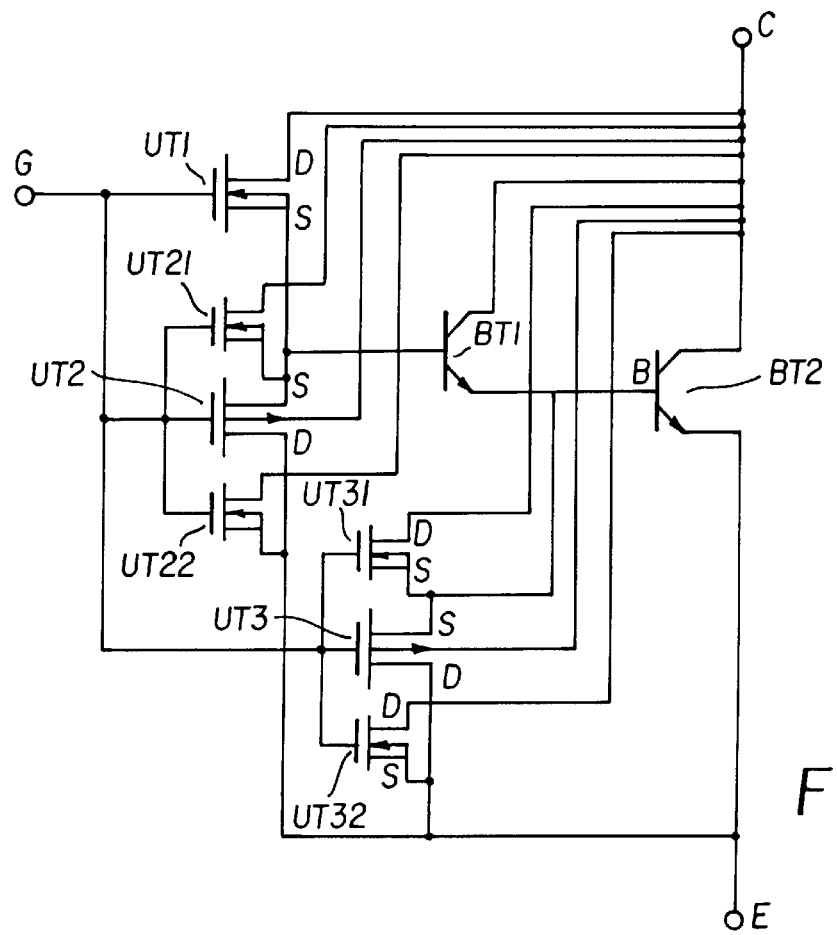
FIG. 42 is a circuit diagram showing an equivalent circuit of a semiconductor device according to the thirteenth embodiment of the present invention.

FIG. 42 is a circuit diagram of an equivalent circuit of a semiconductor device according to the thirteenth embodiment of the present invention. As in the twelfth embodiment, the bipolar transistor in the output stage consists of two npn transistors BT1, BT2 that are connected in the Darlington configuration. The equivalent circuit of FIG. 42 is different from that of FIG. 39 in that an n channel MOS transistor UT31 is connected between the collector terminal C and the source of the second-stage p channel MOS transistor UT3, and an n channel MOS transistor UT32 is connected between the collector terminal C and the drain of the p channel MOS transistor UT3.

Figure 43:
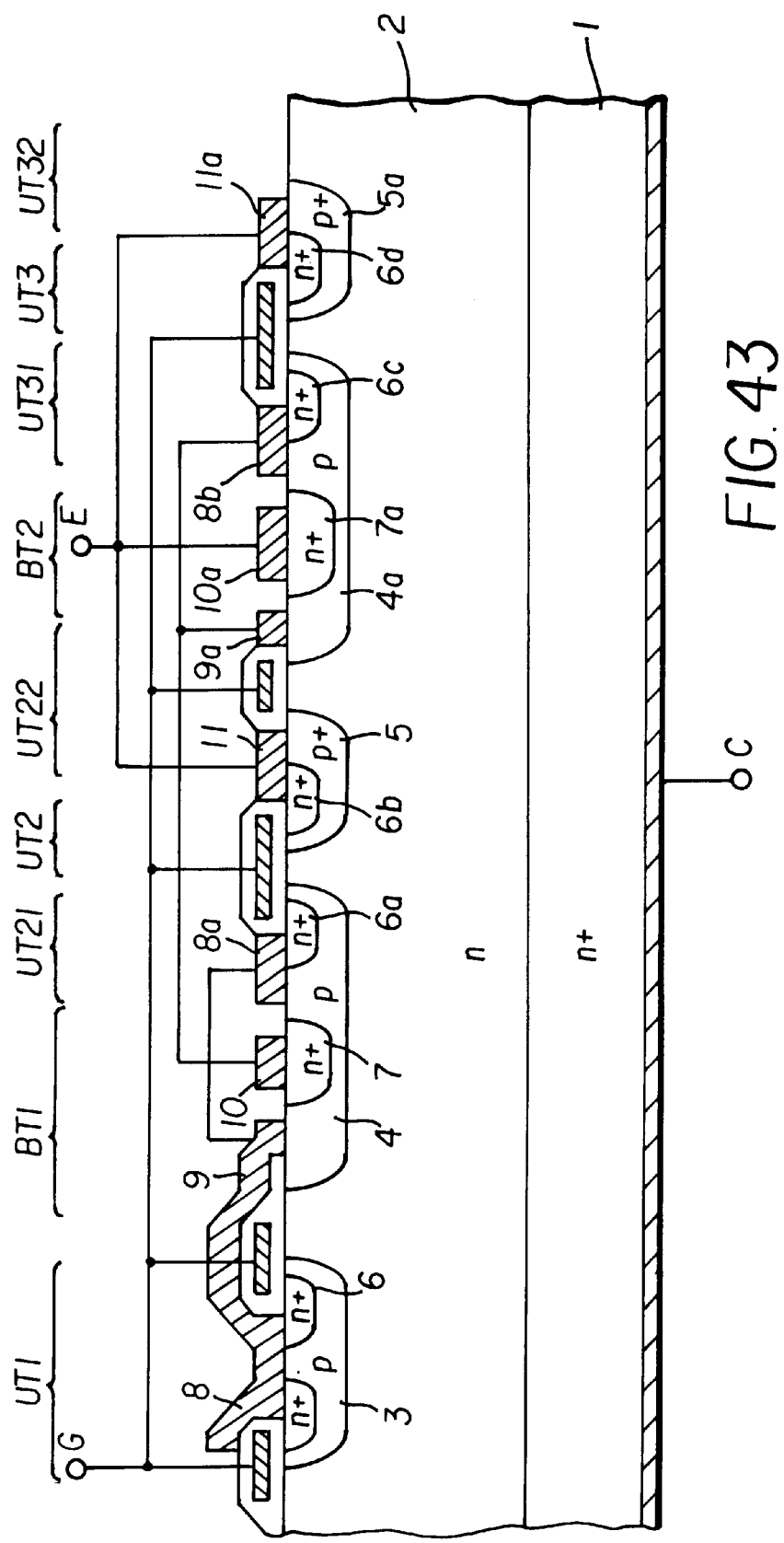
FIG. 43 is a cross-sectional view showing a part of the semiconductor device of the thirteenth embodiment.

FIG. 43 is a cross-sectional view showing a part of a monolithic semiconductor device that realizes the equivalent circuit of FIG. 42. In FIG. 43, the n channel MOS transistor UT1 as the first unipolar transistor, npn transistor BT1, n channel MOS transistor UT21, p channel MOS transistor UT2, n channel MOS transistor UT22, npn transistor BT2, n channel MOS transistor UT31, p channel MOS transistor UT3, and the n channel MOS transistor are located in this order as viewed from the left-hand side to the right-hand side of the figure.

In addition to the structure of FIG. 40, an $n^+$ auxiliary source region $6c$ is formed in the p base region $4a$ of the second-stage npn transistor BT2 that serves as the source region of the second-stage p channel MOS transistor UT3, and an $n^+$ auxiliary source region $6d$ is formed in the $p^+$ drain region $5a$, while an auxiliary source electrode $8b$ is provided.

While the basic operations of the semiconductor device of the present embodiment are similar to those of the twelfth embodiment, the use of the n channel MOS transistors UT31, UT32 incorporated in the p channel MOS transistor UT3 provides the following effects.

The n channel MOS transistor UT31 cooperates with the first-stage npn transistor BT1 to supply base current to the second-stage npn transistor BT2. The n channel MOS transistor UT32 is connected in parallel with the npn transistor BT2 in the latter stage.

FIG. 41 also shows a current-voltage characteristic of the semiconductor device of the thirteenth embodiment. It will be understood from FIG. 41 that the ON-state voltage of the present embodiment is further lowered as compared with that of the twelfth embodiment. This is mainly due to a difference in the magnitude of the base current of the last-stage pnp transistor BT2.

TABLE 2 below lists the ON-state voltage of the semiconductor devices of the twelfth and thirteenth embodiments and Comparative Example 2, when measured at a current density of 5 A/cm$^2$ and 20 A/cm$^2$.

TABLE 2

|  | ON-state Voltage (V) at 5A/cm$^2$ | ON-state voltage (V) at 20A/cm$^2$ |
| --- | --- | --- |
| Embodiment 12 | 1.8 | 7.3 |
| Embodiment 13 | 1.7 | 6.4 |
| Comparative Example 2 | 2.0 | 8.1 |

It will be understood from TABLE 2 that the semiconductor devices of the twelfth and thirteenth embodiments show lower ON-state voltage than that of Comparative Example 2. While only a small difference in the ON-state voltage is observed between the twelfth and thirteenth embodiments when measured at the lower current density, the difference becomes larger at the higher current density, namely, the ON-state voltage of the thirteenth embodiment is much lower than that of the twelfth embodiment.

Embodiment 14

Figure 44:
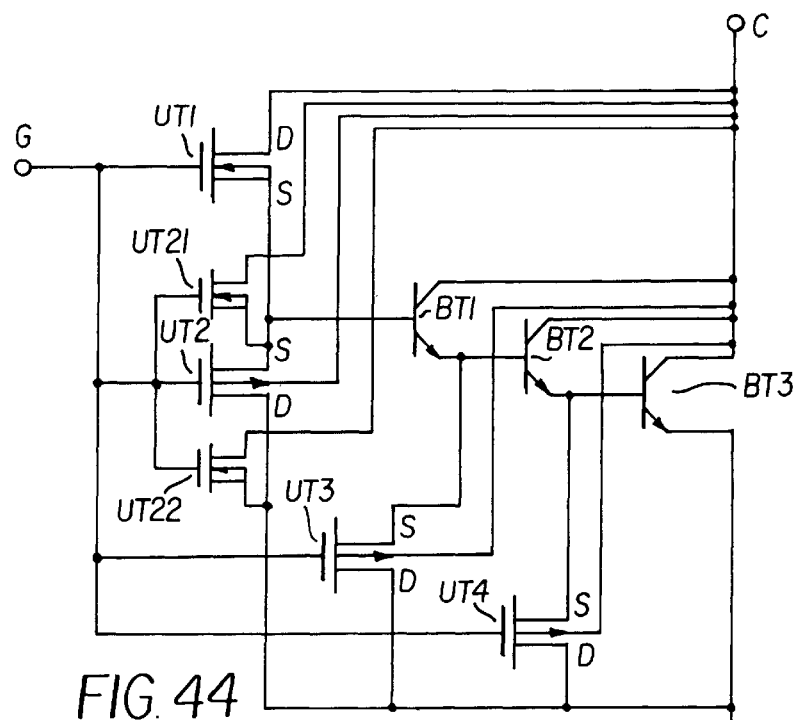
FIG. 44 is a circuit diagram showing an equivalent circuit of a semiconductor device according to the fourteenth embodiment of the present invention.

FIG. 44 is a circuit diagram showing an equivalent circuit of a semiconductor device according to the fourteenth embodiment of the present invention. The bipolar transistor in the output stage of this circuit is in the form of a three-stage Darlington-connected transistor consisting of three npn transistors BT1, BT2, BT3. In this circuit, the drain and source of the n channel MOS transistor UT1 are connected between the collector C and base B of the first-stage npn transistor BT1, and the source and drain of the p channel MOS transistor UT2 are connected between the base B of the first-stage npn transistor BT1 and the emitter E of the third-stage npn transistor BT3. Also, the source and drain of the p channel MOS transistor UT3 are connected between the base B of the second-stage npn transistor BT2 and the emitter E of the third-stage npn transistor BT3, and the source and drain of the p channel MOS transistor UT4 are connected between the base B and emitter E of the third-stage npn transistor BT3. The n channel MOS transistor UT1 and the p channel MOS transistors UT2, UT3, UT4 have a common gate, which is connected to the G terminal. Namely, each of the p channel MOS transistors UT2, UT3, UT4 is connected between the base of a corresponding one of the three npn transistors BT1, BT2, BT3 that are connected in the Darlington connection, and the emitter E of the npn transistor BT3 in the last stage.

The equivalent circuit of FIG. 44 is difference from that of FIG. 11 in that an n channel MOS transistor UT21 is connected between the collector terminal C and the source of the p channel MOS transistor UT2, and an n channel MOS transistor UT22 is connected between the collector terminal C and the drain of the p channel MOS transistor UT2.

To provide a monolithic semiconductor device that realizes the equivalent circuit of FIG. 44, the structure shown in the cross-sectional view of FIG. 40 further includes a p base region of the npn transistor BT3 that is formed in the surface layer of the n drift layer 2, an $n^+$ emitter region formed within the p base region, an emitter electrode, a $p^+$ drain region of the p channel transistor UT4, and a gate structure, which are suitably connected to each other.

Since the first-stage npn transistor BT1 serves to supply base current to the second-stage npn transistor BT2, and the second-stage npn transistor BT2 serves to supply base current to the third-stage npn transistor BT3, the area of the first-stage npn transistor BT1 may be smaller than that of the second-stage npn transistor BT2, and the area of the second-stage npn transistor BT2 may be smaller than that of the third-stage npn transistor BT3. Also, the first-stage, second-stage and third-stage p channel MOS transistors UT2, UT3 and UT4 serve to discharge carriers from the first-stage, second-stage and third-stage npn transistors BT1, BT2 and BT3, respectively, upon turn-off of the device, and therefore the area of the third-stage p channel MOS transistor UT4 is made larger than that of the second-stage p channel MOS transistor UT3, and the area of the second-stage p channel MOS transistor UT3 is made larger than that of the first-stage p channel MOS transistor UT2.

As the number of the bipolar transistors increases, the base current of the bipolar npn transistor in the latter stage increases, and thus the ON-state voltage is reduced. By connecting the p channel MOS transistors to the respective bipolar transistors, the storage time upon turn-off of the device will not increase even with the increase in the number of bipolar transistors, thus assuring high-speed switching of the device.

Figure 47:
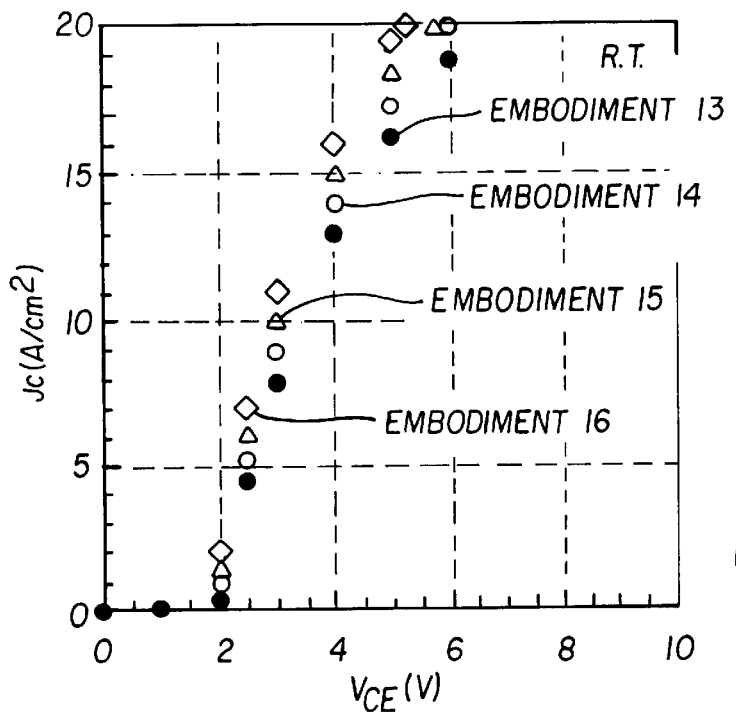
FIG. 47 is a graph showing current-voltage characteristics of the semiconductor devices of the fourteenth, fifteenth and sixteenth embodiments and Comparative Example 3.

FIG. 47 is a graph showing a current-voltage characteristic of the semiconductor device of the fourteenth embodiment, and that of the semiconductor device of FIG. 11 (Comparative Example 3). It will be understood from FIG. 47 that the semiconductor device of the fourteenth embodiment shows lower ON-state voltage. This is due to the same mechanisms as seen in the semiconductor devices of the eleventh and twelfth embodiments.

Embodiment 15

Figure 45:
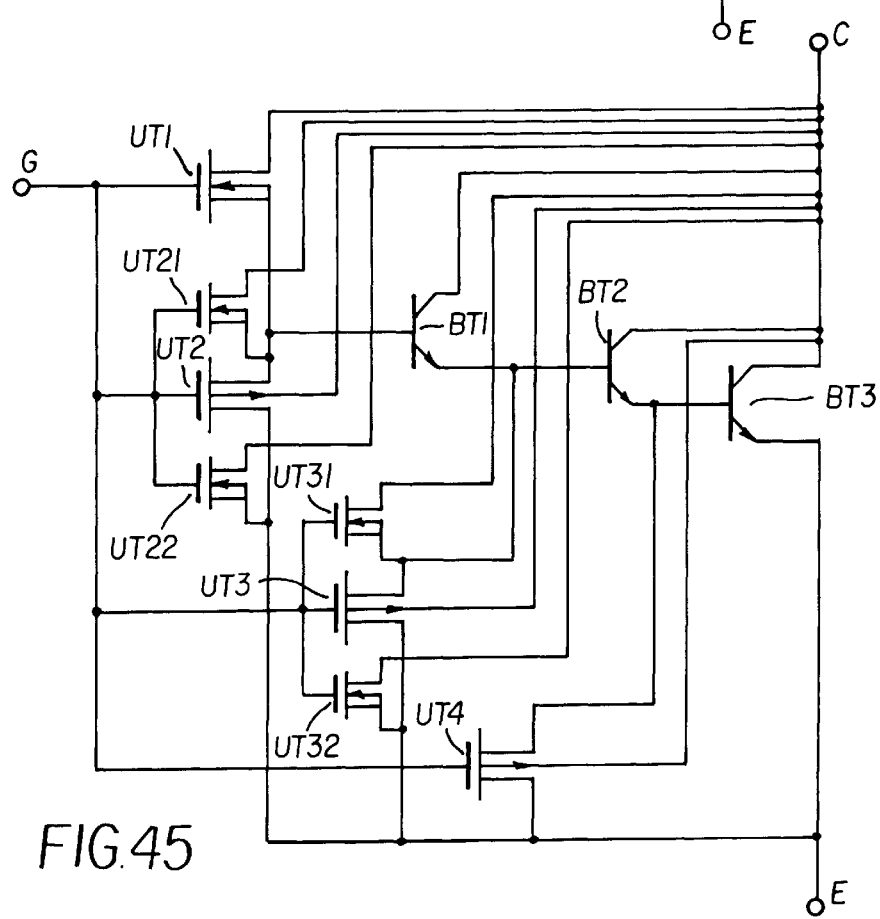
FIG. 45 is a circuit diagram showing an equivalent circuit of a semiconductor device according to the fifteenth embodiment of the present invention.

FIG. 45 is a circuit diagram of an equivalent circuit of a semiconductor device according to the fifteenth embodiment of the present invention. The bipolar transistor in the output stage is in the form of a three-stage Darlington transistor consisting of npn transistors BT1, BT2 and BT3, as in the fourteenth embodiment. The equivalent circuit of FIG. 45 is different from that of FIG. 44 in that an n channel MOS transistors UT31 is connected between the collector C and the source of the second-stage p channel MOS transistor UT3, and an n channel MOS transistor UT32 is connected between the collector terminal C and the drain of the p channel MOS transistor UT3.

To provide a monolithic semiconductor device that realizes the equivalent circuit of FIG. 45, the structure shown in the cross-sectional view of FIG. 43 further includes a p base region of the npn transistor BT3 that is formed in the surface layer of the n drift layer 2, an $n^+$ emitter region formed within the p base region, an emitter electrode, a $p^+$ drain region of the p channel transistor UT4, and a gate structure, which are suitably connected to each other.

FIG. 47 also shows a current-voltage characteristic of the semiconductor device of the fifteenth embodiment. It will be understood from FIG. 47 that the ON-state voltage of the fifteenth embodiment provides further reduced ON-state voltage as compared with that of the fourteenth embodiment. This is not only because the base current of the pnp transistor BT1 is increased as in the fourteenth embodiment, but also because the current from the n channel MOS transistor UT3 1, as well as the emitter current of the transistor BT1, is supplied as base current to the pnp transistor BT2.

Embodiment 16

Figure 46:
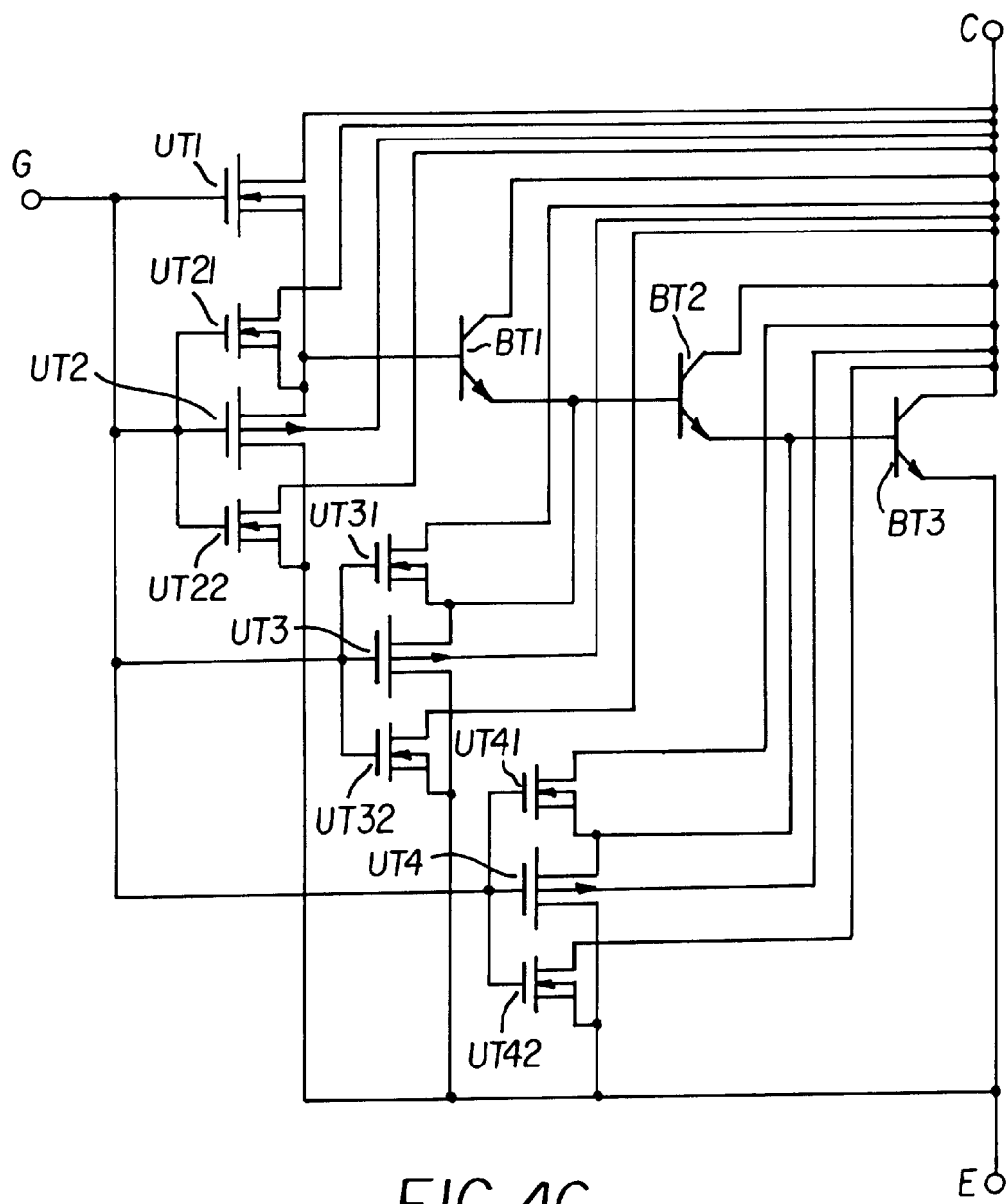
FIG. 46 is a circuit diagram showing an equivalent circuit of a semiconductor device according to the sixteenth embodiment of the present invention.

FIG. 46 is a circuit diagram of an equivalent circuit of a semiconductor device according to the sixteenth embodiment of the present invention. The bipolar transistor in the output stage is the form of a three-stage Darlington transistor consisting of npn transistors BT1, BT2 and BT3, as in the fifteenth embodiment. The equivalent circuit of FIG. 46 is different from that of FIG. 45 in that an n channel MOS transistors UT41 is connected between the collector terminal C and the source of the third-stage p channel MOS transistor UT4, and an n channel MOS transistor UT42 is connected between the collector terminal C and the drain of the p channel MOS transistor UT4.

To provide a monolithic semiconductor device that realizes the equivalent circuit of FIG. 46, the semiconductor device of the fifteenth embodiment further includes an $n^+$ auxiliary region formed in the p base region of the npn transistor BT3 that serves as the source region of the p channel MOS transistor UT4, an auxiliary source electrode, and an $n^+$ auxiliary region formed in the $p^+$ drain region, which auxiliary regions and electrode are suitably connected to each other.

FIG. 47 also shows a current-voltage characteristic of the semiconductor device of the sixteenth embodiment. It will be understood from FIG. 47 that the ON-state voltage of the sixteenth embodiment provides further reduced ON-state voltage as compared with that of the fifteenth embodiment. This is not only because the base current of the pnp transistor BT2 is increased as in the fifteenth embodiment, but also because the current from the n channel MOS transistor UT41, as well as the emitter current of the transistor BT2, is supplied as base current to the pnp transistor BT3.

TABLE 3 below lists the ON-state voltage of the semiconductor devices of the fourteenth, fifteenth and sixteenth embodiments and Comparative Example 3, when measured at a current density of 5 A/cm$^2$ $^{and}$ 20 A/cm$^2$.

TABLE 3

|  | ON-state Voltage (V) at 5A/cm$^2$ | ON-state voltage (V) at 20A/cm$^2$ |
| --- | --- | --- |
| Embodiment 14 | 2.4 | 6.0 |
| Embodiment 15 | 2.3 | 5.7 |
| Embodiment 16 | 2.2 | 5.2 |
| Comparative Example 3 | 2.5 | 6.3 |

It will be understood from TABLE 3 that the semiconductor devices of the fourteenth, fifteenth and sixteenth embodiments show lower ON-state voltage than that of Comparative Example 2. While only small differences in the ON-state voltage are observed among the fourteenth, fifteenth and sixteenth embodiments when measured at the lower current density, the differences increase at the higher current density, and the semiconductor device of the sixteenth embodiment is apparently the most excellent in terms of the ON-state voltage.

It follows that where the bipolar transistors are formed in the Darlington configuration, the ON-state voltage can be reduced by providing auxiliary unipolar transistors for one or two p channel MOS transistor(s) corresponding to part of the bipolar transistors. It is, however, to be noted that the ON-state voltage can be further reduced if the auxiliary unipolar transistors are provided for the p channel MOS transistors corresponding to an increased number of bipolar transistors.

Embodiment 17

Figure 48:
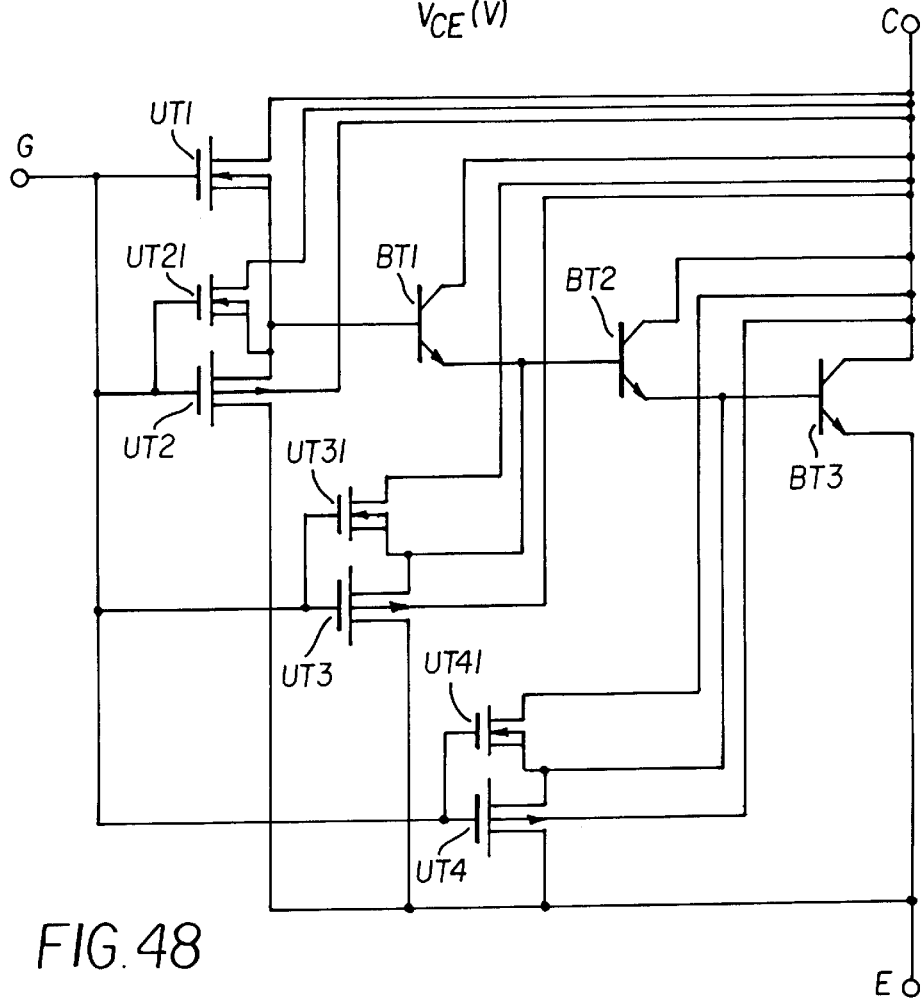
FIG. 48 is a circuit diagram showing an equivalent circuit of a semiconductor device according to the seventeenth embodiment of the present invention.

FIG. 48 is a circuit diagram of an equivalent circuit of a semiconductor device according to the seventeenth embodiment of the present invention. The bipolar transistor in the output stage is in the form of a three-stage Darlington transistor consisting of npn transistors BT1, BT2 and BT3. The drain and source of an n channel MOS transistor UT1 are connected between the collector C and the base B of the first-stage npn transistor BT1, and the drain and source of a p channel MOS transistor UT2 are connected between the base B of the first-stage npn transistor BT1 and the emitter E of the third-stage npn transistor BT3. The drain and source of a p channel MOS transistor UT3 are connected between the base B of the second-stage npn transistor BT2 and the emitter E of the third-stage npn transistor BT3, and the drain and source of a p channel MOS transistor UT4 are connected between the base B and emitter E of the third-stage npn transistors BT3. The n channel MOS transistor UT1 and the p channel MOS transistors UT2, UT3, UT4 have a common gate, which is connected to the G terminal. Namely, each of the p channel MOS transistors UT2, UT3, UT4 is connected between the base of a corresponding one of the three npn transistors BT1, BT2, BT3 that are connected in the Darlington connection, and the emitter E of the npn transistor BT3 in the last stage.

While the n channel MOS transistors UT21, UT31 and UT41 are respectively connected to the sources of the corresponding p channel MOS transistors UT2, UT3 and UT4 as in the sixteenth embodiment, the equivalent circuit of FIG. 48 is difference from that of FIG. 46 in that the n channel MOS transistors UT22, UT32 and UT42 are not connected to the respective drains of the p channel MOS transistors UT2, UT3 and UT4.

Figure 49:
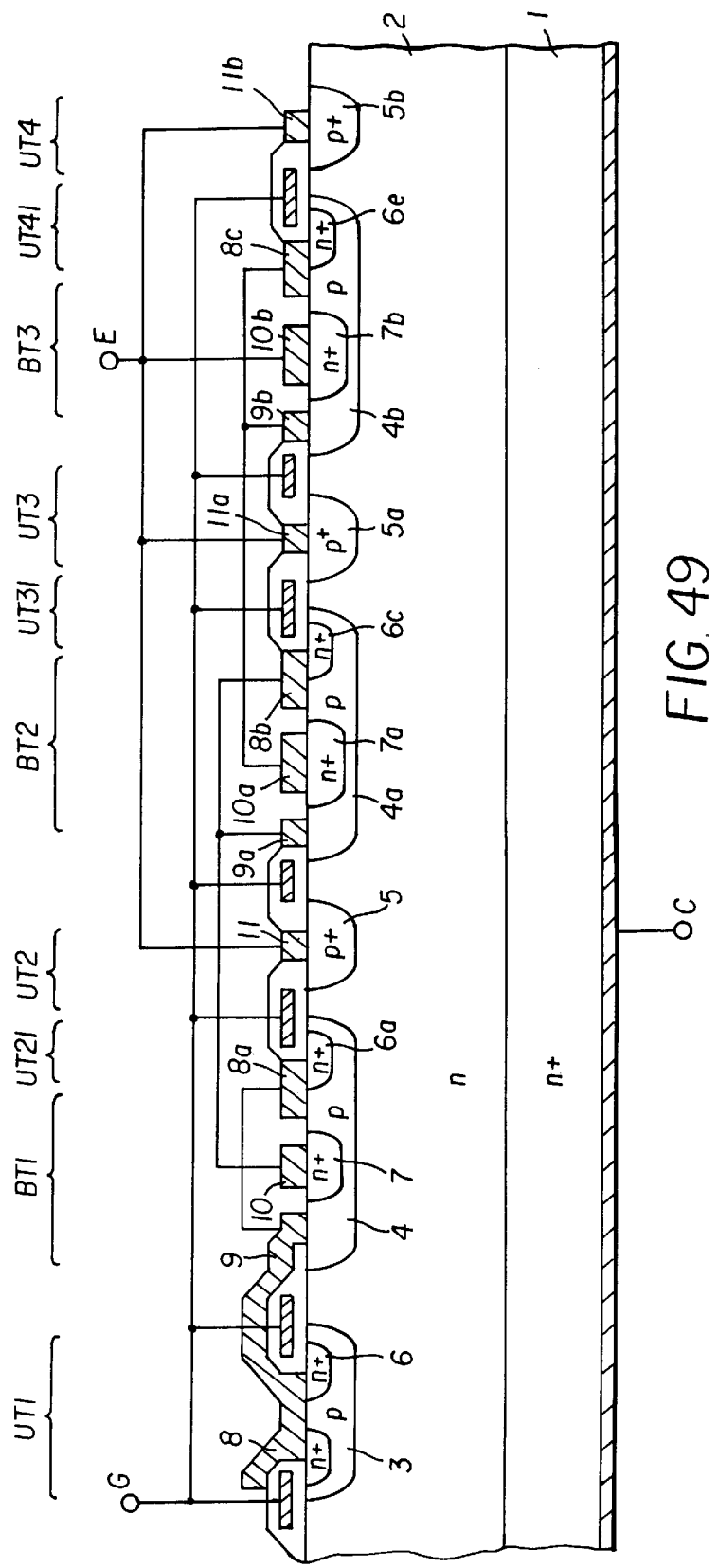
FIG. 49 is a cross-sectional view showing a part of a semiconductor device according to the seventeenth embodiment of the present invention.

FIG. 49 is a cross-sectional view of part of a monolithic semiconductor device that realizes the equivalent circuit of FIG. 48. In FIG. 49, the n channel MOS transistor UT1 as the first unipolar transistor, npn transistor BT1, n channel MOS transistor UT21, p channel MOS transistor UT2, npn transistor BT2, n channel MOS transistor UT3 1, p channel MOS transistor UT3, npn transistor BT3, n channel MOS transistor UT41, and the p channel MOS transistor UT4 are located in this order from the left-hand side to the right-hand side of the figure.

In the semiconductor device of FIG. 49, $n^+$ auxiliary regions 6a, 6b, 6c are formed in the p base regions 4, 4a, 4b of the npn transistors BT1, BT2 and BT3, respectively, and auxiliary source electrodes 8a, 8b, 8c are provided for short-circuiting the p base regions to the $n^+$ auxiliary source regions.

Figure 50:
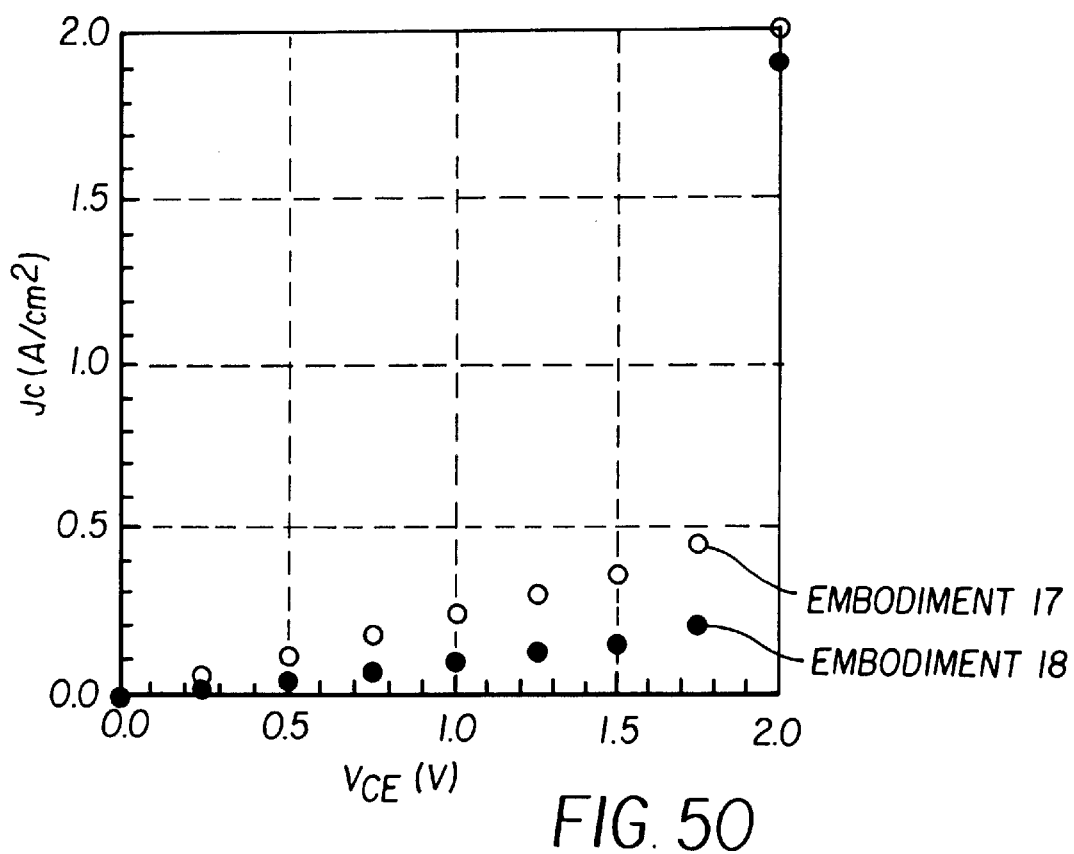
FIG. 50 is a graph showing current-voltage characteristics of the semiconductor devices of the sixteenth and seventeenth embodiments of the invention.
Figure 51:
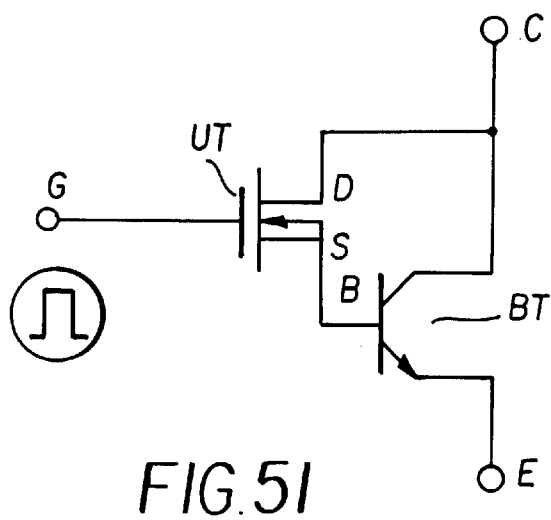
FIG. 51 is a circuit diagram showing an equivalent circuit of a known semiconductor device.
Figure 52:
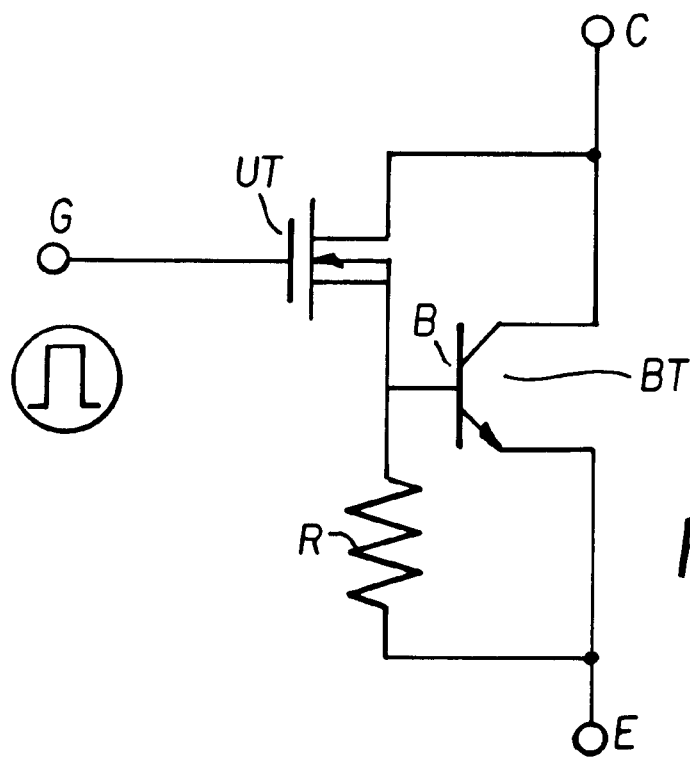
FIG. 52 is a circuit diagram showing an equivalent circuit of another known semiconductor device.
Figure 53:
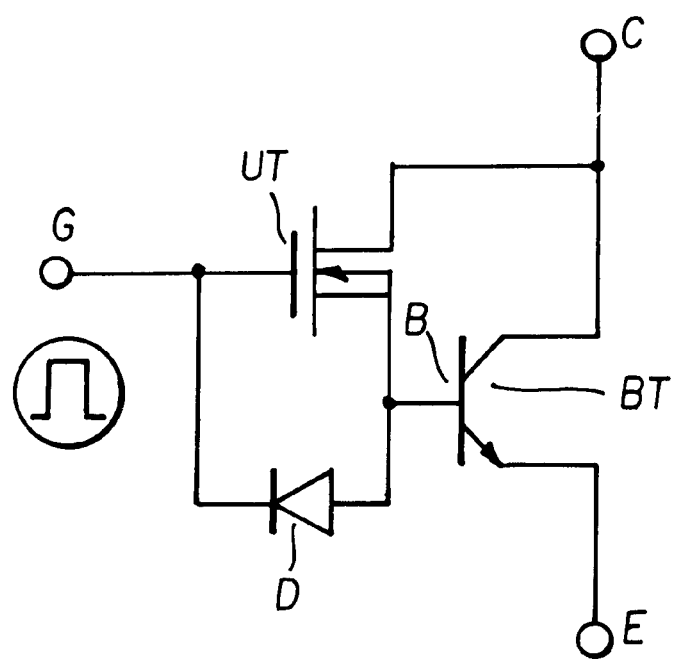
FIG. 53 is a circuit diagram showing an equivalent circuit of still another known semiconductor device.

FIG. 50 is a graph showing a current-voltage characteristic of the semiconductor device of the seventeenth embodiment and that of the sixteenth embodiment when measured in a low current density region. In a high current density region, substantially the same voltage-current characteristic curve was obtained for the sixteenth embodiment 16 of FIG. 45 and the seventeenth embodiment. This is because the conductance of the npn transistor BT3 becomes a dominant factor in the high current density region.

In the low current density region, the semiconductor device of the sixteenth embodiment provides slightly lower ON-state voltage than that of the seventeenth embodiment. This is because the conductance of the n channel MOS transistor UT41 connected in parallel between the collector and the emitter becomes a dominant factor in the low current density region.

While the $n^+$ auxiliary source regions are formed on the sides of the p source region(s) and $p^+$ drain region(s) of the p channel MOS transistor(s) in the embodiments of FIG. 44, FIG. 45 and FIG. 46, the auxiliary source regions may be formed only on the side of the p source region(s).

While the results indicated in the graph of FIG. 47 are those of the three-stage Darlington transistors, similar tendencies are observed in the single-stage or two-stage Darlington transistors, in which a difference in the conductance is observed in the low current region.

In the eleventh to seventeenth embodiments as illustrated above, the auxiliary unipolar transistors are provided only on the side of the p source regions of the p channel MOS transistors, or on the side of the p source regions and on the side of the $p^+$ drain regions. It is, however, possible to provide auxiliary unipolar transistors only on the side of the $p^+$ drain side. In this case, too, the ON-state voltage can be effectively reduced, particularly in the low current density region.

As explained above, according to the present invention, the semiconductor device includes a first unipolar transistor provided in the front stage of the device, and a bipolar transistor in the rear stage of the device, and the drain and source of the first unipolar transistor are connected to the collector and base of the bipolar transistor, respectively. The semiconductor device further includes a second unipolar transistor, and the drain and source of the second unipolar transistor are connected to the emitter and base of the bipolar transistor, respectively. The semiconductor device thus constructed has a small steady-state loss, and exhibits a high-speed switching characteristic.

The bipolar transistor provided in the rear stage may consist of Darlington-connected bipolar transistors. In this case, a plurality of second unipolar transistors are provided which correspond to the respective bipolar transistor in the Darlington configuration, and the source of each of the second unipolar transistor is connected to the base of the corresponding bipolar transistor, while the drain of each second unipolar transistor is connected to the emitter of the bipolar transistor located in the last stage.

According to another aspect of the present invention, the semiconductor device includes a first unipolar transistor provided in the front stage of the device, a second unipolar transistor, a bipolar transistor provided in the rear stage of the device, and at least one of a first auxiliary unipolar transistor and a second auxiliary unipolar transistor. In this semiconductor device, the drain and source of the first unipolar transistor are connected to the collector and the base of the bipolar transistor, respectively, and the drain and source of the second unipolar transistor are connected to the emitter and base of the bipolar transistor, respectively. Also, the drain and source of the first auxiliary unipolar transistor are connected to the collector of the bipolar transistor and the source of the second unipolar transistor, respectively, and the drain and source of the second auxiliary unipolar transistor are connected to the collector of the bipolar transistor and the drain of the second unipolar transistor, respectively. With the first auxiliary unipolar transistor thus provided, the ON-state voltage can be further reduced. With the second auxiliary unipolar transistor thus provided, the ON-state voltage can be further reduced, particularly in a low current density region.

The bipolar transistor in the rear stage may consist of a plurality of bipolar transistors that are connected in the Darlington configuration, and the second unipolar transistor may consist of a plurality of unipolar transistors that respectively correspond to the Darlington-connected bipolar transistors. In this case, the first and/or second auxiliary unipolar transistors may be provided with respect to the second unipolar transistor(s) corresponding to part of the Darlington-connected bipolar transistor, or may be provided with respect to the second unipolar transistors corresponding to all of the bipolar transistors.

The semiconductor device thus constructed exhibits a reduced overall loss, and can be manufactured without requiring complicated process steps. Thus, the present semiconductor device may be used for a wide range of breakdown voltage, and greatly contributes to reduction in the loss of power conversion apparatus and others. Also, with the provision of the first and second auxiliary unipolar transistors, the switching characteristics of the semiconductor device are improved.

What is claimed is:

1. A semiconductor device comprising:
   a first unipolar transistor provided in a front stage of the device and including a drain, a source and a gate;
   a second unipolar transistor provided in the front stage and including a drain, a source and a gate; and
   a bipolar transistor provided in a rear stage of the device and including a collector, a base, and an emitter;
   wherein the drain and the source of said first unipolar transistor are connected to the collector and the base of said bipolar transistor, respectively, and the drain and the source of said second unipolar transistor are connected to the emitter and the base of said bipolar transistor, respectively, and
   wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage.

2. A semiconductor device comprising:
   a first unipolar transistor provided in a front stage of the device and including a drain, a source and a gate;
   a second unipolar transistor provided in the front stage and including a drain, a source and a gate; and
   a bipolar transistor provided in a rear stage of the device and including a collector, a base, and an emitter;
   wherein the drain and the source of said first unipolar transistor are connected to the collector and the base of said bipolar transistor, respectively, and the drain and the source of said second unipolar transistor are connected to the emitter and the base of said bipolar transistor, respectively,
   wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, and
   wherein said Darlington-connected bipolar transistors includes a first-stage bipolar transistor, and a second-stage bipolar transistor that is located in the latter stage with respect to said first-stage bipolar transistor, said second-stage bipolar transistor having a larger area than said first-stage bipolar transistor.

3. A semiconductor device comprising:
   a first unipolar transistor provided in a front stage of the device and including a drain, a source and a gate;
   a second unipolar transistor provided in the front stage and including a drain, a source and a gate; and
   a bipolar transistor provided in a rear stage of the device and including a collector, a base, and an emitter;
   wherein the drain and the source of said first unipolar transistor are connected to the collector and the base of said bipolar transistor, respectively, and the drain and the source of said second unipolar transistor are connected to the emitter and the base of said bipolar transistor, respectively,
   wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, and
   wherein said Darlington-connected bipolar transistors include a first-stage bipolar transistor, and a second-stage bipolar transistor that is located in the latter stage with respect to said first-stage bipolar transistor, said plurality of second unipolar transistors including a first-stage second unipolar transistor that is connected to said first-stage bipolar transistor, and a second-stage second unipolar transistor that is connected to said second-stage bipolar transistor, said second-stage second unipolar transistor having a larger area than said first-stage second unipolar transistor.

4. A semiconductor device comprising:
   a first unipolar transistor provided in a front stage of the device and including a drain, a source and a gate;
   a second unipolar transistor provided in the front stage and including a drain, a source and a gate; and
   a bipolar transistor provided in a rear stage of the device and including a collector, a base, and an emitter;
   wherein the drain and the source of said first unipolar transistor are connected to the collector and the base of said bipolar transistor, respectively, and the drain and the source of said second unipolar transistor are connected to the emitter and the base of said bipolar transistor, respectively, wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, and wherein each of said bipolar transistors has a larger area than a corresponding one of said second unipolar transistors that is located in the former stage with respect to said each bipolar transistor.

5. A semiconductor device comprising:

a first unipolar transistor provided in a front stage of the device and including a drain, a source and a gate;

a second unipolar transistor provided in the front stage and including a drain, a source and a gate; and a bipolar transistor provided in a rear stage of the device and including a collector, a base, and an emitter;

wherein the drain and the source of said first unipolar transistor are connected to the collector and the base of said bipolar transistor, respectively, and the drain and the source of said second unipolar transistor are connected to the emitter and the base of said bipolar transistor, respectively, wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, and wherein said first and second unipolar transistors, said bipolar transistors, and wires that connects the unipolar and bipolar transistors with each other are formed on a single semiconductor substrate.

6. A semiconductor device as comprising:

a first unipolar transistor provided in a front stage of the device and including a drain, a source and a gate;

a second unipolar transistor provided in the front stage and including a drain, a source and a gate; and a bipolar transistor provided in a rear stage of the device and including a collector, a base, and an emitter;

wherein the drain and the source of said first unipolar transistor are connected to the collector and the base of said bipolar transistor, respectively, and the drain and the source of said second unipolar transistor are connected to the emitter and the base of said bipolar transistor, respectively, wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, wherein said first and second unipolar transistors, said bipolar transistors, and wires that connects the unipolar and bipolar transistors with each other are formed on a single semiconductor substrate, and wherein said wires comprise metallic wires, and the unipolar transistors and bipolar transistors includes metallic electrodes, said metallic wires and said metallic electrodes being formed from a single metal layer.

7. A semiconductor device comprising:

a first unipolar transistor provided in a front stage of the device and including a drain, a source and a gate;

a second unipolar transistor provided in the front stage and including a drain, a source and a gate; and a bipolar transistor provided in a rear stage of the device and including a collector, a base, and an emitter;

wherein the drain and the source of said first unipolar transistor are connected to the collector and the base of said bipolar transistor, respectively, and the drain and the source of said second unipolar transistor are connected to the emitter and the base of said bipolar transistor, respectively, wherein said bipolar transistor provided in the rear stage comprises a plurality of Darlington-connected bipolar transistors, said second unipolar transistor comprising a plurality of second unipolar transistors that respectively correspond to said Darlington-connected bipolar transistors, each of said second unipolar transistors having a source that is connected to a base of a corresponding one of said Darlington-connected bipolar transistors, and a drain that is connected to an emitter of one of the bipolar transistors that is located in the last stage, and wherein said first unipolar transistor and said second unipolar transistor are of the same conductivity type.

8. A semiconductor device comprising:

a first unipolar transistor provided in a front stage of the device and including a drain, a source, and a gate;

a second unipolar transistor provided in the front stage and including a drain, a source, and a gate;

a bipolar transistor provided in a rear stage of the device and including a collector, a base, and an emitter; and at least one of a first auxiliary unipolar transistor including a drain and source, and a second auxiliary unipolar transistor including a drain and a source;

wherein the drain and the source of said first unipolar transistor are connected to the collector and the base of said bipolar transistor, respectively, and the drain and the source of said second unipolar transistor are connected to the emitter and the base of said bipolar transistor, respectively; and wherein the drain and the source of said first auxiliary unipolar transistor are connected to the collector of the bipolar transistor and the source of the second unipolar transistor, respectively, and the drain and the source of said second auxiliary unipolar transistor are connected to the collector of the bipolar transistor and the drain of the second unipolar transistor.

9. A semiconductor device as defined in claim 8, wherein said first unipolar transistor and said second unipolar transistor are of the same conductivity type.

10. A semiconductor device comprising:
a first unipolar transistor provided in a front stage of the device and including a drain, a source, and a gate;
a plurality of second unipolar transistors provided in the front stage of the device, each of said second unipolar transistors each including a drain, a source and a gate;
a plurality of Darlington-connected bipolar transistors provided in a rear stage of the device and connected in a Darlington configuration, each of said plurality of bipolar transistors including a collector, a base, and an emitter; and
a first auxiliary unipolar transistor including a drain, a source and a gate, and a second auxiliary unipolar transistor including a drain, a source and a gate;
wherein the drain and the source of said first unipolar transistor are connected to the collector and the base of one of the bipolar transistors that is located in the initial stage, and the source of each of the second unipolar transistors is connected to the base of a corresponding one of the bipolar transistors, while the drain of each of the second unipolar transistors is connected to the emitter of one of the bipolar transistors that is located in the last stage; and
wherein the drain and the source of said first auxiliary unipolar transistor are connected to the collector of the bipolar transistors and the source of a corresponding one of the second unipolar transistors, respectively, and the drain and the source of said second auxiliary unipolar transistor are connected to the collector of the bipolar transistors and the drain of a corresponding one of the second unipolar transistors, respectively.

11. A semiconductor device as defined in 10, wherein said Darlington-connected bipolar transistors includes a first-stage bipolar transistor, and a second-stage bipolar transistor that is located in the latter stage with respect to said first-stage bipolar transistor, said second-stage bipolar transistor having a larger area than said first-stage bipolar transistor.

12. A semiconductor device as defined in claim 10, wherein said first unipolar transistor and said second unipolar transistor are of the same conductivity type.

13. A semiconductor device as defined in claim 10, wherein said first unipolar transistor comprises an n channel MOS transistor, and each of said second unipolar transistors comprises a p channel MOS transistor, while said bipolar transistor comprises an npn transistor.

14. A semiconductor device as defined in claim 10, wherein said first unipolar transistor comprises a p channel MOS transistor, and each of said second unipolar transistors comprises an n channel MOS transistor, while said bipolar transistor comprises a pnp transistor.

15. A semiconductor device as defined in claim 10, wherein said first and second unipolar transistors, said bipolar transistors, and wires that connects the unipolar and bipolar transistors with each other are formed on a single semiconductor substrate.

16. A semiconductor device comprising:
a first unipolar transistor provided in a front stage of the device and including a drain, a source and a gate;
a plurality of second unipolar transistors provided in the front stage of the device, each of said second unipolar transistors including a drain, a source and a gate;
a plurality of Darlington-connected bipolar transistors provided in a rear stage of the device and connected in a Darlington configuration, each of said plurality of bipolar transistors including a collector, a base, and an emitter; and
at least one of a first auxiliary unipolar transistor including a drain, a source and a gate, and a second auxiliary unipolar transistor including a drain, a source, and a gate;
wherein the drain and the source of said first unipolar transistor are connected to the collector and the base of one of the bipolar transistors that is located in the initial stage, and the source of each of the second unipolar transistors is connected to the base of a corresponding one of the bipolar transistors, while the drain of each of the second unipolar transistors is connected to the emitter of one of the bipolar transistors that is located in the last stage; and
wherein the drain and the source of said first auxiliary unipolar transistor are connected to the collector of the bipolar transistors and the source of a corresponding one of the second unipolar transistors, respectively, and the drain and the source of said second auxiliary unipolar transistor are connected to the collector of the bipolar transistors and the drain of a corresponding one of the second unipolar transistors, respectively.

17. A semiconductor device as defined in claim 16, wherein said first unipolar transistor and said second unipolar transistor are of the same conductivity type.

18. A semiconductor device as defined in claim 16, wherein said Darlington-connected bipolar transistors includes a first-stage bipolar transistor, and a second-stage bipolar transistor that is located in the latter stage with respect to said first-stage bipolar transistor, said second-stage bipolar transistor having a larger area than said first-stage bipolar transistor.

19. A semiconductor device as defined in claim 16, wherein said first and second unipolar transistors, said bipolar transistors, and wires that connects the unipolar and bipolar transistors with each other are formed on a single semiconductor substrate.

20. A semiconductor device as defined in claim 16, wherein said first unipolar transistor comprises an n channel MOS transistor, and each of said second unipolar transistors comprises a p channel MOS transistor, while said bipolar transistor comprises an npn transistor.

21. A semiconductor device as defined in claim 20, wherein the gate of said first unipolar transistor, the gates of said second unipolar transistors, and the gates of said first and second auxiliary unipolar transistors are connected together.

22. A semiconductor device as defined in claim 20, wherein each of said first auxiliary unipolar transistor and said second auxiliary unipolar transistor comprises an n type auxiliary source region that is formed in at least one of a p type source region and a p type drain region of a corresponding one of said second unipolar transistors.

23. A semiconductor device as defined in claim 16, wherein said first unipolar transistor comprises a p channel MOS transistor, and each of said second unipolar transistors comprises an n channel MOS transistor, while said bipolar transistor comprises a pnp transistor.

24. A semiconductor device as defined in claim 22, wherein the gate of said first unipolar transistor, the gates of said second unipolar transistors, and the gates of said first and second auxiliary unipolar transistors are connected together.

25. A semiconductor device as defined in claim 23, wherein each of said first auxiliary unipolar transistor and said second auxiliary unipolar transistor comprises a p type auxiliary source region that is formed in at least one of an n type source region and an n type drain region of a corresponding one of said second unipolar transistors.

26. A semiconductor device as defined in claim 23, wherein the gate of said first unipolar transistor, the gates of said second unipolar transistors, and the gates of said first and second auxiliary unipolar transistors are connected together.

27. A semiconductor device as defined in claim 25, wherein the gate of said first unipolar transistor, the gates of said second unipolar transistors, and the gates of said first and second auxiliary unipolar transistors are connected together.

* * * * *

UNITED STATES PATENT AND TRADEMARK OFFICE
CERTIFICATE OF CORRECTION

PATENT NO. : 6,242,967 B1
DATED : June 5, 2001
INVENTOR(S) : Noriyuki Iwamuro et al.

Page 1 of 1

It is certified that error appears in the above-identified patent and that said Letters Patent is hereby corrected as shown below:

Title page,
Inventor's Field: please delete "Noriyuji" and insert -- Noriyuki --.

Signed and Sealed this

Eighth Day of January, 2002

Attest:

Attesting Officer

JAMES E. ROGAN
Director of the United States Patent and Trademark Office